US010312199B2

(12) United States Patent
Watanabe et al.

(10) Patent No.: US 10,312,199 B2
(45) Date of Patent: Jun. 4, 2019

(54) SEMICONDUCTOR DEVICE AND MANUFACTURING METHOD THEREOF

(71) Applicant: Renesas Electronics Corporation, Tokyo (JP)

(72) Inventors: Shinji Watanabe, Tokyo (JP); Tsuyoshi Kida, Tokyo (JP); Yoshihiro Ono, Tokyo (JP); Kentaro Mori, Tokyo (JP); Kenji Sakata, Tokyo (JP); Yusuke Yamada, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/941,300

(22) Filed: Mar. 30, 2018

(65) Prior Publication Data

US 2018/0226362 A1     Aug. 9, 2018

Related U.S. Application Data

(62) Division of application No. 15/304,015, filed as application No. PCT/JP2014/060603 on Apr. 14, 2014.

(51) Int. Cl.
*H01L 23/00* (2006.01)
*H01L 23/31* (2006.01)

(52) U.S. Cl.
CPC ............ *H01L 23/562* (2013.01); *H01L 23/31* (2013.01); *H01L 24/02* (2013.01); *H01L 24/16* (2013.01);
(Continued)

(58) Field of Classification Search
CPC ......... H01L 24/04; H01L 24/11; H01L 24/12; H01L 24/42; H01L 24/80; H01L 24/97; H01L 23/49534; H01L 23/31
See application file for complete search history.

(56) References Cited

U.S. PATENT DOCUMENTS

2005/0161837 A1   7/2005  Matsui
2010/0171208 A1   7/2010  Fujii
(Continued)

FOREIGN PATENT DOCUMENTS

CN      1649148 A      8/2005
JP    2003-197855 A    7/2003
(Continued)

OTHER PUBLICATIONS

Office. Action in U.S. Appl. No. 15/304,015 dated Oct. 18, 2017.
(Continued)

*Primary Examiner* — Cuong Q Nguyen
(74) *Attorney, Agent, or Firm* — McGinn I.P. Law Group, PLLC.

(57) ABSTRACT

A manufacturing method of a semiconductor device includes preparing a wiring substrate including a first surface, a plurality of first terminals formed on the first surface, and a second surface opposite to the first surface, arranging a first adhesive on the first surface of the wiring substrate, and after the arranging of the first adhesive, mounting a first semiconductor chip, which includes a first front surface, a plurality of first front electrodes formed on the first front surface, a first rear surface opposite to the first front surface, a plurality of first rear electrodes formed on the first rear surface, and a plurality of through electrodes electrically connecting the plurality of first front electrodes to the plurality of first rear electrodes, on the first surface of the wiring substrate via the first adhesive.

6 Claims, 49 Drawing Sheets

(52) U.S. Cl.
CPC ............ *H01L 24/42* (2013.01); *H01L 24/97* (2013.01); *H01L 23/3128* (2013.01); *H01L 2224/16145* (2013.01); *H01L 2224/16225* (2013.01); *H01L 2924/00014* (2013.01); *H01L 2924/1431* (2013.01); *H01L 2924/1434* (2013.01); *H01L 2924/15174* (2013.01); *H01L 2924/15311* (2013.01); *H01L 2924/181* (2013.01)

(56) References Cited

U.S. PATENT DOCUMENTS

| | | |
|---|---|---|
| 2013/0026652 A1 | 1/2013 | Fujii |
| 2015/0008588 A1* | 1/2015 | Kim .................. H01L 23/49827 257/774 |

FOREIGN PATENT DOCUMENTS

| | | |
|---|---|---|
| JP | 2004-165328 A | 6/2004 |
| JP | 2005-217071 A | 8/2005 |
| JP | 2007-042762 A | 8/2005 |
| JP | 2008-235299 A | 10/2008 |
| JP | 2005-340393 A | 3/2009 |
| JP | 2009-049087 A | 3/2009 |
| JP | 2010-161102 A | 7/2010 |
| JP | 2013-197387 A | 9/2013 |

OTHER PUBLICATIONS

Notice of Allowance in U.S. Appl. No. 15/304,015 dated Mar. 9, 2018.
International Search Report (ISR) (PCT Form PCT/ISA/210), in PCT/JP2014/060603, dated Jun 10, 2014.
Chinese Office Action dated May 21, 2018 with English Translation.
Chinese Office Action, dated Dec. 20, 2018, in Chinese Patent Application Publication No. 201480077989.4 and English Translation thereof.

* cited by examiner

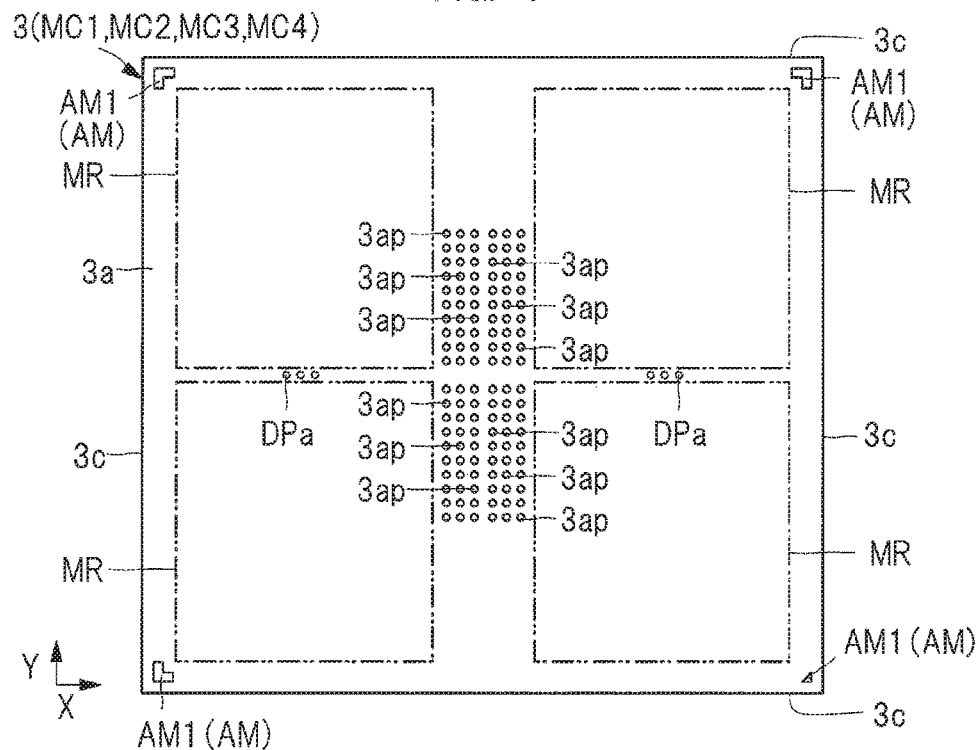
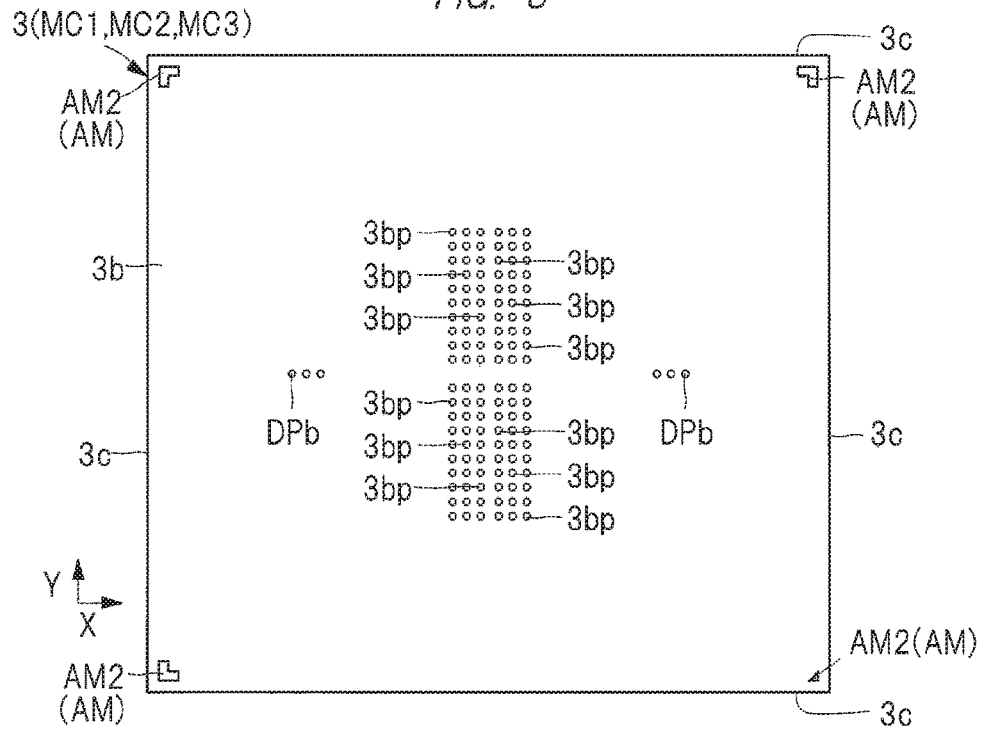

SEMICONDUCTOR DEVICE AND MANUFACTURING METHOD THEREOF

The present application is a Divisional Application of U.S. patent application Ser. No. 15/304,015, filed on Oct. 13, 2016, which is based on International Application No. PCT/JP2014/060603, filed on Apr. 14, 2014, the entire contents of which are incorporated herein by reference.

TECHNICAL FIELD

The present invention relates to a semiconductor device and a manufacturing technique thereof, for example, a technique effectively applied to a semiconductor device in which a plurality of semiconductor chips are laminated on a wiring substrate.

BACKGROUND ART

Japanese Patent Application Laid-Open Publication No. 2009-49087 (Patent Document 1) discloses a configuration in which a plurality of substrates are laminated and warpage deformation of the substrates is cancelled by providing a stepped portion at an end portion of each substrate.

Also, Japanese Patent Application Laid-Open Publication No. 2004-165328 (Patent Document 2) discloses that a volume of a solder bump is changed in accordance with a height of an electronic component mounting portion as a method of mounting an electronic component on a warped insulating substrate.

Also, Japanese Patent Application Laid-Open Publication No. 2005-340393 (Patent Document 3) discloses that when a semiconductor chip is mounted on a warped circuit substrate, a plurality of stud bumps provided on the circuit substrate are deformed to electrically connect a plurality of electrodes of the semiconductor chip to the plurality of stud bumps.

RELATED ART DOCUMENTS

Patent Documents

Patent Document 1: Japanese Patent Application Laid-Open Publication No. 2009-49087
Patent Document 2: Japanese Patent Application Laid-Open Publication. No. 2004-165328
Patent Document 3: Japanese Patent Application Laid-Open Publication No. 2005-340393

SUMMARY OF THE INVENTION

Problems to be Solved by the Invention

The inventors of this application have studied a technique for improving performance of a semiconductor device in which a plurality of semiconductor chips are laminated on a wiring substrate.

It has been found that, when a plurality of semiconductor chips are laminated, warpage deformation occurs in the semiconductor chips due to the influence of deformation of the wiring substrate, a pressing force in mounting the semiconductor chips or the like.

Also, the inventors of this application have found that, when the warpage deformation occurs in either or both of the laminated semiconductor chips, the constituent component of one semiconductor chip contacts another semiconductor chip depending on the degree of the warpage deformation, and there arises a problem in terms of reliability of the semiconductor device.

Other problems and novel features will become apparent from the description of this specification and the attached drawings.

Means for Solving the Problems

In a semiconductor device according to an embodiment, a second semiconductor chip is mounted on a first rear surface of a first semiconductor chip. Also, the first rear surface of the first semiconductor chip includes a first region in which a plurality of first rear electrodes electrically connected to the second semiconductor chip via protrusion electrodes are formed and a second region which is on a peripheral side relative to the first region and in which a first metal pattern is formed. Also, a protrusion height of the first metal pattern with respect to the first rear surface is larger than a protrusion height of each of the plurality of first rear electrodes with respect to the first rear surface.

Effects of the Invention

According to the embodiment, it is possible to improve the reliability of the semiconductor device.

BRIEF DESCRIPTIONS OF THE DRAWINGS

FIG. 7 is a plan view illustrating a front surface side of a memory chip illustrated in FIG. 4.

FIG. 8 is a plan view illustrating an example of a rear surface side of the memory chip illustrated in FIG. 7.

Figure 1:
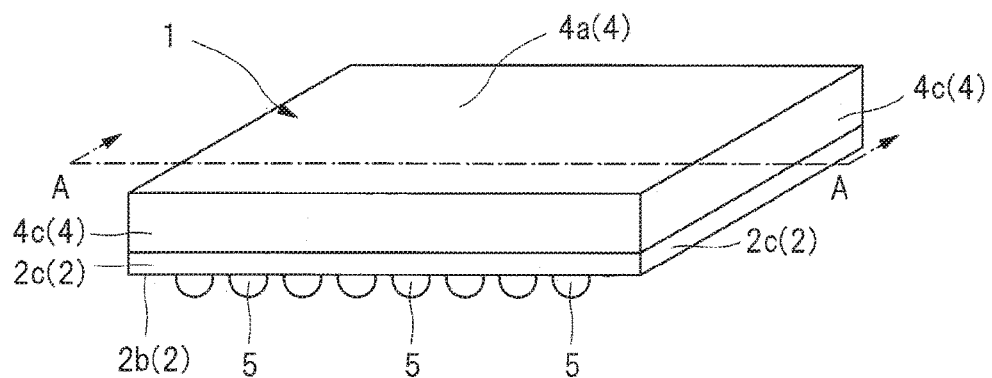
FIG. 1 is a perspective view of a semiconductor device according to an embodiment.

DETAILED DESCRIPTION OF PREFERRED EMBODIMENTS (Description of Format, Basic Terms, and Description of Usage in the Present Application)

In this application, embodiments will be described in a plurality of sections or the like when required as a matter of convenience. However, these sections are not independent and irrelevant to each other unless otherwise stated, and the one relates to the entire or a part of the other as a detail, a modification example or the like regardless of the order of descriptions. In addition, the description of the same or similar portions is not repeated in principle. Further, the components in the embodiments are not always indispensable unless otherwise stated or except for the case where the components are logically limited to that number and the components are apparently indispensable from the context.

Similarly, in the description of the embodiments, the phrase "X made of A" for a material, a composition or the like is not intended to exclude those containing elements other than A unless otherwise specified and except for the case where it clearly contains only A from the context. For example, as for a component, it means "X containing A as a main component". For example, a "silicon member" or the like is not limited to pure silicon and it is obvious that the silicon member includes a member made of silicon germanium (SiGe) alloy, a member made of multicomponent alloy containing silicon as a main component, and a member containing other additives or the like. In addition, gold plating, a Cu layer, nickel plating or the like includes a member containing gold, Cu, nickel or the like as a main component as well as a pure one unless otherwise indicated clearly.

In addition, when referring to a specific value or amount, a value or amount larger or smaller than the specific value or amount is also applicable unless otherwise stated or except for the case where the value or amount is logically limited to the specific value or amount and the value or amount is apparently limited to the specific value or amount from the context.

Further, in the drawings for the embodiments, the same or similar components are denoted by the same or similar reference character or reference number, and the descriptions thereof are not repeated in principle.

In addition, in the attached drawings, hatching may be omitted even in cross sections in the case where it becomes rather complicated or the case where discrimination from void is clear. In this regard, when it is clear from the description or the like, an outline of a background may be omitted even in a planarly closed hole. Furthermore, even other than the cross section, hatching or dot patterns may be drawn so as to clarify non-voids or clarify a boundary of regions.

First Embodiment

In the present embodiment, as an example of a semiconductor device in which a plurality of semiconductor chips are laminated, a semiconductor device in which a plurality of semiconductor chips laminated on a wiring substrate are electrically connected to each other via protrusion electrodes will be described. Specifically, the semiconductor device that will be described as an example in the present embodiment is a semiconductor device referred to as a so-called SIP (System In Package) in which a plurality of semiconductor chips having a memory circuit formed therein are laminated on a semiconductor chip having an arithmetic processing circuit formed therein so that a system is formed in a single package.

Figure 2:
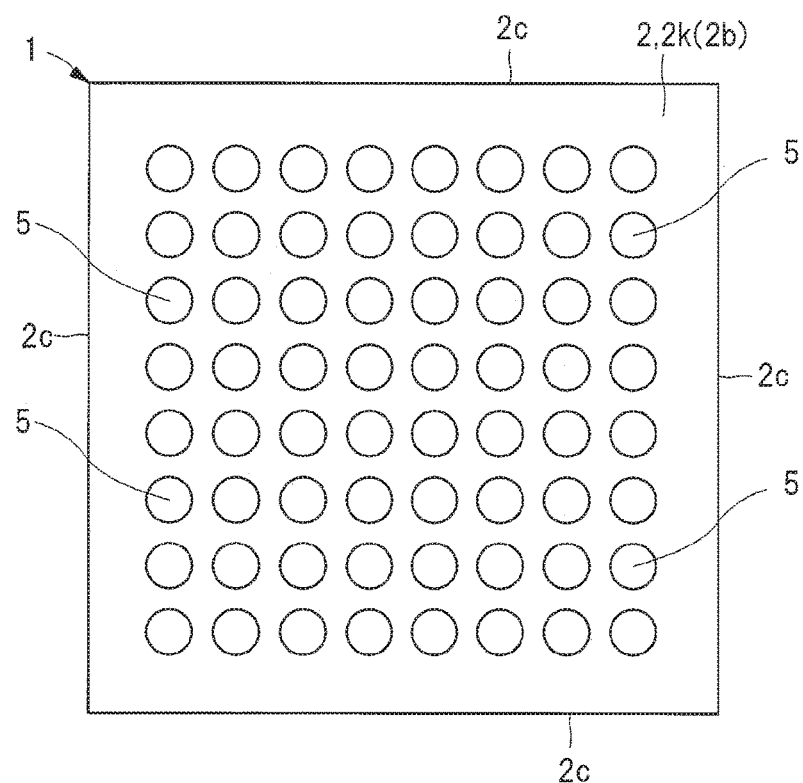
FIG. 2 is a bottom view of the semiconductor device illustrated in FIG. 1.
Figure 3:
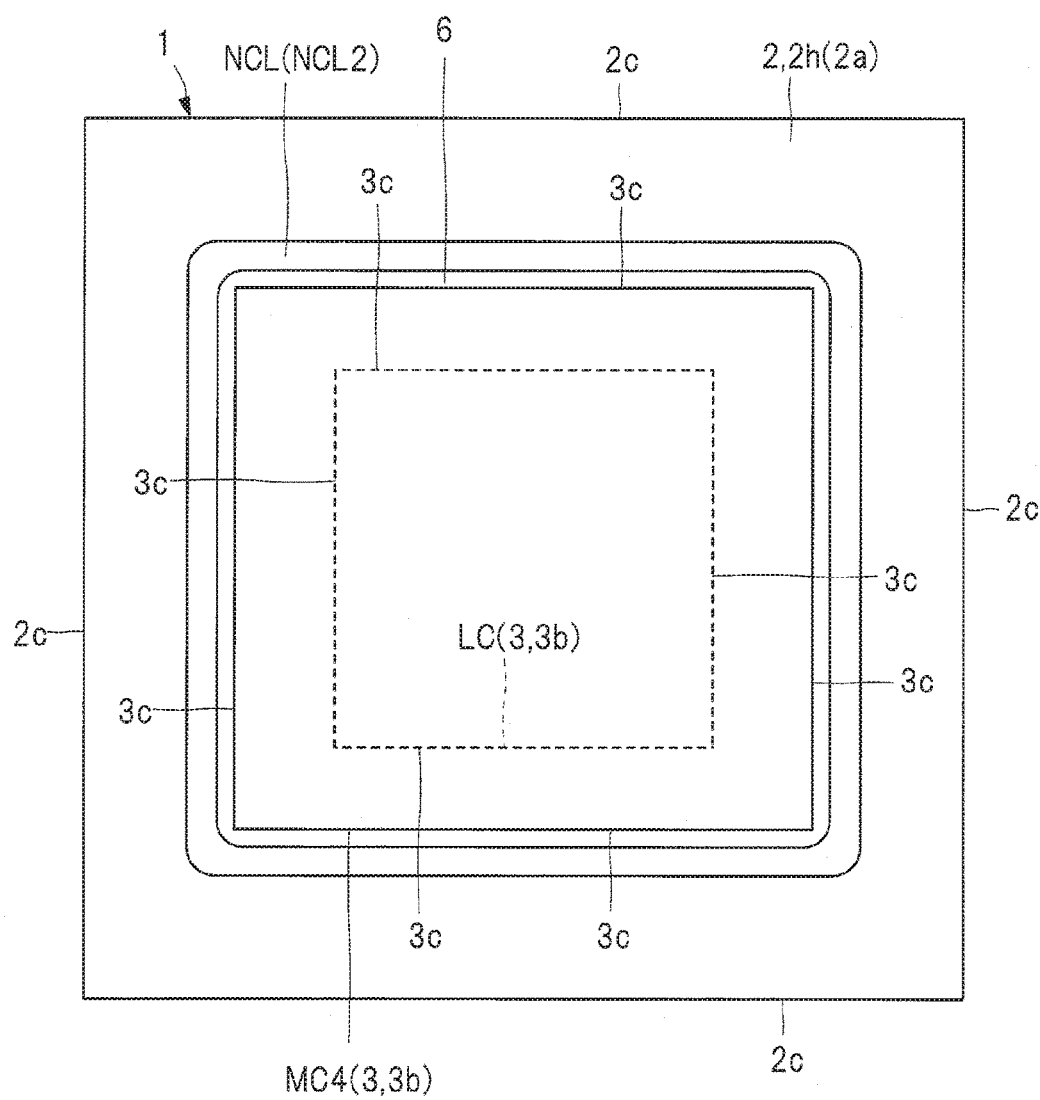
FIG. 3 is a transparent plan view illustrating an internal configuration of the semiconductor device on a wiring substrate in a state in which a sealing body illustrated in FIG. 1 is removed.
Figure 4:
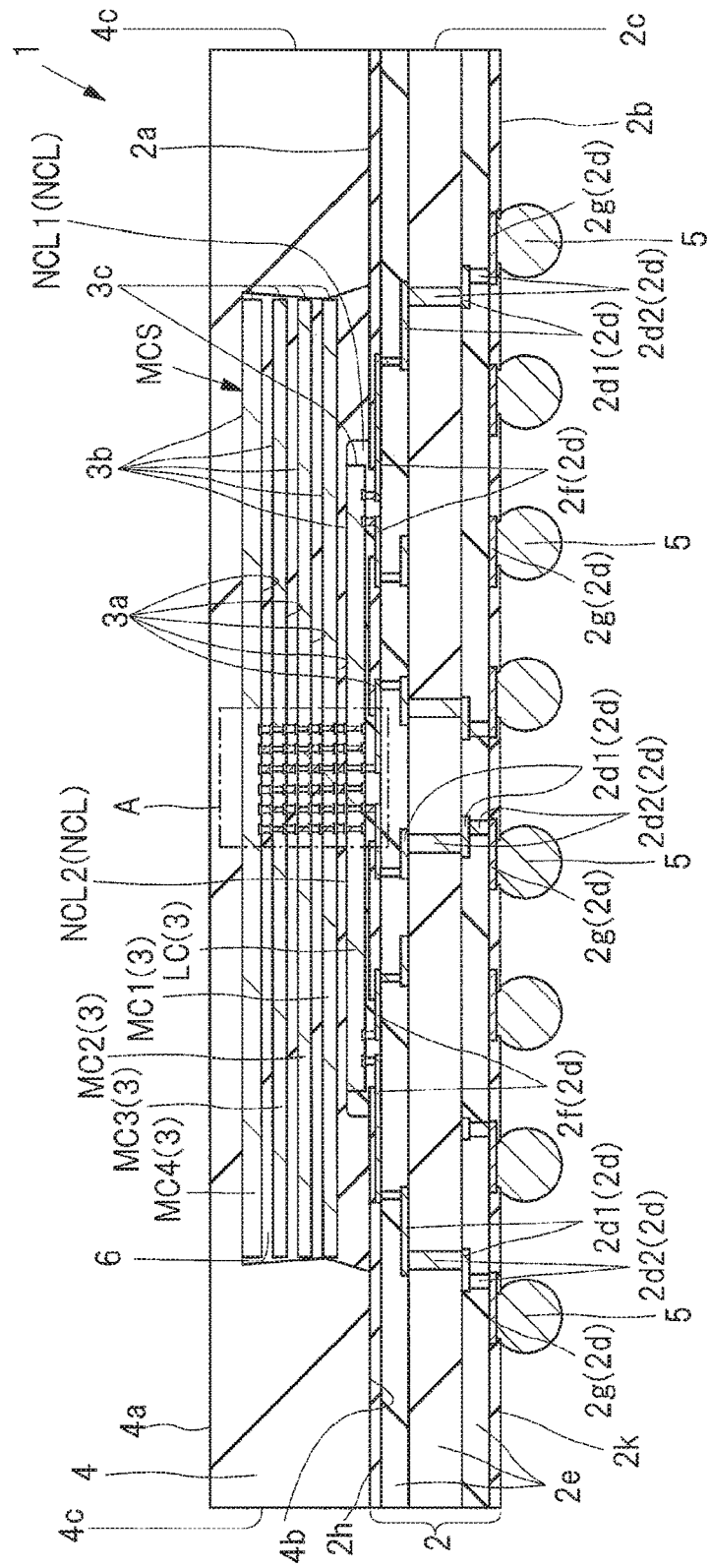
FIG. 4 is a sectional view taken along a line A-A of FIG. 1.

FIG. 1 is a perspective view of a semiconductor device according to the present embodiment, and FIG. 2 is a bottom view of the semiconductor device illustrated in FIG. 1. Also, FIG. 3 is a transparent plan view illustrating an internal configuration of the semiconductor device on a wiring substrate in a state in which a sealing body illustrated in FIG. 1 is removed. Also, FIG. 4 is a sectional view taken along a line A-A of FIG. 1. Note that the number of terminals illustrated in FIGS. 1 to 4 is small for ease of viewing, but the number of terminals (bonding leads 2f, lands 2g, solder balls 5) is not limited to the embodiment illustrated in FIGS. 1 to 4. In addition, in FIG. 3, in order to clarify a positional relationship or a difference in planar size of a logic chip LC and a memory chip MC4 when seen in a plan view, a contour of the logic chip LC is indicated by a dashed line.

<Semiconductor Device>

A semiconductor device 1 according to the present embodiment includes a wiring substrate 2, a plurality of semiconductor chips 3 (see FIG. 4) mounted on the wiring substrate 2 and a sealing body (resin body) 4 that seals the plurality of semiconductor chips 3.

As illustrated in FIG. 4, the wiring substrate 2 includes a top surface (surface, chip mounting surface) 2a on which the plurality of semiconductor chips 3 are mounted, a bottom surface (surface, packaging surface) 2b opposite to the top surface 2a and a side surface 2c arranged between the top surface 2a and the bottom surface 2b, and the wiring substrate 2 forms a rectangular outer shape when seen in a plan view as illustrated in FIGS. 2 and 3. In the example illustrated in FIGS. 2 and 3, a planar size of the wiring substrate 2 (dimensions seen in a plan view, dimensions of the top surface 2a and the bottom surface 2b, an outer size) forms a square whose length of one side is about 14 mm. Also, a thickness (height) of the wiring substrate 2, that is, a distance from the top surface 2a to the bottom surface 2b illustrated in FIG. 4 is, for example, about 0.3 mm to 0.5 mm.

The wiring substrate 2 includes a plurality of wiring layers (four layers in the example illustrated in FIG. 4) that serve as an interposer for electrically connecting the semiconductor chips 3 mounted on the top surface 2a to a packaging board (not illustrated) and electrically connect the top surface 2a to the bottom surface 2b. In each wiring layer, a plurality of wirings 2d and insulating layers 2e to insulate the plurality of wirings 2d from one another and insulate adjacent wiring layers from one another are formed.

The wiring substrate 2 illustrated in FIG. 4 includes three insulating layers 2e, and the middle insulating layer 2e is a core layer (core material) in which a resin material such as an epoxy resin is impregnated with a fiber material such as a glass fiber. Also, the insulating layers 2e respectively formed on the top surface and the bottom surface of the core layer are formed by, for example, a build-up process. However, as a modification example of FIG. 4, a so-called coreless substrate that does not include the insulating layer 2e serving as a core layer may be used.

Also, the wiring 2d includes a wiring 2d1 formed on the top surface or the bottom surface of the insulating layer 2e and a via wiring 2d2 that is an interlayer conducting path formed to pass through the insulating layer 2e in a thickness direction. Also, a plurality of bonding leads (terminals, chip mounting surface terminals, electrodes) 2f which are terminals electrically connected to the semiconductor chips 3 are formed on the top surface 2a of the wiring substrate 2. Note that the wiring 2d formed on the side close to the top surface 2a of the wiring substrate 2 is integrally formed with the bonding lead 2f. In other words, the bonding lead 2f can be considered as a part of the wiring 2d. Also, when the bonding lead 2f and the wiring 2d are separately considered, a part exposed from an insulating film 2h and a part covered with the insulating film 2h on the top surface 2a of the wiring substrate 2 can be defined as the bonding lead 2f and the wiring 2d, respectively.

On the other hand, a plurality of lands (terminals, solder connection pads) 2g to which a plurality of solder balls 5 serving as terminals for electrical connection to the packaging board (not illustrated), that is, external connection terminals of the semiconductor device 1 are bonded are formed on the bottom surface 2b of the wiring substrate 2. The plurality of bonding leads 2f and the plurality of lands 2g are electrically connected to each other via the plurality of wirings 2d. Since the wiring 2d connected to the bonding lead 2f or the land 2g is integrally formed with the bonding lead 2f or the land 2g, the bonding lead 2f and the land 2g are illustrated as a part of the wiring 2d in FIG. 4.

Also, the top surface 2a and the bottom surface 2b of the wiring substrate 2 are covered with the insulating films (solder resist films) 2h and 2k. The wiring 2d formed on the top surface 2a of the wiring substrate 2 is covered with the insulating film 2h. An opening is formed in the insulating film 2h, and at least a part of the plurality of bonding leads 2f (a bonding portion bonded to the semiconductor chip 3, a bonding region) is exposed from the insulating film 2h in this opening. Also, the wiring 2d formed on the bottom surface 2b of the wiring substrate 2 is covered with the insulating film 2k. An opening is formed in the insulating film 2k, and at least a part of the plurality of lands 2g (a bonding portion bonded to the solder ball 5) is exposed from the insulating film 2k in this opening.

Also, as illustrated in FIG. 4, the plurality of solder balls (external terminals, electrodes, external electrodes) 5 bonded to the plurality of lands 2g of the bottom surface 2b of the wiring substrate 2 are arranged in a matrix (array form, matrix form) as illustrated in FIG. 2. Also, although not illustrated in FIG. 2, the plurality of lands 2g (see FIG. 4) to which the plurality of solder balls 5 are bonded are arranged in a matrix (matrix form). The semiconductor device in which the plurality of external terminals (the solder balls 5, the lands 2g) are arranged on the packaging surface side of the wiring substrate 2 in the matrix form in this manner is referred to as an area array semiconductor device.

The area array semiconductor device 1 can effectively use the packaging surface (bottom surface 2b) of the wiring substrate 2 as an arrangement space of the external terminals, and is thus preferable in that it is possible to suppress an increase in a packaging area of the semiconductor device 1 even when the number of external terminals increases. Namely, the semiconductor device 1 whose number of external terminals increases along with high functionality and high integration can be packaged while saving a space.

Also, the semiconductor device 1 includes the semiconductor chip 3 mounted on the wiring substrate 2. In the example illustrated in FIG. 4, a plurality of semiconductor chips 3 are mounted on the top surface 2a of the wiring substrate 2. Also, each of the plurality of semiconductor chips 3 includes a front surface (main surface, top surface) 3a, a rear surface (main surface, bottom surface) 3b opposite to the front surface 3a and a side surface 3c located between the front surface 3a and the rear surface 3b, and farms a rectangular outer shape when seen in a plan view as illustrated in FIG. 3. By laminating the plurality of semiconductor chips 3 in this manner, the packaging area can be reduced even when the functionality of the semiconductor device 1 is enhanced.

Also, in the example illustrated in FIGS. 3 and 4, the semiconductor chip 3 mounted in the lowermost stage (position closest to the wiring substrate 2) is a logic chip (semiconductor chip) LC in which an arithmetic processing circuit PU (see FIG. 5) is formed. On the other hand, the semiconductor chips 3 mounted on an upper stage of the logic chip LC are memory chips (semiconductor chips) MC1, MC2, MC3 and MC4 in which a main memory circuit (memory circuit) MM (see FIG. 5) storing data communicated between the semiconductor chip 3 and the logic chip LC is formed. Note that a control circuit that controls an operation of the main memory circuit of the memory chips MC1, MC2, MC3 and MC4 is formed in the logic chip LC in addition to the arithmetic processing circuit described above. A circuit configuration example of the semiconductor device 1 will be described below.

Also, as illustrated in FIG. 4, adhesives NCL (insulating adhesives) are respectively arranged between the logic chip LC mounted on the wiring substrate 2 and the wiring substrate 2 and between the logic chip LC and the memory chip MC1. The adhesive NCL is arranged to fill a space between the front surface 3a of the semiconductor chip 3 of the upper stage and the rear surface 3b of the semiconductor chip 3 of the lower stage (or the top surface 2a of the wiring substrate 2).

Specifically, the adhesive NCL includes an adhesive (insulating adhesive) NCL1 that bonds and fixes the logic chip LC on the wiring substrate 2 and an adhesive (insulating adhesive) NCL2 that bonds and fixes a laminated body MCS of the memory chips MC1, MC2, MC3 and MC4 on the logic chip. Also, each of the adhesives NCL1 and NCL2 is made of an insulating (non-conductive) material (for example, a resin material). By arranging the adhesive NCL in a bonding portion of the logic chip LC and the wiring substrate 2 and a bonding portion of the logic chip LC and the laminated body MCS, it is possible to electrically insulate the plurality of electrodes provided in the bonding portions from each other and to protect the bonding portions.

Also, in the example illustrated in FIG. 4, a sealing body (a sealing body for a chip laminated body, a resin body for a chip laminated body) 6 different from a sealing body 4 is disposed between the plurality of memory chips MC1, MC2, MC3 and MC4, and the laminated body MCS of the memory chips MC1, MC2, MC3 and MC4 is sealed by the sealing body 6. The sealing body 6 is embedded to be in close contact with the front surfaces 3a and the rear surfaces 3b of the plurality of memory chips MC1, MC2, MC3 and MC4, and the laminated body MCS of the memory chips MC1, MC2, MC3 and MC4 is integrated by the bonding portion between the semiconductor chips 3 and the sealing body 6. Also, the sealing body 6 is made of an insulating (non-conductive) material (for example, a resin material) and it is possible to electrically insulate the plurality of electrodes provided in each bonding portion of the memory chips MC1, MC2, MC3 and MC4 by disposing the sealing body 6 in each bonding portion.

However, as illustrated in FIG. 4, the front surface 3a of the memory chip MC1 mounted on the lowermost stage (position closest to the logic chip LC) in the laminated body MCS of the memory chips MC1, MC2, MC3 and MC4 is exposed from the sealing body 6. Also, as illustrated in FIGS. 3 and 4, the rear surface 3b of the memory chip MC4 arranged on the uppermost stage in the laminated body MCS of the memory chips MC1, MC2, MC3 and MC4 is exposed from the sealing body 6.

Also, the semiconductor device 1 includes the sealing body 4 that seals the plurality of semiconductor chips 3. The sealing body 4 includes a top surface (a surface, a front surface) 4a, a bottom surface (a surface, a rear surface, a packaging surface) 4b (see FIG. 4) located on a side opposite to the top surface 4a and a side surface 4c located between the top surface 4a and the bottom surface 4b, and the sealing body 4 forms a rectangular outer shape when seen in a plan view. In the example illustrated in FIG. 1, a planar size of the sealing body 4 (dimensions seen in a plan view from the top surface 4a, an outer size of the top surface 4a) is equal to the planar size of the wiring substrate 2, and the side surface 4c of the sealing body 4 is continuous with the side surface 2c of the wiring substrate 2. Also, in the example illustrated in FIG. 1, the planar size of the sealing body 4 (dimensions seen in a plan view) forms, for example, a square whose length of one side is about 14 mm.

The sealing body 4 is a resin body that protects the plurality of semiconductor chips 3, and it is possible to suppress the damage to the thin semiconductor chips 3 by forming the sealing body 4 between the plurality of semiconductor chips 3 so as to be in close contact with the semiconductor chips 3 and the wiring substrate 2. Also, from the viewpoint of improving a function as a protective member, the sealing body 4 is configured of, for example, the following material. That is, since the sealing body 4 is required to easily come into close contact with the gap between the semiconductor chips 3, the semiconductor chips 3 and the wiring substrate 2 and is required to have a certain degree of hardness after the sealing, it is preferable that a thermosetting resin such as an epoxy-based resin is contained in the sealing body 4. Also, in order to improve the function of the sealing body 4 after curing, it is preferable that filler particles such as silica (silicon dioxide: $SiO_2$) are mixed into the resin material. For example, from the viewpoint of suppressing the damage to the semiconductor chips 3 due to a thermal deformation after the formation of the sealing body 4, it is preferable that linear expansion coefficients of the semiconductor chip 3 and the sealing body 4 are made close to each other by adjusting a mixing ratio of the filler particles.

<Circuit Configuration of Semiconductor Device>

Figure 5:
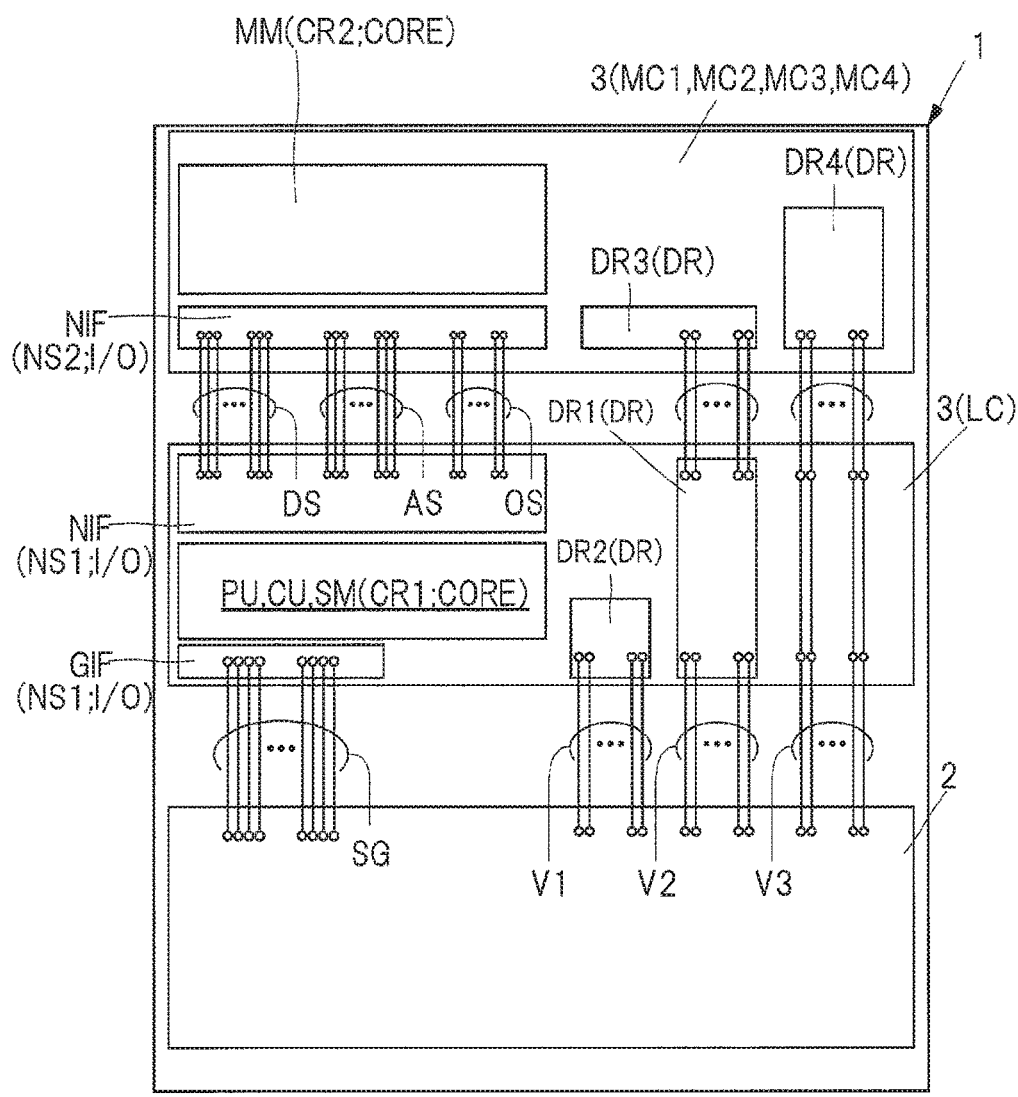
FIG. 5 is an explanatory diagram schematically illustrating a circuit configuration example of the semiconductor device illustrated in FIGS. 1 to 4.

Next, the circuit configuration example of the semiconductor device 1 will be described. As illustrated in FIG. 5, the control circuit CU that controls the operation of the main memory circuit M of the memory chips MC1, MC2, MC3 and MC4 is formed in the logic chip LC in addition to the arithmetic processing circuit PU described above. Also, an auxiliary memory circuit (memory circuit) SM having a smaller storage capacity than that of the main memory circuit MM such as a cache memory temporarily storing data is formed in the logic chip LC. In FIG. 5, the arithmetic processing circuit PU, the control circuit CU and the auxiliary memory circuit SM are collectively illustrated as a core circuit (main circuit) CR1 by way of example. However, circuits included in the core circuit CR1 may include circuits other than the above-described circuits.

Also, an external interface circuit (external input and output circuit) GIF that inputs and outputs a signal between the logic chip LC and an external device (not illustrated) is formed in the logic chip LC. A signal line SG which transmits a signal between the logic chip LC and the external device (not illustrated) is connected to the external interface circuit GIF. In addition, the external interface circuit GIF is electrically connected also to the core circuit CR1, and the core circuit CR1 can transmit a signal to the external device through the external interface circuit GIF.

Also, an internal interface circuit (internal input and output circuit) NIF that inputs and outputs a signal between the logic chip LC and an internal device (for example, memory chips MC1, MC2, MC3 and MC4) is formed in the logic chip LC. A data line (signal line) DS that transmits a data signal, an address line (signal line) AS that transmits an address signal and a signal line OS that transmits other signals are connected to the internal interface circuit NIF. The data line DS, the address line AS and the signal line OS are connected to the internal interface circuit NIF of each of the memory chips MC1, MC2, MC3 and MC4. In FIG. 5, a circuit that inputs and outputs a signal from and to electronic components other than the logic chip LC such as the external interface circuit GIF and the internal interface circuit NIF is illustrated as an input and output circuit NS1.

Also, the logic chip LC includes a power supply circuit DR that supplies a potential for driving the core circuit CR1 and the input and output circuit NS1. The power supply circuit DR includes a power supply circuit (input and output power supply circuit) DR1 that supplies a voltage for driving the input and output circuit NS1 of the logic chip LC and a power supply circuit (core power supply circuit) DR2 that supplies a voltage for driving the core circuit CR1 of the logic chip LC. For example, a plurality of different potentials (a first power supply potential and a second power supply potential) are supplied to the power supply circuit DR, and a voltage applied to the core circuit CR1 said the input and output circuit NS1 is defined by a potential difference thereof.

A chip in which the circuits necessary for operations of a certain device or system are intensively formed in the single semiconductor chip 3 like the logic chip LC is referred to as an SoC (System on a Chip). By the way, if the main memory circuit MM illustrated in FIG. 5 is formed in the logic chip LC, the system can be configured by one sheet of the logic chip LC. However, a required capacity of the main memory circuit MM (see FIG. 5) differs in accordance with a device or a system to be operated. Therefore, the versatility of the logic chip LC can be improved by forming the main memory circuit MM in the semiconductor chip 3 separate from the logic chip LC.

Also, the degree of freedom in designing the capacity of the memory circuit included in the system is improved by connecting the plurality of memory chips MC1, MC2, MC3 and MC4 in accordance with the required storage capacity of the main memory circuit MM. In the example illustrated in FIG. 5, the main memory circuit MM is formed in each of the memory chips MC1, MC2, MC3 and MC4. In FIG. 5, the main memory circuit MM is illustrated as a core circuit (main circuit) CR2 of the memory chips MC1, MC2, MC3 and MC4. However, circuits included in the core circuit CR2 may include circuits other than the main memory circuit MM.

Also, the internal interface circuit (internal input and output circuit) NIF that inputs and outputs a signal from and to an internal device (for example, the logic chip LC) is formed in each of the memory chips MC1, MC2, MC3 and MC4. In FIG. 5, the internal interface circuit NIF that inputs and outputs a signal from and to electronic components other than the memory chips MC1, MC2, MC3 and MC4 is illustrated as an input and output circuit NS2.

Also, each of the memory chips MC1, MC2, MC3 and MC4 includes a power supply circuit (driving circuit) DR that supplies a potential for driving the core circuit CR2 and the input and output circuit NS2. The power supply circuit DR includes a power supply circuit (input and output power supply circuit) DR3 that supplies a voltage for driving the input and output circuit NS2 of the memory chips MC1, MC2, MC3 and MC4 and a power supply circuit (core power supply circuit) DR4 that supplies a voltage for driving the core circuit CR2 of the memory chips MC1, MC2, MC3 and MC4. For example, a plurality of different potentials (for example, a first power supply potential and a second power supply potential) are supplied to the power supply circuit DR, and a voltage applied to the core circuit CR2 and the input and output circuit NS2 is defined by a potential difference thereof.

In the example illustrated in FIG. 5, the power supply circuit DR1 of the logic chip LC and the power supply circuit DR3 of the memory chips MC1, MC2, MC3 and MC4 are combined in use. In other words, the input and output circuit NS1 of the logic chip LC and the input and output circuit NS2 of the memory chips MC1, MC2, MC3 and MC4 are driven by the same voltage supplied through a power line V2. By combining all or part of the power supply circuits DR in this manner, the number of power lines V1, V2 and V3 that supply the potential (driving voltage) to the power supply circuit can be reduced. Also, by reducing the number of power lines V1, V2 and V3, the number of electrodes formed in the logic chip LC can be reduced.

A device in which the circuits necessary for operations of a certain device or system are intensively formed in the single semiconductor device 1 like the semiconductor device 1 is referred to as an SiP (System in Package). The example in which the four memory chips MC1, MC2, MC3 and MC4 are laminated on the single logic chip LC is illustrated in FIG. 4, but the number of laminated semiconductor chips 3 is variously modified as described above. Although not illustrated, for example, as a minimum configuration, a modification example in which a single memory chip MC1 is mounted on a single logic chip LC is also applicable.

Also, from the viewpoint of improving the versatility of the logic chip LC and the memory chips, MC1, MC2, MC3 and MC4, it is preferable that the planar sizes of the logic chip LC and the memory chips MC1, MC2, MC3 and MC4 (dimensions seen in a plan view, dimensions of the front surfaces 3a and the rear surfaces 3b, outer sizes) are minimized within a range capable of achieving the function of each semiconductor chip 3. The planar size of the logic chip LC can be reduced by improving the degree of integration of circuit elements. On the other hand, the memory chips MC1, MC2, MC3 and MC4 have a limitation in miniaturizing the planar size because the capacity and the transmission speed of the main memory circuit MM (for example, a data transfer amount by a width of a data bus) is changed in accordance with the planar size.

Therefore, in the example illustrated in FIG. 4, the planar size of the memory chip MC4 is larger than the planar size of the logic chip LC. For example, the planar size of the memory chip MC4 is a rectangle whose length of one side is about 8 mm to 10 mm, while the planar size of the logic chip LC is a rectangle whose'length of one side is about 5 mm to 6 mm. Also, although not illustrated, the planar sizes of the memory chips MC1, MC2 and MC3 illustrated in FIG. 4 are equal to the planar size of the memory chip MC4.

In addition, since the external interface circuit GIF that inputs and outputs a signal between the logic chip LC and the external device (not illustrated) is formed in the logic chip LC as described above, it is preferable that the logic chip LC is mounted on the lowermost stage, that is, the position closest to the wiring substrate 2 with respect to the laminating order of the plurality of semiconductor chips 3 from the viewpoint, of reducing a transmission distance to the external device. Namely, it is preferable that the semiconductor chip 3 (memory chips MC1, MC2, MC3 and MC4) having a large planar size is laminated on the semiconductor chip 3 (logic chip LC) having a small planar size like in the semiconductor device 1.

<Configuration Example of Semiconductor Chip>

Figure 6:
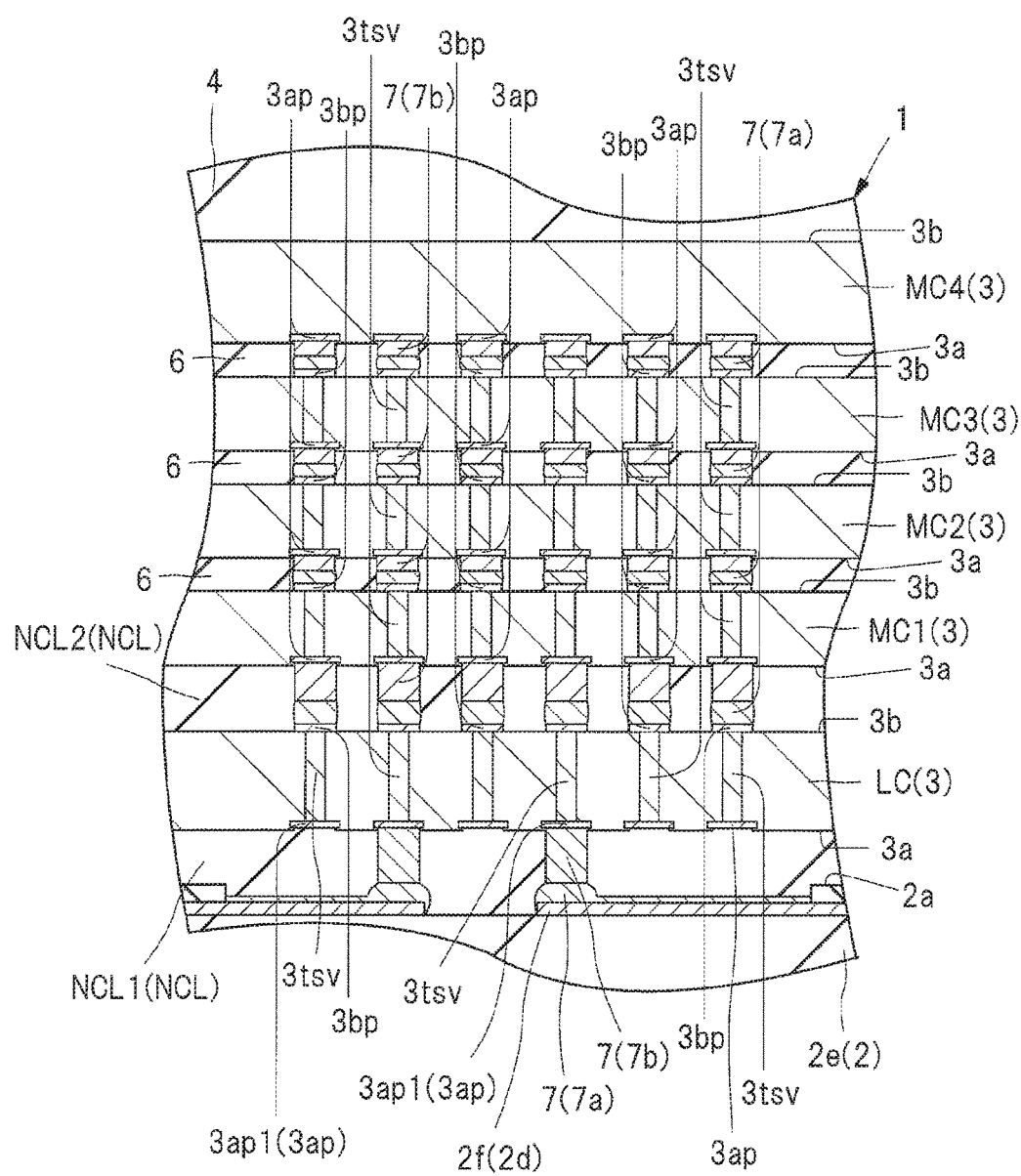
FIG. 6 is an enlarged sectional view of a portion A illustrated in FIG. 4.
Figure 9:
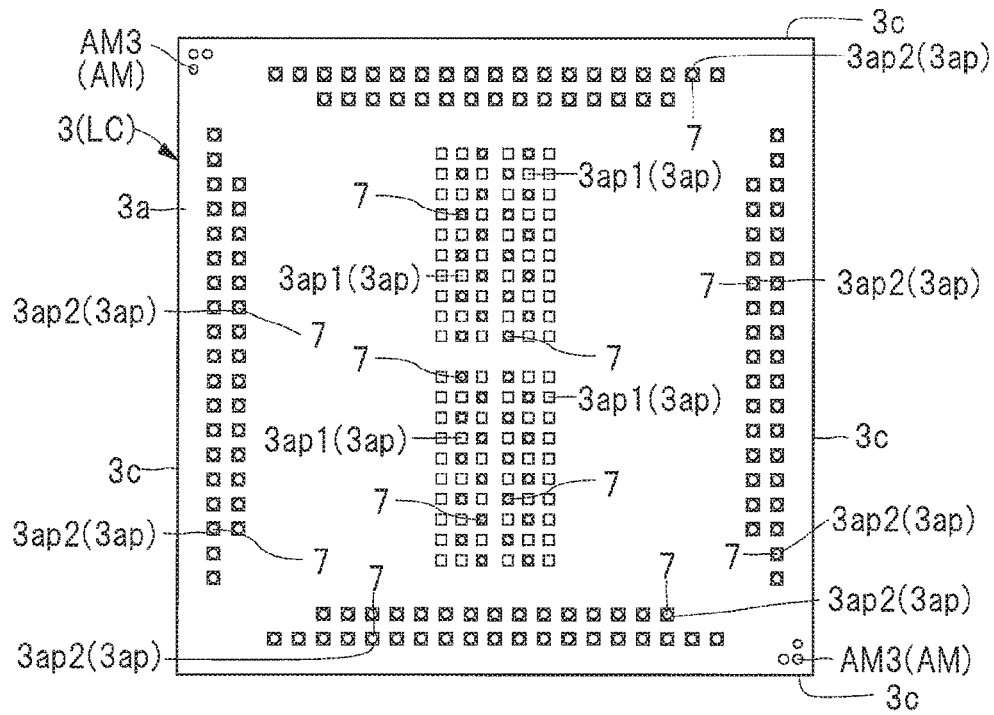
FIG. 9 is a plan view illustrating a front surface side of a logic chip illustrated in FIG. 4.
Figure 10:
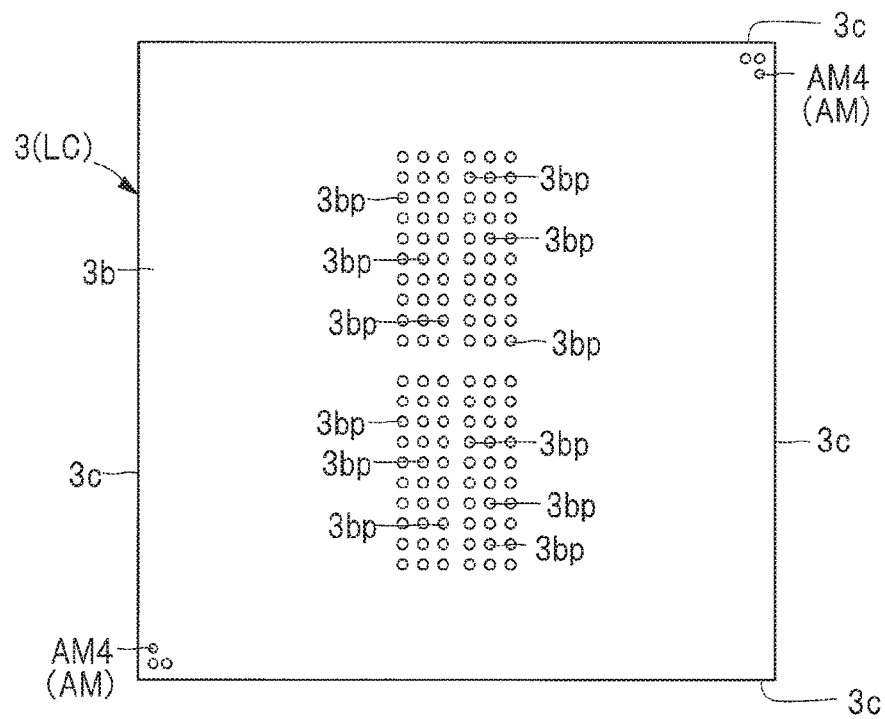
FIG. 10 is a plan view illustrating an example of a rear surface side of the logic chip illustrated in FIG. 9.

Next, details of the logic chip LC and the memory chips MC1, MC2, MC3 and MC4 illustrated in FIG. 4 and a method of electrically connecting the semiconductor chips 3 will be described. FIG. 6 is an enlarged sectional view of a portion A illustrated in. FIG. 4. Also, FIG. 7 is a plan view illustrating the front surface side of the memory chip illustrated in FIG. 4, and FIG. 8 is a plan view illustrating an example of the rear surface side of the memory chip illustrated in FIG. 7. Also, FIG. 9 is a plan view illustrating the front surface side of the logic chip illustrated in FIG. 4, and FIG. 10 is a plan view illustrating an example of the rear surface side of the logic chip illustrated in FIG. 9. Note that the number of electrodes illustrated in FIGS. 6 to 10 is small for ease of viewing, but the number of electrodes (front electrodes 3ap, rear electrodes 3bp, through electrodes 3tsv) is not limited to the embodiment illustrated in FIGS. 6 to 10. Also, FIG. 8 illustrates a rear view of the memory chips MC1, MC2 and MC3, but the configuration of the rear surface of the memory chip MC4 (see FIG. 4) where the rear electrode 3bp is not formed is not illustrated because it is illustrated in FIG. 3.

The inventors of the present application have studied a technique for improving the performance of an SiP semiconductor device, and the inventors of the present application have studied a technique for improving a signal transmission speed between a plurality of semiconductor chips mounted on SiP to, for example, 12 Gbps (12 gigabits per second) or more as a part of this study. As a method of improving a transmission speed between a plurality of semiconductor chips mounted on SiP, there is a method of increasing an amount of data to be transmitted at one time by increasing a width of a data bus of an internal interface (hereinafter, referred to as a bus width expansion method). Also, as another method, there is a method of increasing the number of times of transmission per unit time (hereinafter, referred to as a high clock method). Also, there is a method of applying the bus width expansion method and the clock number increasing method in combination. The semiconductor device 1 described with reference to FIGS. 1 to 5 is a semiconductor device in which a transmission speed of an internal interface is improved to 12 Gbps or more by applying the bus width expansion method and the high clock method in combination.

For example, each of the memory, chips MC1, MC2, MC3 and MC4 illustrated in FIG. 4 is a so-called wide I/O memory that has a data bus width of 512 bits. Specifically, each of the memory chips MC1, MC2, MC3 and MC4 has four channels each having a data bus width of 128 bits, and the total bus width of the four channels is 512 bits. Also, the number of times of transmission of each channel per unit time is set to, for example, 3 Gbps or more by higher clock.

When the high clock method and the bus width expansion method are applied in combination in this manner, it is necessary to operate a large number of data lines at a high speed, and it is thus necessary to reduce a data transmission distance from the viewpoint of reducing the influence of noise. Therefore, as illustrated in FIG. 4, the logic chip LC and the memory chip MC1 are electrically connected to each other via a conductive member disposed between the logic chip LC and the memory chip MC1. Also, the plurality of memory chips MC1, MC2, MC3 and MC4 are electrically connected to each other via conductive members disposed between the plurality of memory chips MC1, MC2, MC3 and MC4. In other words, in the semiconductor device 1, the wiring substrate 2 and a wire (bonding wire) (not illustrated) are not included in the transmission path between the logic chip LC and the memory chip MC1. Also, in the semiconductor device 1, the wiring substrate 2 and a wire (bonding wire) (not illustrated) are not included in the transmission path between the plurality of memory chips MC1, MC2, MC3 and MC4.

In the present embodiment, as a method of directly connecting the plurality of semiconductor chips 3 to one another, a technique of forming a through electrode 3tsv passing through the semiconductor chips 3 (specifically, semiconductor substrates of the semiconductor chips 3) in a thickness direction and connecting the laminated semiconductor chips 3 to one another via the through electrode 3tsv is applied. Specifically, as illustrated in FIG. 6, the logic chip LC includes a plurality of front electrodes (electrodes, pads, front surface pads) 3*ap* formed on the front surface 3*a* thereof and a plurality of rear electrodes (electrodes, pads, rear surface pads) 3*bp* formed on the rear surface 3*b* thereof. Also, the logic chip LC includes a plurality of through electrodes 3*tsv* that are formed to pass through the semiconductor substrate and electrically connect the plurality of front electrodes 3*ap* to the plurality of rear electrodes 3*bp*.

Various circuits (semiconductor elements and wirings connected thereto) included in the semiconductor chip 3 are formed on the side close to the front surface 3*a* of the semiconductor chip 3. Specifically, the semiconductor chip 3 includes a semiconductor substrate (not illustrated) made of, for example, silicon (Si), and a plurality of semiconductor elements (not illustrated) such as a transistor are formed on the main surface (element forming surface) of the semiconductor substrate. Wiring layers (not illustrated) each including a plurality of wirings and an insulating film that isolates the plurality of wirings from one another are laminated on the main surface (front surface 3*a*) of the semiconductor substrate. The plurality of wirings of the wiring layer are electrically connected to the plurality of semiconductor elements, thereby constituting a circuit. The plurality of front electrodes 3*ap* formed on the front surface 3*a* of the semiconductor chip 3 (see FIG. 4) are electrically connected to the semiconductor elements via the wiring layer provided between the semiconductor substrate and the front surface 3*a*, thereby constituting a part of the circuit.

Therefore, as illustrated in FIG. 6, by forming the through electrode 3*tsv* passing through the semiconductor substrate of the semiconductor chip 3 in the thickness direction and electrically connecting the front electrode 3*ap* to the rear electrode 3*bp* via the through electrode 3*tsv*, the rear electrode 3*bp* and the circuit of the semiconductor chip 3 formed on the side close to the front surface 3*a* can be electrically connected to each other. Namely, as illustrated in FIG. 6, when the front electrode 3*ap* of the memory chip MC1 and the rear electrode 3*bp* of the logic chip LC are electrically connected to each other via the external terminal (protrusion electrode, conductive member, bump electrode) 7, the circuit of the memory chip MC1 and the circuit of the logic chip LC are electrically connected to each other via the through electrode 3*tsv*.

Also, in the present embodiment, the logic chip LC mounted between the memory chip MC1 and the wiring substrate 2 includes a plurality of through electrodes 3*tsv*. Therefore, by electrically connecting the memory chip MC1 and the logic chip LC via the through electrode 3*tsv*, the wiring substrate 2 and the wire (bonding wire) (not illustrated) can be eliminated from the transmission path between the logic chip LC and the memory chip MC1. As a result, it is possible to reduce an impedance component in the transmission path between the logic chip LC and the memory chip MC1 and reduce the influence of noise due to the high clock. In other words, the transmission reliability can be improved even when the signal transmission speed between the logic chip LC and the memory chip MC1 is improved.

Also, in the example illustrated in FIG. 6, the plurality of memory chips MC1, MC2, MC3 and MC4 are laminated on the logic chip LC, and it is preferable to improve the signal transmission speed between the plurality of memory chips MC1, MC2, MC3 and MC4. Thus, among the plurality of memory chips MC1, MC2, MC3 and MC4, the memory chips MC1, MC2 and MC3 each having the semiconductor chips 3 arranged thereon and thereunder include a plurality of through electrodes 3*tsv* like the logic chip LC. Specifically, each of the memory chips MC1, MC2 and MC3 includes a plurality of front electrodes (electrodes, pads) 3*ap* formed on the front surface 3*a* thereof and a plurality of rear electrodes (electrodes, pads) 3*bp* formed on the rear surface 3*b* thereof. Further, each of the memory chips MC1, MC2 and MC3 includes a plurality of through electrodes 3*tsv* that are formed to pass through the semiconductor substrate and electrically connect the plurality of front electrodes 3*ap* to the plurality of rear electrodes 3*bp*.

Therefore, like the case of the logic chip LC described, above, when the front electrode 3*ap* of the semiconductor chip 3 of the upper stage and the rear electrode 3*bp* of the semiconductor chip 3 of the lower stage among the memory chips MC1, MC2, MC3 and MC4 are electrically connected to each other via a conductive member such as the external terminal 7, the circuits of the plurality of laminated semiconductor chips 3 are electrically connected to each other via the through electrode 3*tsv*.

Therefore, by connecting the semiconductor chips 3 via the external terminal 7 (a solder material 7*a* and a protrusion electrode 7*b* in the example illustrated in FIG. 6), the wiring substrate 2 and the wire (bonding wire) (not illustrated) can be eliminated from the transmission path between the memory chips MC1, MC2, MC3 and MC4. As a result, it is possible to reduce an impedance component in the transmission path between the plurality of laminated memory chips MC1, MC2, MC3 and MC4 and reduce the influence of noise due to the high clock. In other words, the transmission reliability can be improved even when the signal transmission speed between the plurality of memory chips MC1, MC2, MC3 and MC4 is improved.

In the example illustrated in FIG. 6, it is sufficient that the memory chip MC4 mounted on the uppermost stage is connected to the memory chip MC3, and thus, a plurality of front electrodes 3*ap* are formed, but a plurality of rear electrodes 3*bp* and a plurality of through electrodes 3*tsv* are not formed in the memory chip MC4. By forming the memory chip MC4 mounted on the uppermost stage to have the configuration that does not include the plurality of rear electrodes 3*bp* and the plurality of through electrodes 3*tsv* in this manner, a manufacturing process of the memory chip MC4 can be simplified. However, although not illustrated, the memory chip MC4 may be formed to have a configuration that includes the plurality of rear electrodes 3*bp* and the plurality of through electrodes 3*tsv* like the memory chips MC1, MC2, and MC3 as a modification example. In this case, by forming the plurality of laminated memory chips MC1, MC2, MC3 and MC4 to have the same configuration, the manufacturing efficiency can be improved.

Also, the external terminal 7 that is disposed between the laminated semiconductor chips 3 and electrically connects the front electrode 3*ap* of the semiconductor chip 3 of the upper stage to the rear electrode 3*bp* of the semiconductor chip 3 of the lower stage uses the following material in the example illustrated in FIG. 6. That is, the external terminal 7 that electrically connects the logic chip LC to the wiring substrate 2 is a metal member in which a nickel (Ni) film and a solder (for example, SnAg) film (solder material 7*a*) are laminated at a tip of a member (protrusion electrode 7*b*) that is formed to have a columnar shape (for example, a cylindrical shape) and contains copper (Cu) as a main component. In an electrical connection portion of the logic chip LC and the wiring substrate 2, the solder film of the tip of the external terminal 7 is bonded to the rear electrode 3*bp*.

Also, in the example illustrated in FIG. 6, the external terminal 7 provided in the bonding portion that electrically connects the plurality of semiconductor chips 3 to each other is also a metal member in which a nickel (Ni) film and a solder (for example, SnAg) film (solder material 7*a*) are laminated at a tip of a member (protrusion electrode 7*b*) that is formed to have a columnar shape and contains copper (Cu) as a main component. By bonding the solder film of the tip of the external terminal 7 to the rear electrode 3*bp*, the laminated semiconductor chips 3 are electrically connected to each other.

However, various modification examples are applicable to the material constituting the external terminal 7 within a range satisfying requirements of electrical characteristics or requirements of bonding strength. For example, for the portion that electrically connects the memory chips MC1, MC2, MC3 and MC4 to each other, the solder material (solder bump, protrusion electrode) 7*a* may be bonded to the front electrode 3*ap* and the rear electrode 3*bp* without forming the protrusion electrode 7*b* illustrated in FIG. 6. Also, there are various modification examples for the shape of the protrusion electrode 7*b*. For example, a stud bump formed by a so-called ball bonding technique of forming a ball portion by melting a tip of a wire and then pressing the ball portion to the front electrode 3*ap* can be used as the protrusion electrode 7*b*. In this case, the protrusion electrode 7*b* can be made of, for example, a metal material containing gold (Au) as a main component.

Also, it is preferable that a thickness of the semiconductor chip 3 including the through electrode 3*tsv* like the logic chip LC and the memory chips MC1, MC2 and MC3 illustrated in FIG. 6, that is, a separation distance between the front surface 3*a* and the rear surface 3*b* is thin (small). The reduction of the thickness of the semiconductor chip 3 is preferable because the transmission distance of the through electrode 3*tsv* is reduced and an impedance component can be reduced. Also, in the case where an opening (including a penetration hole and a non-penetration hole) is formed in a thickness direction of the semiconductor substrate, processing accuracy is reduced as the depth of the hole becomes larger. In other words, if the thickness of the semiconductor chip 3 is reduced, the processing accuracy of the opening for forming the through electrode 3*tsv* can be improved. Therefore, since the diameters of the plurality of through electrodes 3*tsv* (lengths in a direction perpendicular to the thickness direction of the semiconductor chip 3, widths) can be made uniform, the impedance components of the plurality of transmission paths can be easily controlled.

In the example illustrated in FIG. 6, the thickness of the logic chip LC is smaller than the thickness of the laminated body MCS (see FIG. 4) of the plurality of memory chips MC1, MC2, MC3 and MC4 arranged on the logic chip LC. Also, the thickness of the logic chip LC is smaller than the thickness of the memory chip MC4 which is mounted on the uppermost stage among the plurality of memory chips MC1, MC2, MC3 and MC4 and in which the through electrode 3*tsv* is not formed. For example, the thickness of the logic chip LC is about 50 μm. In contrast, the thickness of the memory chip MC4 is about 80 μm to 100 μm. Also, the thickness of the laminated body MCS (see FIG. 4) of the plurality of memory chips MC1, MC2, MC3 and MC4 is about 260 μm.

When the thickness of the semiconductor chip 3 is reduced as described above, the semiconductor chip 3 may be damaged in a state in which the semiconductor chip 3 is exposed. According to the present embodiment, the plurality of semiconductor chips 3 are sealed by bringing the sealing body 4 into close contact with the plurality of semiconductor chips 3 as illustrated in FIG. 4. Therefore, the sealing body 4 can function as the protective member of the semiconductor chips 3 and suppress the damage to the semiconductor chips 3. Namely, according to the present embodiment, the reliability (durability) of the semiconductor device 1 can be improved by sealing the plurality of semiconductor chips 3 with resin.

Also, in the case of the semiconductor device 1 in which the semiconductor chips 3 including the through electrodes 3*tsv* are laminated, it is preferable to reduce an interval between the semiconductor chip 3 and the wiring substrate 2 from the viewpoint of reducing the transmission distance. For example, in the example illustrated in FIG. 6, an interval between the front surface 3*a* of the logic chip LC and the top surface 2*a* of the wiring substrate 2 is about 10 μm to 20 μm. Also, an interval between the front surface 3*a* of the memory chip MC1 and the top surface 2*a* of the wiring substrate 2 is, for example, about 70 μm to 100 μm. As described above, it is preferable to reduce the transmission distance by reducing the thickness and the separation distance of the semiconductor chips 3 in the semiconductor device 1 in which the semiconductor chips 3 including the through electrodes 3*tsv* are laminated.

Also, in the present embodiment, in a layout of the front electrode 3*ap* and the rear electrode 3*bp* when seen in a plan view, a configuration capable of reducing the transmission distance between the memory chips MC1, MC2, MC3 and MC4 and the logic chip LC is applied.

As illustrated in FIG. 7, the plurality of front electrodes 3*ap* included in the memory chips MC1, MC2, MC3 and MC4 are collectively arranged in the central portion of the front surface 3*a*. Also, as illustrated in FIG. 8, the plurality of rear electrodes 3*bp* included in the memory chips MC1, MC2 and MC3 are collectively arranged in the central portion of the rear surface 3*b*. Also, as illustrated in FIG. 6, the plurality of front electrodes 3*ap* of the memory chips MC1, MC2, MC3 and MC4 and the plurality of rear electrodes 3*bp* of the memory chips MC1, MC2 and MC3 are arranged at positions overlapping in the thickness direction.

Also, as illustrated in FIG. 9, some of the plurality of front electrodes 3*ap* (a plurality of front electrodes 3*ap*1) included in the logic chip LC are collectively arranged in the central portion of the front surface 3*a*. Also, some of the plurality of front electrodes 3*ap* (a plurality of front electrodes 3*ap*2) included in the logic chip LC are arranged along a side (side surface 3*c*) of the front surface 3*a* in the peripheral portion of the front surface 3*a*. Among the plurality of front electrodes 3*ap* illustrated in FIG. 9, the plurality of front electrodes 3*ap*1 arranged in the central portion of the front surface 3*a* are electrically connected to the rear electrodes 3*bp* via the through electrodes 3*tsv* illustrated in FIG. 6. Namely, the plurality of front electrodes 3*ap*1 are electrodes for the internal interface. On the other hand, among the plurality of front electrodes 3*ap* illustrated in FIG. 9, the plurality of front electrodes 3*ap*2 arranged in the peripheral portion of the front surface 3*a* are electrically connected to the external device (not illustrated) via the wiring substrate 2 illustrated in FIG. 4. Specifically, the front electrodes 3*ap*2 are electrically bonded to the bonding leads 2*f* (see FIG. 4) via the external terminals 7. Namely, the plurality of front electrodes 3*ap*2 are electrodes for the external interface.

From the viewpoint of reducing the transmission distance between the plurality of semiconductor chips 3, it is particularly preferable that the front electrodes 3*ap* for the internal interface and the rear electrodes 3*bp* are arranged at positions overlapping in the thickness direction and are connected via the external terminals 7 as illustrated in FIG. 6.

Also, as described, above, the planar size of the logic chip LC is smaller than the planar sizes of the memory chips MC1, MC2, MC3 and MC4. Also, in the semiconductor device 1 illustrated in FIG. 3, the logic chip LC and the memory chip MC4 are arranged so that the central portion (central region) of the rear surface 3b of the logic chip LC overlaps the central portion (central region) of the memory chip MC4 when seen in a plan view. Namely, the four side surfaces 3c of the memory chip MC4 are arranged on an outer side relative to the four side surfaces 3c of the logic chip LC when seen in a plan view. In other words, the plurality of semiconductor chips 3 are laminated and mounted on the wiring substrate 2 so that the four side surfaces 3c of the memory chip MC4 are located between the four side surfaces 3c of the logic chip LC and the four side surfaces 2c of the wiring substrate 2. Also, the memory chips MC1, MC2 and MC3 illustrated in FIG. 4 are arranged at positions overlapping (the same positions as) the memory chip MC4 when seen in a plan view.

Therefore, the peripheral portions of the memory chips MC1, MC2, MC3 and MC4 (peripheral portions of the front surfaces 3a and the rear surfaces 3b) are arranged at positions overlapping the peripheral region of the outer side of the logic chip LC when seen in a plan view. In other words, the logic chip LC is not present between the peripheral portions of the memory chips MC1, MC2, MC3 and MC4 and the wiring substrate 2 (see, for example, FIG. 4).

Thus, it is preferable that at least the front electrodes 3ap for the internal interface and the rear electrodes 3bp are arranged at the positions overlapping the logic chip LC in the thickness direction in order that the front electrodes 3ap for the internal interface and the rear electrodes 3bp in each semiconductor chip 3 illustrated in FIG. 6 are arranged at the different positions in the thickness direction. Also, as illustrated in FIG. 9, the plurality of front electrodes 3ap2 for the external interface are arranged in the peripheral portion of the logic chip LC. Therefore, it is preferable that the plurality of front electrodes 3ap1 for the internal interface are collectively arranged in the central portions of the front surface 3a of the logic chip LC.

Also, as illustrated in FIG. 7, a plurality of memory regions (memory circuit element arrangement regions) MR are formed on the front surfaces 3a of the memory chips MC1, MC2, MC3 and MC4 (specifically, on the main surfaces of the semiconductor substrates). In the example illustrated in FIG. 7, four memory regions MR corresponding to the four channels described above are formed. In each of the memory regions MR, a plurality of memory cells (memory circuit elements) are arranged in an array form. Here, as illustrated in FIG. 7, when the plurality of front electrodes 3ap are collectively arranged in the central portion of the front surface 3a, the memory regions MR corresponding to the four channels can be arranged so as to surround a region in which a front electrode group is arranged. As a result, a distance from each memory region MR to the front electrode 3ap can be equalized. Namely, since the transmission distance of each of the plurality of channels can be equalized in length, this is preferable in that an error of the transmission speed for each channel can be reduced.

By the way, in the case where the front electrodes 3ap1 collectively arranged in the central portion of the front surface 3a of the logic chip LC illustrated in FIG. 9 are used as the electrodes dedicated for the internal interface, the function can be achieved without electrically connecting the front electrodes 3ap1 to the wiring substrate 2 illustrated in FIG. 6. However, as illustrated in FIG. 6, it is preferable that some of the front electrodes 3ap1 are electrically connected to the bonding leads 2f of the wiring substrate 2 because some of the front electrodes 3ap1 can be used as the electrodes for the external interface.

For example, the power supply circuit DR for driving the main memory circuit MM illustrated in FIG. 5 is formed in the memory chips MC1, MC2, MC3 and MC4, and some of the front electrodes 3ap1 illustrated in FIG. 9 may be used as terminals for supplying a power supply potential (first reference potential) and a reference potential (a second reference potential different from the first reference potential, for example, a ground potential) to the power supply circuit DR. In other words, in the example illustrated in FIG. 9, the plurality of front electrodes 3ap1 arranged in the central portion of the front surface 3a of the logic chip LC include a first reference potential electrode to which the first reference potential (for example, the power supply potential) is supplied and a second reference potential electrode to which the second reference potential (for example, the ground potential) different from the first reference potential is supplied. Furthermore, in the example illustrated in FIG. 9, the plurality of front electrodes 3ap1 arranged in the central portion of the front surface 3a of the logic chip LC include power lines V2 and V3 (see FIG. 5) that supply a voltage for driving the circuits formed in the memory chip MC1.

In the case of improving the signal transmission speed, it is preferable to reduce the transmission distance between a supply source of the power supply and a power-consuming circuit from the viewpoint of suppressing unstable operations due to an instantaneous voltage drop. Thus, it is preferable that some of the front electrodes 3ap1 of the logic chip LC are electrically connected to the wiring substrate 2 to supply the first reference potential (for example, the power supply potential) or the second reference potential (for example, the ground potential) because the distance to the driving circuits of the memory chips MC1, MC2, MC3 and MC4 having power-consuming circuits formed therein can be reduced. Also, it is preferable that the first reference potential electrode to which the first reference potential (for example, the power supply potential) is supplied and the second reference potential electrode to which the second reference potential (for example, the ground potential) different from the first reference potential is supplied are arranged so that the front electrodes 3ap and the rear electrodes 3bp overlap each other in the thickness direction as illustrated in FIG. 6 and are electrically connected via the through electrodes 3tsv.

<Warpage Deformation of Semiconductor Chip>

Figure 11:
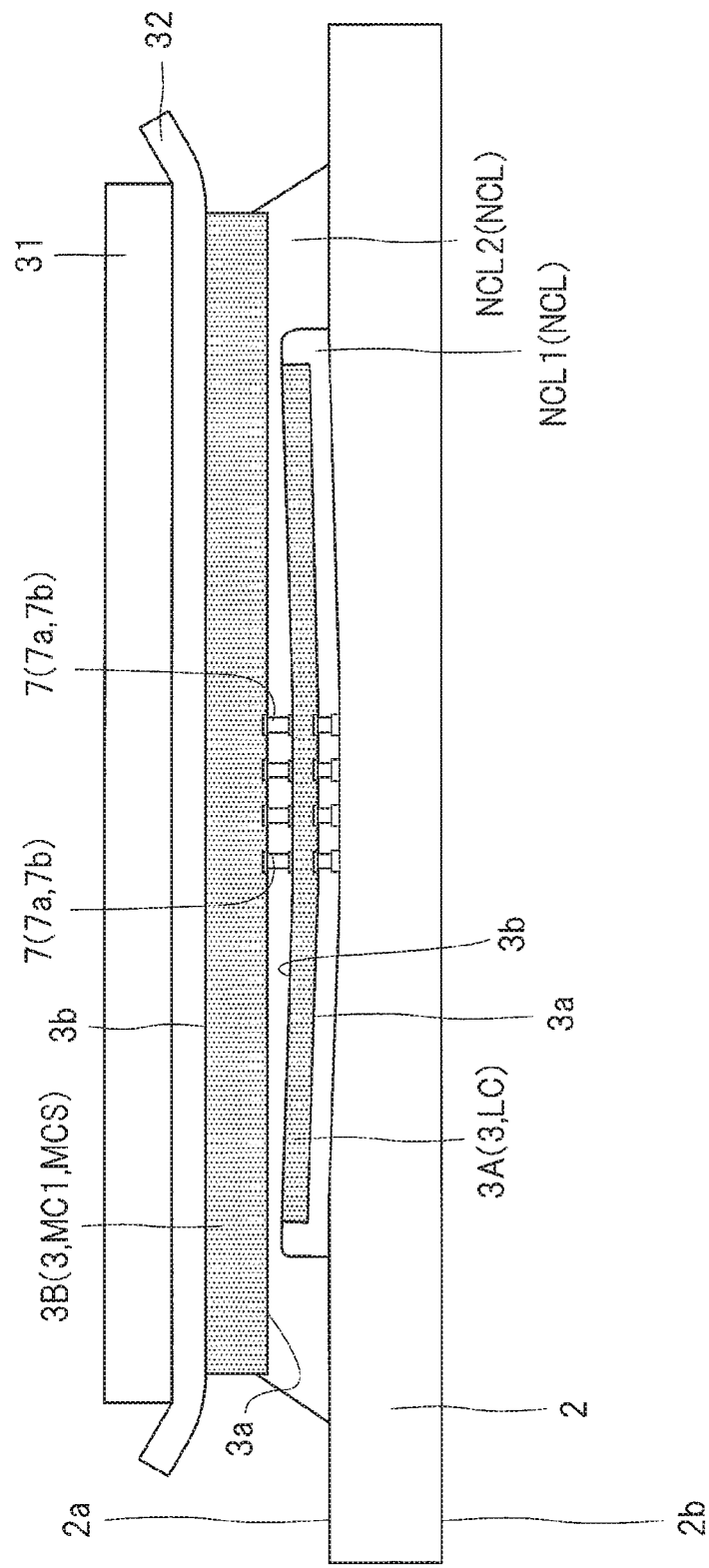
FIG. 11 is an explanatory view schematically illustrating a representative example of warpage deformation which occurs in laminated semiconductor chips.
Figure 12:
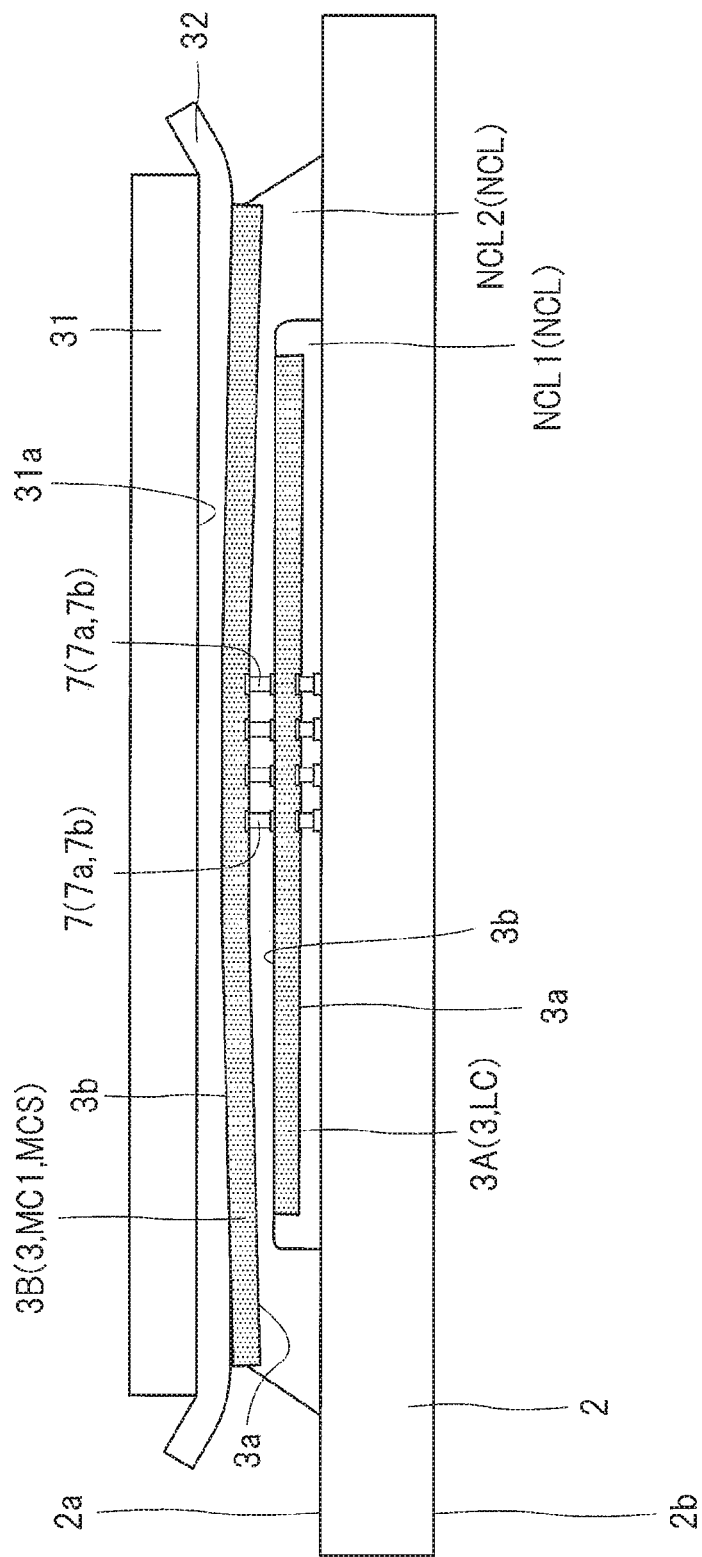
FIG. 12 is an explanatory view schematically illustrating an example of warpage deformation different from that of FIG. 11, which occurs in laminated semiconductor chips.
Figure 13:
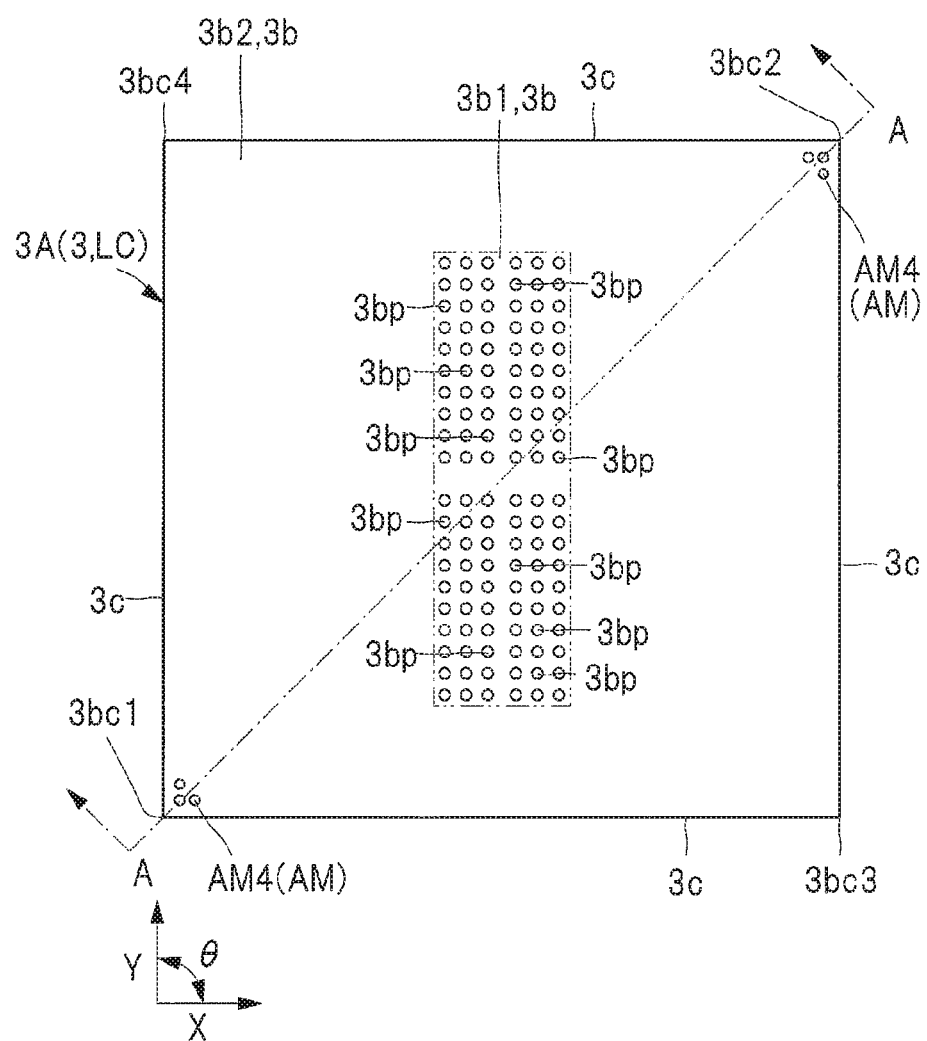
FIG. 13 is a plan view explicitly illustrating a compartment example of a region in which rear electrodes are formed and a region in which metal patterns except for the rear electrodes are formed on the rear surface of the semiconductor chip illustrated in FIG. 10.
Figure 14:
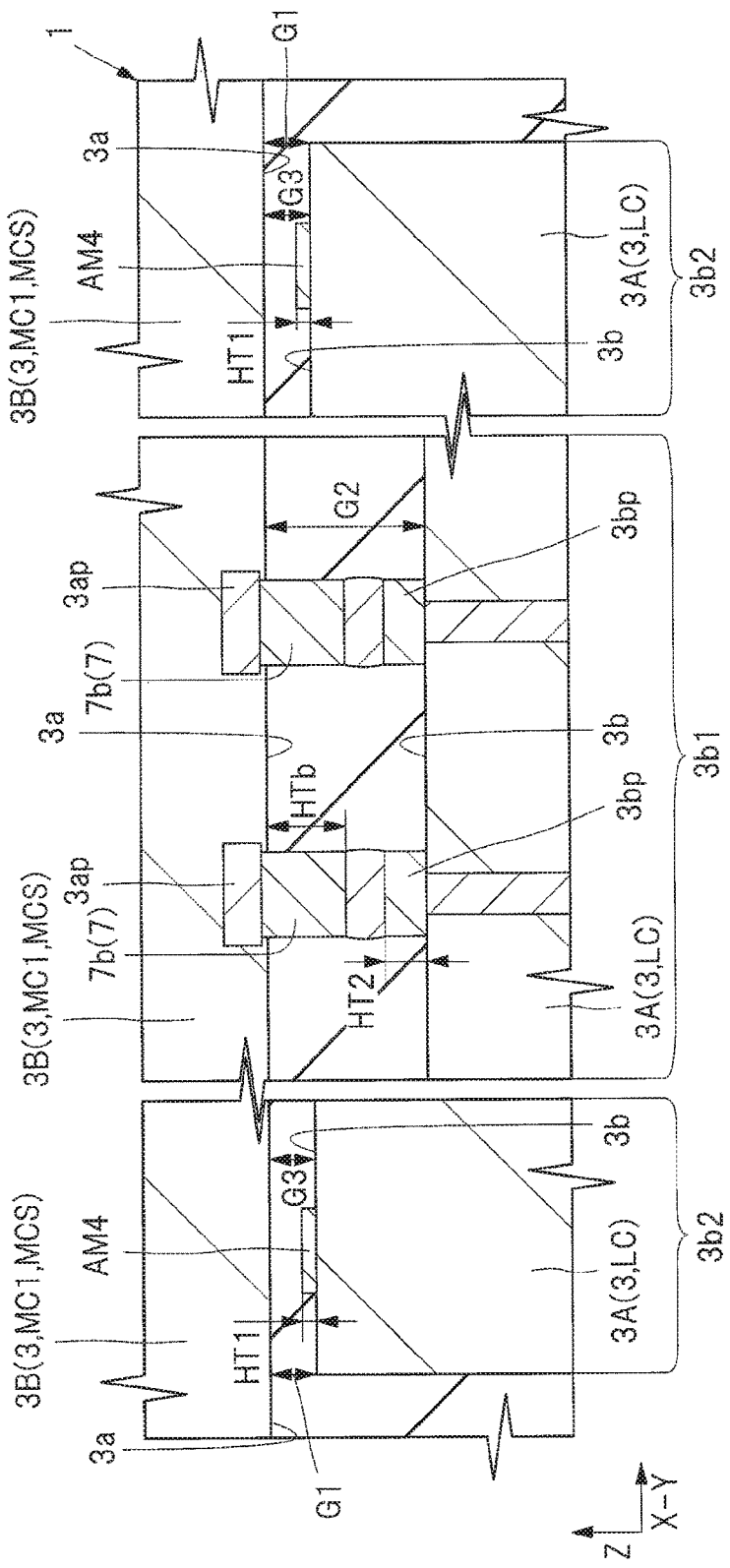
FIG. 14 is an enlarged sectional view taken along a line A-A of FIG. 13.
Figure 15:
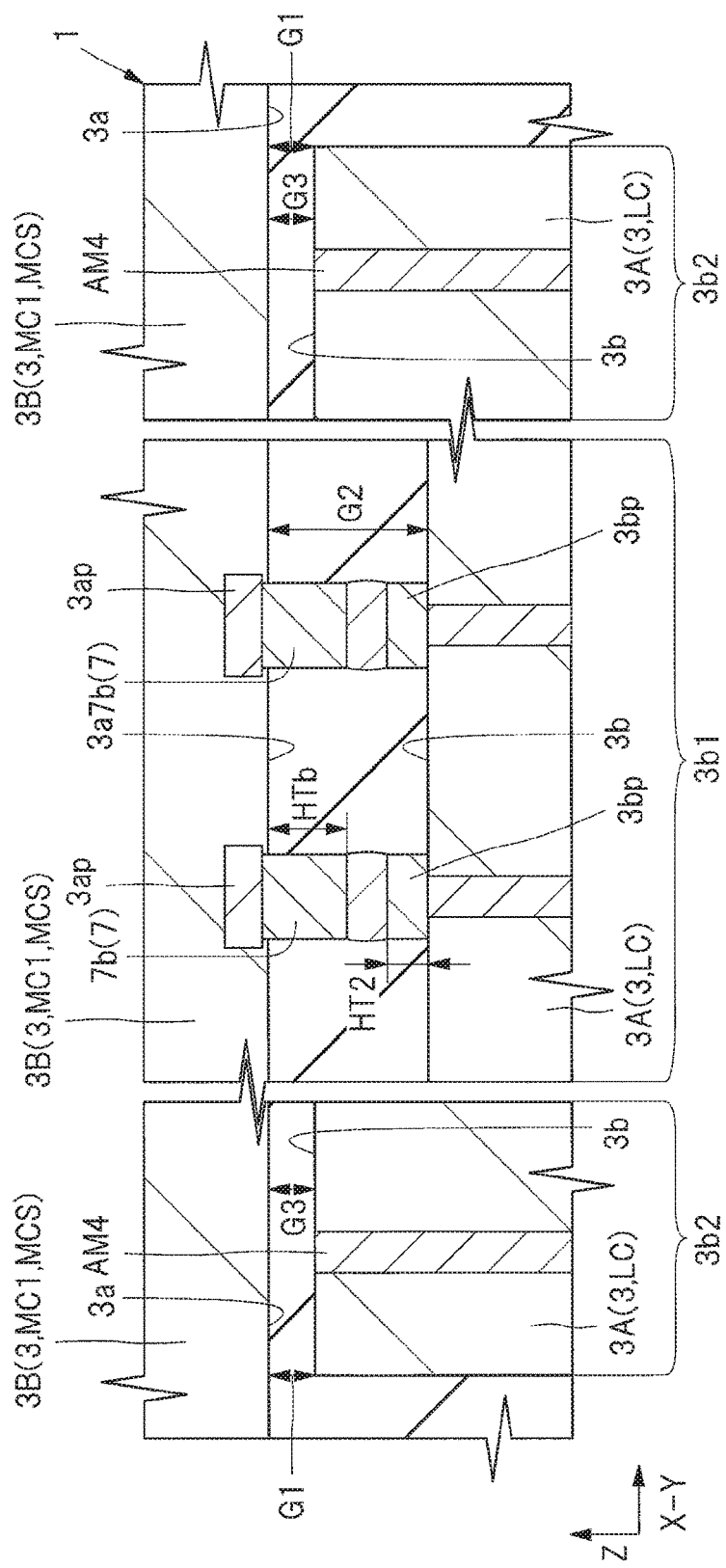
FIG. 15 is an enlarged sectional view illustrating a modification example of FIG. 14.

Here, in the example of the semiconductor device 1 described above with reference to FIGS. 1 to 10, warpage deformation occurring in the plurality of semiconductor chips 3 laminated on the wiring substrate 2 will be described. FIGS. 11 and 12 are explanatory views schematically illustrating a representative example of warpage deformation occurring in the laminated semiconductor chips. Also, FIG. 13 is a plan view explicitly illustrating a compartment example of a region in which rear electrodes are formed and a region in which metal patterns except for the rear electrodes are formed on the rear surface of the semiconductor chip illustrated in FIG. 10. Also, FIG. 14 is an enlarged sectional view taken along a line A-A of FIG. 13. Also, FIG. 15 is an enlarged sectional view illustrating a modification example of FIG. 14.

In FIGS. 11 and 12, for easier viewing of the shape of the warpage deformation of the semiconductor chip 3, the semiconductor chip 3 is highlighted by the dot pattern, and members other than the semiconductor chip 3 are denoted in white. Also, in FIG. 13, a boundary between a region 3b1 in which the plurality of rear electrodes 3bp are formed and a region 3b2 of the peripheral portion of the rear surface 3b is denoted with a two-dot chain line. Therefore, the inner side of the rectangle of the two-dot chain line illustrated in FIG. 13 corresponds to the region 3b1, and the outer side of the rectangle of the two-dot chain line corresponds to the region 3b2. Also, in FIG. 14, in order to show the details of the gap between the semiconductor chips 3 in each of the region 3b1 and the region 3b2 illustrated in FIG. 13 in one drawing, a part of the region 3b1 and a part of the outer periphery of the region 3b1 in a cross section taken along a line A-A illustrated in FIG. 13 are selectively illustrated.

As a result of the observation of the cross-section of the semiconductor device 1 illustrated in FIG. 4 based on a cross-sectional photograph taken by the inventors of the present application, the inventors of the present application have found that there is a variation in a planar distribution of a gap between the logic chip LC and the memory chip MC1 (a separation distance between the rear surface 3b of the logic chip LC and the front surface 3a of the memory chip MC1). Specifically, it has been found that the gap between the logic chip LC and the memory chip MC1 is larger in the central portion of the rear surface 3b of the logic chip LC than in the peripheral portion of the rear surface 3b when seen in a plan view. FIGS. 11 and 12 schematically illustrate a representative example of warpage deformation occurring in the semiconductor chip 3 described above.

In the case where the plurality of laminated semiconductor chips 3 are electrically connected to each other by the protrusion electrodes, warpage deformation occurs in both or either of the semiconductor chip 3A of the lower stage and the semiconductor chip 3B of the upper stage as schematically illustrated in FIGS. 11 and 12. As the reason for the occurrence of the warpage deformation, the following two causes (hereinafter, referred to as modes) may be considered.

First, a mode in which the central portion of the top surface 2a of the wiring substrate 2 is deformed to sink and the semiconductor chip 3A of the lower stage is deformed in accordance with the deformation of the wiring substrate 2 as illustrated in FIG. 11 may be considered. The mode of the warpage deformation illustrated in FIG. 11 occurs due to a thermal deformation of the wiring substrate 2 in the process of mounting the semiconductor chip 3B of the upper stage on the semiconductor chip 3A of the lower stage.

The process of mounting the semiconductor chip 3B of the upper stage includes a process of pressing the semiconductor chip 3B of the upper stage toward the wiring substrate 2 while heating the external terminal 7 through the semiconductor chip 3 for electrically connecting the upper and lower semiconductor chips 3 via the external terminal 7 including the protrusion electrode 7b. At this time, when the constituent member of the wiring substrate 2 and the adhesive NCL1 are softened by heat, the wiring substrate 2 and the adhesive NCL1 are deformed by a pressing force that presses the semiconductor chip 3B.

Also, for example, in the case where the plurality of electrodes of the laminated semiconductor chips 3 are collectively arranged in the central portion when seen in a plan view like the front electrodes 3ap of the memory chip MC1 illustrated in FIG. 7 and the rear electrodes 3bp of the logic chip LC illustrated in FIG. 10, the force that presses the central portion of the semiconductor chip 3 is relatively larger than a force that presses the peripheral portion of the semiconductor chip 3. As a result, as illustrated in FIG. 11, the central portion of the top surface 2a of the wiring substrate 2 is deformed to sink and the semiconductor chip 3A of the lower stage is deformed in accordance with the deformation of the wiring substrate 2.

Also, as another mode of warpage deformation occurring in the semiconductor chip 3, a mode in which the peripheral portion of the semiconductor chip 3B of the upper stage is bent toward the wiring substrate 2 as illustrated in FIG. 12 may be considered. The mode of the warpage deformation illustrated in FIG. 12 occurs due to a pressing force that presses the semiconductor chip 3B of the upper stage in the process of mounting the semiconductor chip 3B of the upper stage on the semiconductor chip 3A of the lower stage.

In the process of mounting the semiconductor chip 3B of the upper stage, the rear surface 3b of the semiconductor chip 3B is pressed by a bonding jig 31 as illustrated in FIG. 12. At this time, from the viewpoint of preventing the semiconductor chip 3B from being inclined with respect to the rear surface 3b of the semiconductor chip 3A serving as the mounting surface, it is preferable to press the entire rear surface 3b of the semiconductor chip 3B with good balance. Therefore, it is preferable that an area of a pressing surface 31a of the bonding jig 31 is substantially equal to an area of the rear surface 3b of the semiconductor chip 3B or is equal to or larger than the area of the rear surface 3b.

Also, from the viewpoint of dispersing the pressing force with good balance, it is preferable that a member having lower elasticity than that of the bonding jig 31, for example, a resin film 32 is interposed between the pressing surface 31a of the bonding jig 31 and the semiconductor chip 3B. Also, it is preferable that the resin film 32 is interposed between the pressing surface 31a of the bonding jig 31 and the semiconductor chip 3B because it is possible to prevent the adhesive NCL2 from being attached to the bonding jig 31.

However, for example, in the case where the plurality of electrodes of the laminated semiconductor chips 3 are collectively arranged in the central portion when seen in a plan view like the front electrodes 3ap of the memory chip MC1 illustrated in FIG. 7 and the rear electrodes 3bp of the logic chip LC illustrated in FIG. 10, a repulsive force against the pressing force applied from the bonding jig 31 is smaller in the peripheral portion than in the central portion of the semiconductor chip 3B. As a result, in the peripheral portion of the rear surface 3b of the semiconductor chip 3B, the semiconductor chip 3B is likely to be deformed by the pressing force. Thus, the mode of the warpage deformation illustrated in FIG. 12 occurs.

The two modes related to the warpage deformation have been individually described in FIGS. 11 and 12, but the mode illustrated in FIG. 11 and the mode illustrated in FIG. 12 occur in combination in some cases. Also, in the case where the thickness of the semiconductor chip 3 is small like in the present embodiment, the warpage deformation is likely to occur.

When the warpage deformation occurs in the semiconductor chip 3 as described above, the separation distance between the semiconductor chip 3A and the semiconductor chip 3B of the upper stage is reduced in the peripheral portion of the rear surface 3b of the semiconductor chip 3A of the lower stage due to the warpage deformation.

Here, a metal pattern is formed on the front surface 3a of the semiconductor chip 3 in some cases in addition to the front electrode 3ap. Also, a metal pattern is formed on the rear surface 3b of the semiconductor chip 3 in some cases in addition to the rear electrode 3bp.

For example, in the example illustrated in FIG. 7, marks AM1 are respectively formed in four corner portions of the front surface 3a of the memory chip MC1. Also, in the example illustrated in FIG. 8, marks AM2 are respectively formed in four corner portions of the rear surface 3b of the memory chip MC1. Also, in the example illustrated in FIG. 9, marks AM3 are respectively formed in two diagonal portions among the four corner portions of the front surface 3a of the logic chip LC. Also, in the example illustrated in FIG. 10, marks AM4 are respectively formed in two diagonal portions among the four corner portions of the rear surface 3b of the logic chip LC. These marks AM are formed as alignment marks for use in the alignment when the semiconductor chips 3 are laminated, and are patterned metal films.

In the case where the marks AM are used as alignment marks, it is preferable to form two or more marks AM on one surface. In the case where the planar shape of the marks AM is an asymmetric shape other than a line symmetric shape or a point symmetric shape, the alignment can be performed if one mark AM is formed on one surface as a modification example. However, from the viewpoint of improving alignment accuracy, it is preferable that two or more marks AM are formed on one surface.

Also, in order to improve alignment accuracy, it is preferable that a separation distance between a plurality of marks AM is increased. Therefore, it is preferable that the marks AM are arranged in the four corner portions of the front surface 3a and the rear surface 3b of each semiconductor chip 3 as illustrated in FIGS. 7 to 10 because the alignment can be performed with high accuracy.

However, in the case of increasing the separation distance between the plurality of marks AM, the marks AM are arranged in the peripheral portions of the front surface 3a and the rear surface 3b. Thus, in the case where the warpage deformation occurs as illustrated in FIGS. 11 and 12, the mark AM formed in the semiconductor chip 3A of the lower stage (see FIG. 10) may contact the front surface 3a of the semiconductor chip 3B of the upper stage depending on the degree of the warpage deformation.

When the mark AM formed in the semiconductor chip 3A of the lower stage (see FIG. 10) contacts the front, surface 3a of the semiconductor chip 3B of the upper stage, the following problems arise in terms of the reliability of the semiconductor device. First, when the alignment mark AM is pressed to the front surface 3a of the semiconductor chip 3B of the upper stage, the semiconductor chip 3B of the upper stage may be damaged. In particular, when the area of the front surface 3a of the semiconductor chip 3B of the upper stage is larger than the area of the rear surface 3b of the semiconductor chip 3A of the lower stage, the circuit formed in the semiconductor chip 3B may be damaged. For example, when the plurality of memory regions MR are present in the front surface 3a of the memory chip MC1 (specifically, the main surface of the semiconductor substrate) as illustrated in FIG. 7 and the marks AM are pressed to the memory regions MR, a part of the memory circuit may be damaged. Also, when the peripheral portion of the rear surface 3b of the semiconductor chip 3A of the lower stage is pressed to the front surface 3a of the semiconductor chip 3B of the upper stage, the interval in the central portion of the rear surface 3b is increased, so that the connection reliability of the portion electrically connected via the external terminal 7 may be reduced.

Therefore, the inventors of the present application have conducted studies in view of the above problems and found the present embodiment. Namely, as illustrated in FIG. 13, a plurality of rear electrodes 3bp are formed in a region of a central portion (electrode group forming region) 3b1 of the rear surface 3b of the semiconductor chip 3A arranged in the lower stage, that is, the logic chip LC. Also, in the rear surface 3b, the mark AM4 which is the metal pattern is formed in the region 3b2 on the peripheral side relative to the region 3b1. Also, as illustrated in FIG. 14, a protrusion height HT1 of the mark AM4 with respect to the rear surface 3b is smaller than a protrusion height HT2 of the plurality of rear electrodes 3bp with respect to the rear surface 3b. In the example illustrated in FIG. 14, since the rear electrode 3bp and the mark AM4 are formed to protrude on the rear surface 3b, it can be paraphrased as follows. That is, a thickness of the mark AM4 (protrusion height HT1 with respect to the rear surface 3b) is smaller than a thickness of the plurality of rear electrodes 3bp (protrusion height HT2 with respect to the rear surface 3b). Namely, in the present embodiment, the mark AM4 which is the metal pattern arranged in the peripheral portion of the rear surface 3b of the semiconductor chip 3B arranged in the lower stage is formed to be thinner than the rear electrode 3bp.

In the example illustrated in FIG. 14, the warpage deformation occurs in the semiconductor chip 3 as described above with reference to FIGS. 11 and 12. Since the problem caused when the warpage deformation occurs is the same in the cases of the warpage deformation of both modes of FIGS. 11 and 12, the case in which the mode of the warpage deformation illustrated in FIG. 11 occurs is illustrated by way of example in FIG. 14.

When the above-described warpage deformation occurs in the semiconductor chip 3, a distance (separation distance) G1 between the rear surface 3b of the semiconductor chip 3A and the front surface 3a of the semiconductor chip 3B in the outer periphery of the region 3b2 (that is, the periphery of the rear surface 3b) becomes smaller than a distance (separation distance) G2 between the rear surface 3b of the semiconductor chip 3A and the front surface 3a of the semiconductor chip 3B in the region 3b1. Therefore, when the thickness of the mark AM4 formed in the region 3b2 is increased, the probability that the mark AM4 contacts the front surface 3a of the semiconductor chip 3B of the upper stage is increased. Also, in the region 3b2 where the mark AM4 is formed, a distance (separation distance) G3 between the rear surface 3b of the semiconductor chip 3A and the front surface 3a of the semiconductor chip 3B is smaller than a protrusion height HTb of the protrusion electrode 7b with respect to the front surface 3a of the memory chip MC1. In other words, the distance G3 is smaller than the thickness of the protrusion electrode 7b.

Thus, if the protrusion height HT1 of the mark AM4 is smaller than the protrusion height HT2 of the rear electrode 3bp based on the rear surface 3b of the logic chip LC serving as a reference surface as illustrated in FIG. 14, it is possible to prevent the mark AM4 from contacting the semiconductor chip 3B even when the distance G1 is smaller than the distance G2. Then, by preventing the mark AM formed in the semiconductor chip 3A of the lower stage from contacting the front surface 3a of the semiconductor chip 3B of the upper stage, the problem in terms of the reliability of the semiconductor device can be solved.

In other words, according to the present embodiment, by making the protrusion height HT1 of the mark AM4 serving as the alignment mark smaller than the protrusion height HT2 of the plurality of rear electrodes 3bp, the mark AM4 can be formed in the peripheral portion of the rear surface 3b as illustrated in FIG. 13. In the case where the alignment is performed at the time of mounting the semiconductor chip 3, the alignment accuracy, in particular, the alignment accuracy in the θ direction illustrated in FIG. 13 can be improved by increasing the separation distance between the plurality of marks AM4. In the case where the plurality of rear electrodes 3bp are collectively flip-chip connected like in the present embodiment, high-accuracy alignment is required. Namely, according to the present embodiment, since the alignment accuracy can be improved, the electrical connection reliability of each of the plurality of rear electrodes 3bp can be improved. As a result, the reliability of the semiconductor device 1 can be improved.

Also, from the viewpoint of suppressing the mark AM4 from contacting the semiconductor chip 3B of the upper stage (see FIG. 14), it is preferable to reduce the number of marks AM4. In the example illustrated in FIG. 13, the marks AM4 are respectively formed in a corner portion 3bc1 and a corner portion 3bc2 located at a diagonal position of the corner portion 3bc1 among the four corner portions included in the rear surface 3b of the semiconductor chip 3A. On the other hand, the mark AM4 is not formed in a corner portion 3bc3 and a corner portion 3bc4 arranged at positions other than the diagonal position of the corner portion 3bc1. Therefore, the semiconductor chip 3B of the upper stage does not contact the mark AM4 in the corner portion 3bc3 and the corner portion 3bc4. Note that the corner portions 3bc1, 3bc2, 3bc3 and 3bc4 of the rear surface 3b are in-plane regions of the rear surface 3b that are located near intersection points (corners) of the respective sides constituting the outer periphery of the rear surface 3b.

When the protrusion height HT1 of the mark AM4 is smaller than the protrusion height HT2 of the rear electrode 3bp, it is possible to prevent the contact between the mark AM4 illustrated in FIG. 14 and the semiconductor chip 3B, but it is particularly preferable that the protrusion height HT1 is made equal to or smaller than the half of the protrusion height HT2 of the rear electrode 3bp. Also, as a modification example of FIG. 14, the configuration in which the mark AM4 is formed in the semiconductor substrate of the semiconductor chip 3A and is exposed from the semiconductor substrate in the rear surface 3b of the semiconductor chip 3A as illustrated in FIG. 15 is also possible. In this case, the mark AM4 does not protrude from the rear surface of the semiconductor chip 3A. Namely, the protrusion height HT1 of the mark AM4 with respect to the rear surface 3b can be reduced to the extent regarded as "zero" (however, the protrusion height HT1 does not have to be strictly equal to the height of the rear surface 3b). In this case, even when the mark AM4 is formed, it is possible to prevent the contact between the mark AM4 and the semiconductor chip 3B.

The protrusion height HT1 of the mark AM4 can be controlled by, for example, devising a process of forming the rear electrode 3bp and the mark AM4. There are various embodiments for the method of forming the mark AM4, and details of the embodiments will be described later when the manufacturing method is described, <Manufacturing Method of Semiconductor Device>

Figure 16:
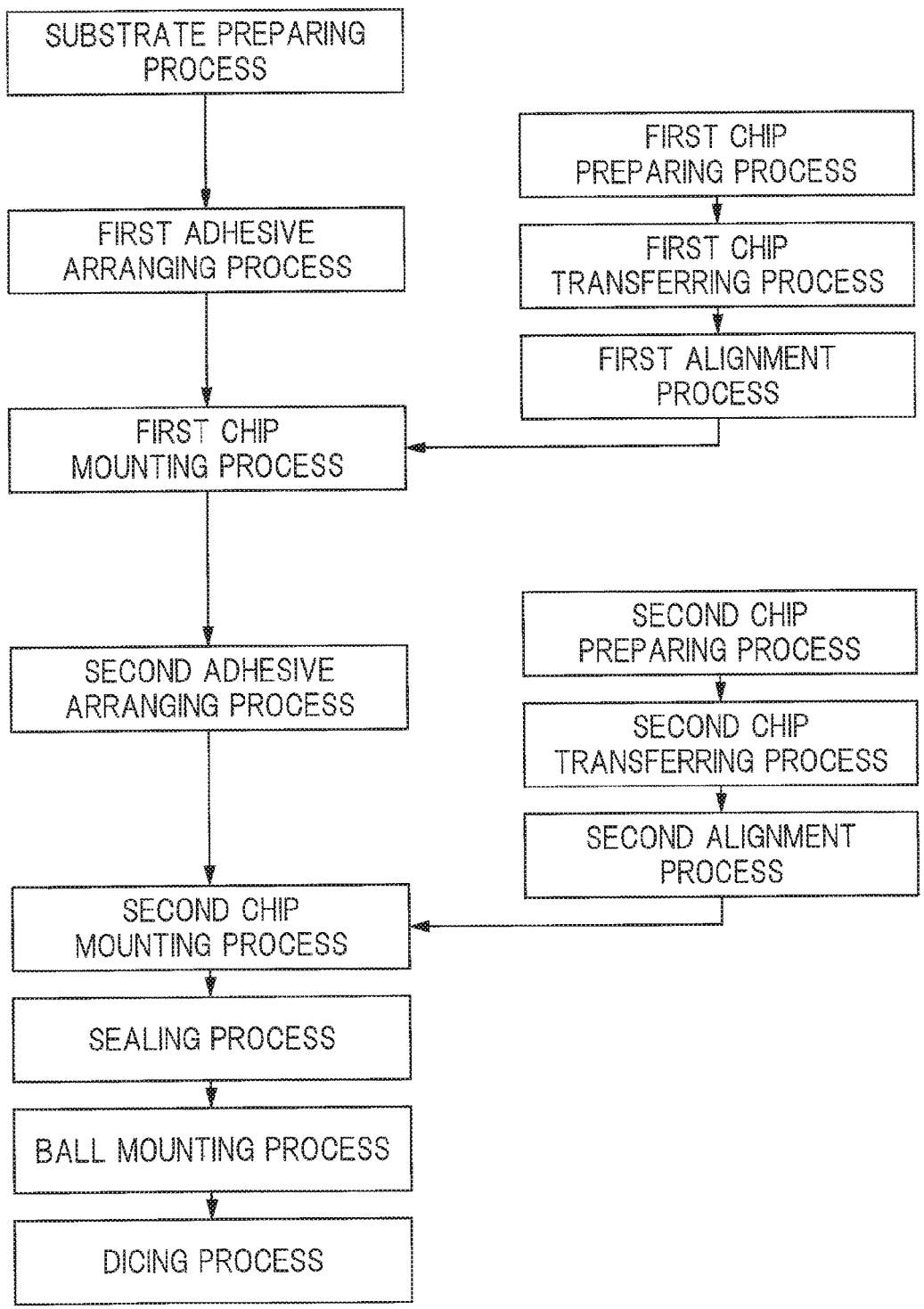
FIG. 16 is an explanatory diagram illustrating an overview of a manufacturing process of the semiconductor device described with reference to FIGS. 1 to 14.

Next, a manufacturing process of the semiconductor device 1 described above with reference to FIGS. 1 to 14 will be described. The semiconductor device 1 is manufactured along a flow illustrated in FIG. 16. FIG. 16 is an explanatory diagram illustrating an overview of a manufacturing process of the semiconductor device described above with reference to FIGS. 1 to 14. Details of each process will be described below.

<Substrate Preparing Process>

Figure 17:
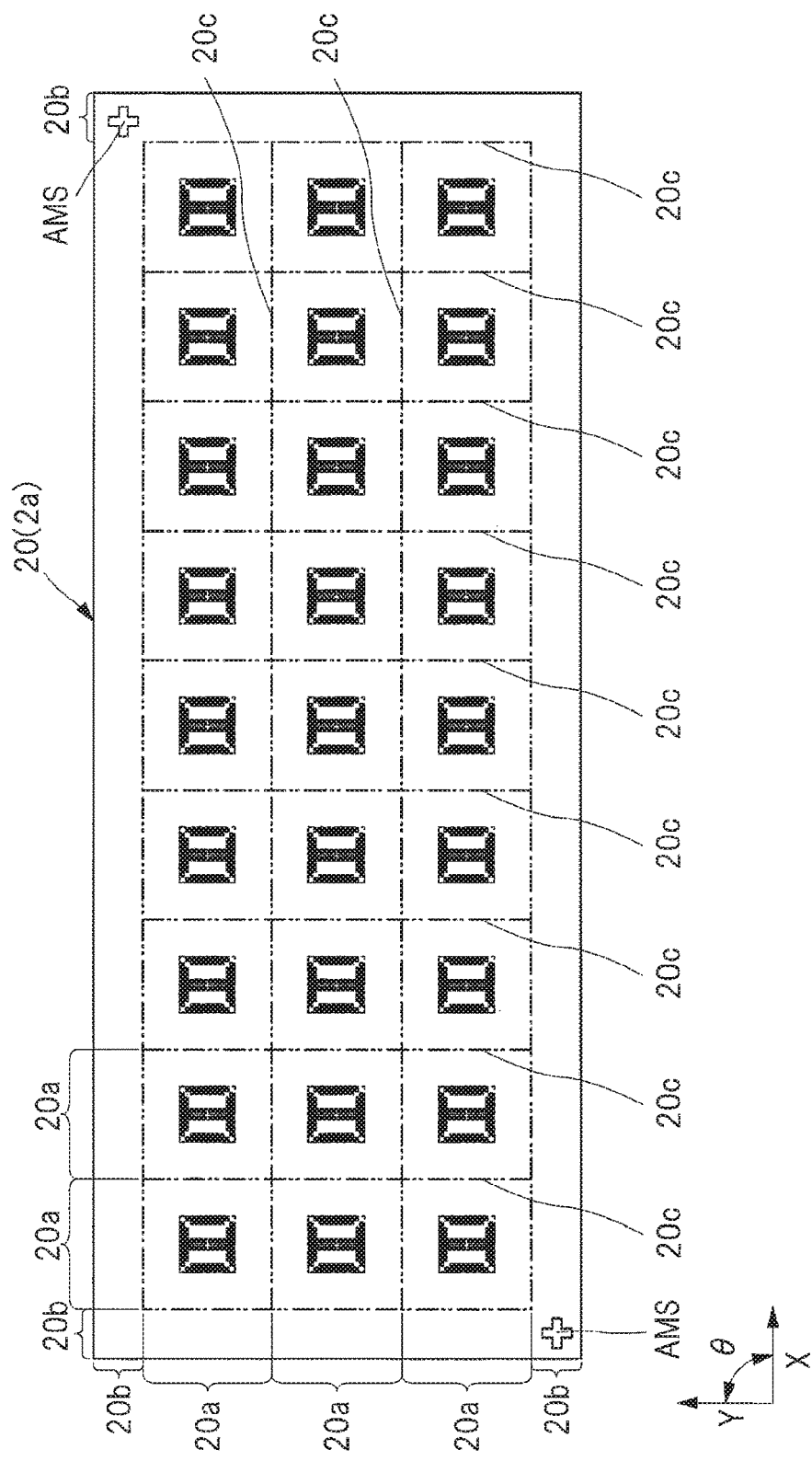
FIG. 17 is a plan view illustrating an entire configuration of a wiring substrate prepared in a substrate preparing process illustrated in FIG. 16.
Figure 18:
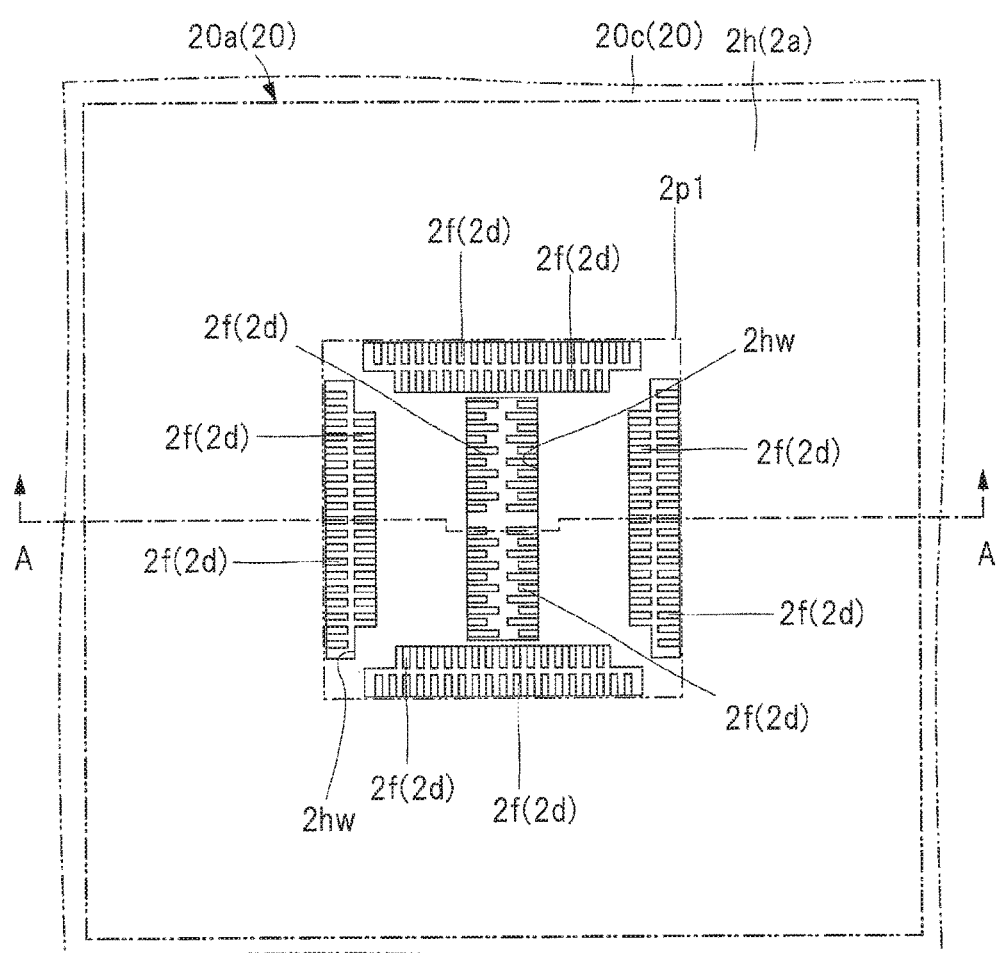
FIG. 18 is an enlarged plan view of one device region illustrated in FIG. 17.
Figure 19:
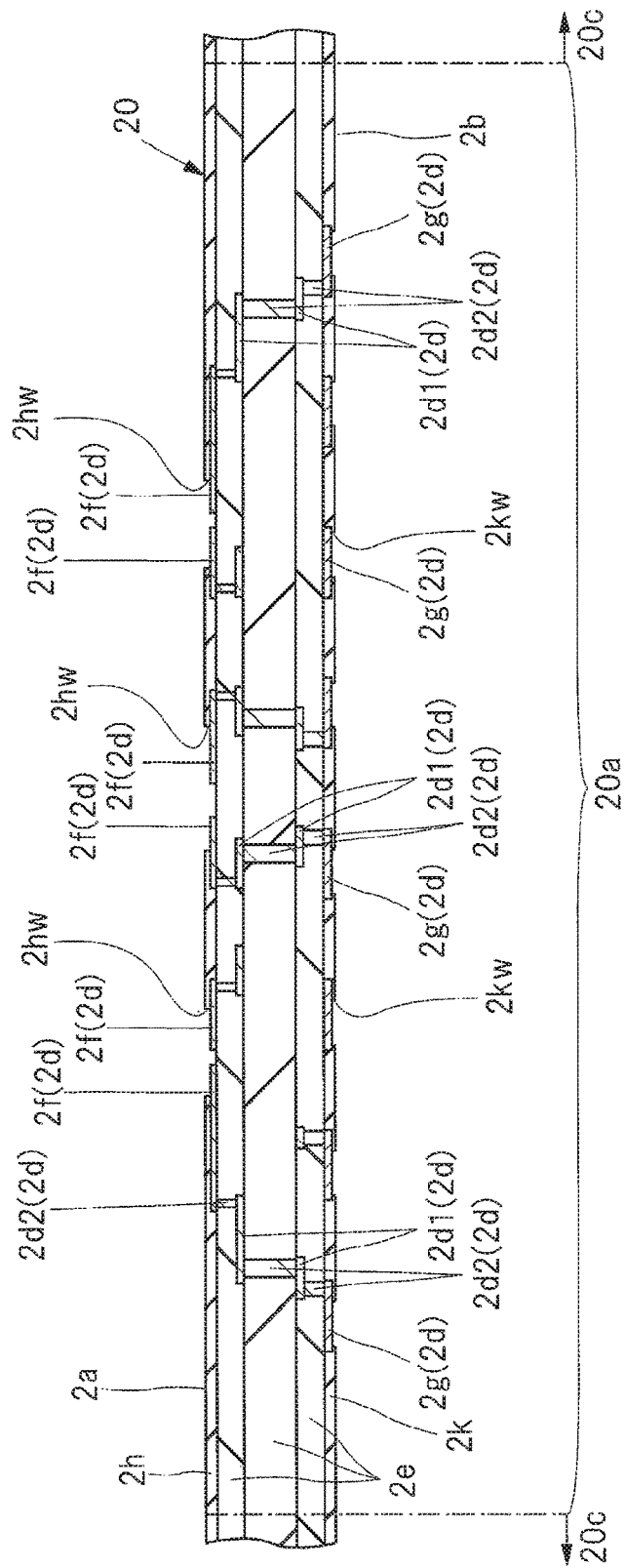
FIG. 19 is an enlarged sectional view taken along a line A-A of FIG. 18.
Figure 20:
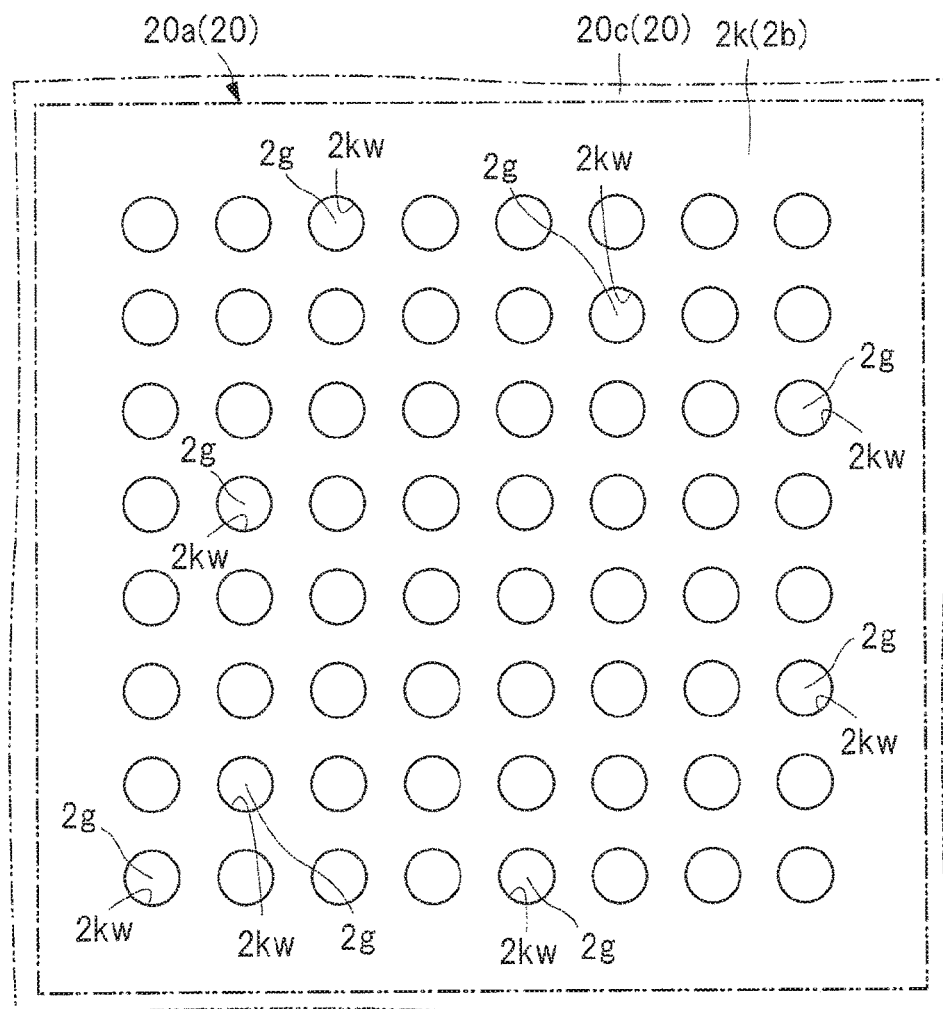
FIG. 20 is an enlarged plan view illustrating a surface on an opposite side of FIG. 18.

First, in a substrate preparing process illustrated in FIG. 16, a wiring substrate 20 illustrated in FIGS. 17 to 21 is prepared. FIG. 17 is a plan view illustrating an entire configuration of the wiring substrate prepared in the substrate preparing process illustrated in FIG. 16. Also, FIG. 18 is an enlarged plan view of one device region illustrated in FIG. 17. Also, FIG. 19 is an enlarged sectional view taken along a line A-A of FIG. 18. Also, FIG. 20 is an enlarged plan view illustrating a surface of an opposite side of FIG. 18. Note that the number of terminals illustrated in FIGS. 17 to 20 is small for ease of viewing, but the number of terminals (bonding leads 2f, lands 2g) is not limited to the embodiment illustrated in FIGS. 17 to 20.

As illustrated in FIG. 17, the wiring substrate 20 prepared in this process includes a plurality of device regions 20a on an inner side of a frame portion (outer frame) 20b. Specifically, the plurality of device regions 20a (27 devices regions in FIG. 17) are arranged in a matrix form. Each of the plurality of device regions 20a corresponds to the wiring substrate 2 illustrated in FIGS. 1 to 4. The wiring substrate 20 is a so-called multi-piece substrate that includes the plurality of device regions 20a and dicing lines (dicing regions) 20c between the respective device regions 20a. By using the multi-piece substrate including the plurality of device regions 20a as described above, the manufacturing efficiency can be improved.

Also, the constituent members of the wiring substrate 2 described above with reference to FIG. 4 are respectively formed in the device regions 20a as illustrated in FIGS. 18 and 19. The wiring substrate 20 includes a top surface 2a, a bottom surface 2b opposite to the top surface 2a and a plurality of wiring layers (four layers in the example illustrated in FIG. 4) that electrically connect the top surface 2a to the bottom surface 2b. In each wiring layer, a plurality of wirings 2d and insulating layers 2e to insulate the plurality of wirings 2d from one another and insulate adjacent wiring layers from one another are formed. Also, the wiring 2d includes a wiring 2d1 formed on the top surface or the bottom surface of the insulating layer 2e and a via wiring 2d2 that is an interlayer conducting path formed to pass through the insulating layer 2e in a thickness direction.

Also, as illustrated in FIG. 18, the top surface 2a of the wiring substrate 20 includes a chip mounting region (chip mounting portion) 2p1 which is a scheduled region where the logic chip LC illustrated in FIG. 9 is to be mounted in a first chip mounting process illustrated in FIG. 16. The chip mounting region 2p1 is present in a central portion of the device region 20a on the top surface 2a. In FIG. 18, in order to indicate the positions of the chip mounting region 2p1, the device region 20a and the dicing line 20c, the contours of the chip mounting region 2p1, the device region 20a and the dicing line 20c are indicated by two-dot chain lines. However, since the chip mounting region 2p1 is the scheduled region where the logic chip LC is to be mounted as described above, actually visible boundaries need not be present. Also, regarding the device region 20a and the dicing line 20c, actually visible boundaries need not be present.

Also, a plurality of bonding leads (terminals, chip mounting surface terminals, electrodes) 2f are formed on the top surface 2a of the wiring substrate 20. The bonding leads 2f are terminals that are electrically connected to the plurality of front electrodes 3ap formed on the front surface 3a of the logic chip LC illustrated in FIG. 9 in the first chip mounting process illustrated in FIG. 16. In the present embodiment, since the logic chip LC is mounted in a so-called facedown mounting method in which the front surface 3a of the logic chip LC faces the top surface 2a of the wiring substrate 20, bonding portions of the plurality of bonding leads 2f are formed inside the chip mounting region 2p1.

Also, the top surface 2a of the wiring substrate 20 is covered with an insulating film (solder resist film) 2h. An opening 2hw is formed in the insulating film 2h, and at least a part of the plurality of bonding leads 2f (a bonding portion bonded to the semiconductor chip, a bonding region) is exposed from the insulating film 2h in the opening 2hw.

However, in addition to the embodiment illustrated in FIG. 18, there are various modification examples for the shape of the opening 2hw. For example, it is possible to form the opening 2hw having a small opening area to selectively expose the bonding portions of the plurality of bonding leads 2f. In addition, it is also possible to form an opening 2hw that collectively exposes the plurality of bonding lead groups by connecting the plurality of openings 2hw illustrated in FIG. 18.

Also, as illustrated in FIG. 20, a plurality of lands 2g are formed on the bottom surface 2b of the wiring substrate 20. The bottom surface 2b of the wiring substrate 20 is covered with an insulating film (solder resist film) 2k. An opening 2kw is formed in the insulating film 2k, and at least a part of the plurality of lands 2q (a bonding portion bonded to the solder ball 5) is exposed from the insulating film 2k in the opening 2kw.

Also, as illustrated in FIG. 19, the plurality of bonding leads 2f and the plurality of lands 2g are electrically connected to each other via the plurality of wirings 2d. These conductive patterns such as the plurality of wirings 2d, the plurality of bonding leads 2f and the plurality of lands 2g are made of, for example, a metal material containing copper (Cu) as a main component. Also, a solder film is formed in a part of the plurality of bonding leads 2f arranged in the opening 2hw and exposed from the insulating film 2h. By forming the solder film in a part of the bonding lead 2f (a portion connecting the external terminal 7 illustrated in FIG. 9), the external terminal 7 and the bonding lead 2f can be easily connected to each other in the first chip mounting process illustrated in FIG. 16.

The plurality of wirings 2d, the plurality of bonding leads 2f and the plurality of lands 2g illustrated in FIG. 19 can be formed by, for example, electrolytic plating. Also, the solder film formed in a part of the plurality of bonding leads 2f can be formed by, for example, electrolytic plating. Also, as illustrated in FIG. 19, the wiring substrate 20 including the four or more wiring layers (four layers in FIG. 14) can be formed by a so-called build-up process in which wiring layers are sequentially laminated on both surfaces of an insulating layer serving as a core material.

Also, as illustrated in FIG. 17, alignment marks AMS are formed on the top surface 2a of the wiring substrate 20. The alignment marks AMS are patterns to be detected in a first alignment process illustrated in FIG. 16, and are made of, for example, the same metal material as the wiring 2d and the bonding lead 2f illustrated in FIG. 19. In the example illustrated in FIG. 17, the alignment marks AMS are formed in the frame portion 20b of the multi-piece wiring substrate 20 including the plurality of device regions 20a. However, the alignment marks AMS can be formed in the respective device regions 20a as a modification example.

Also, though details will be described below, the positions of the alignment marks AMS are detected by using an image sensor such as a camera in the first alignment process illustrated in FIG. 16. Therefore, it is preferable that the alignment marks AMS are exposed from the insulating film 2h (see FIG. 18). Also, it is preferable that the alignment marks AMS are formed of metal patterns because reflection efficiency of light is improved. However, alignment is possible when the contour shapes of the alignment marks AMS can be recognized. Therefore, for example, when the insulating film 2h is made of a material having visible light transparency, the alignment marks AMS may be covered with the insulating film 2h.

Also, it is preferable that the alignment marks AMS are formed at a plurality of positions of the top surface 2a as illustrated in FIG. 17. Even when there is only one alignment mark AMS, an X-coordinate position and a Y-coordinate position of the alignment mark AMS can be specified in a coordinate surface along the top surface 2a. However, by forming the alignment marks AMS at two or more positions, a θ-direction position of the device region 20a can be specified, and thus, the position detection accuracy can be improved.

Also, from the viewpoint of improving accuracy of specifying the θ-direction position, it is preferable to increase the separation distance between two alignment marks AMS. Therefore, it is particularly preferable that one alignment mark AMS is arranged in one corner portion of the top surface 2a of the wiring substrate 20 and the other alignment mark AMS is arranged in a corner portion of the top surface 2a located at a diagonal position of the one corner portion as illustrated in FIG. 17. In other words, it is preferable that the two alignment marks AMS are arranged on one diagonal line of the top surface 2a of the wiring substrate 20.

For example, the alignment marks AMS can be collectively formed when the plurality of bonding leads 2f and the plurality of wirings 2d are formed.

<First Adhesive Arranging Process>

Figure 21:
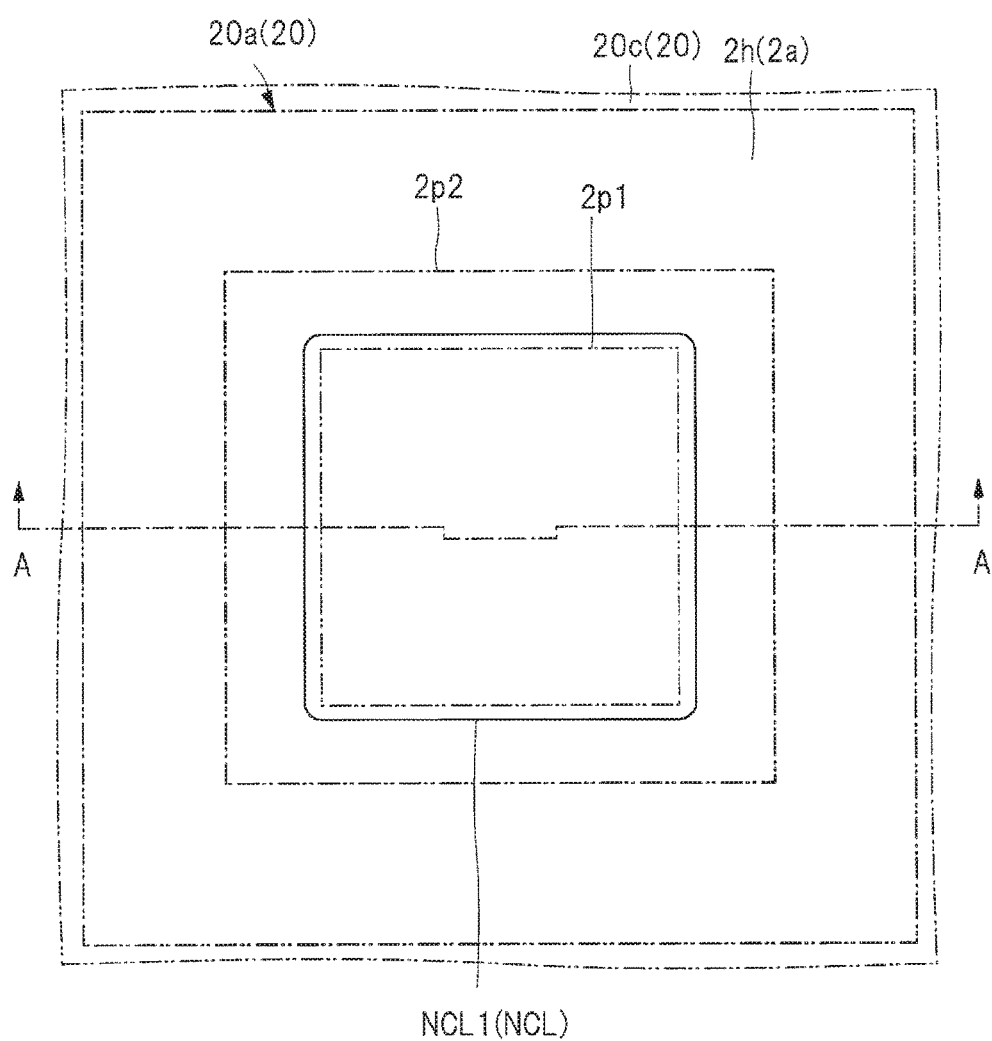
FIG. 21 is an enlarged plan view illustrating a state in which an adhesive is arranged in a chip mounting region illustrated in FIG. 18.
Figure 22:
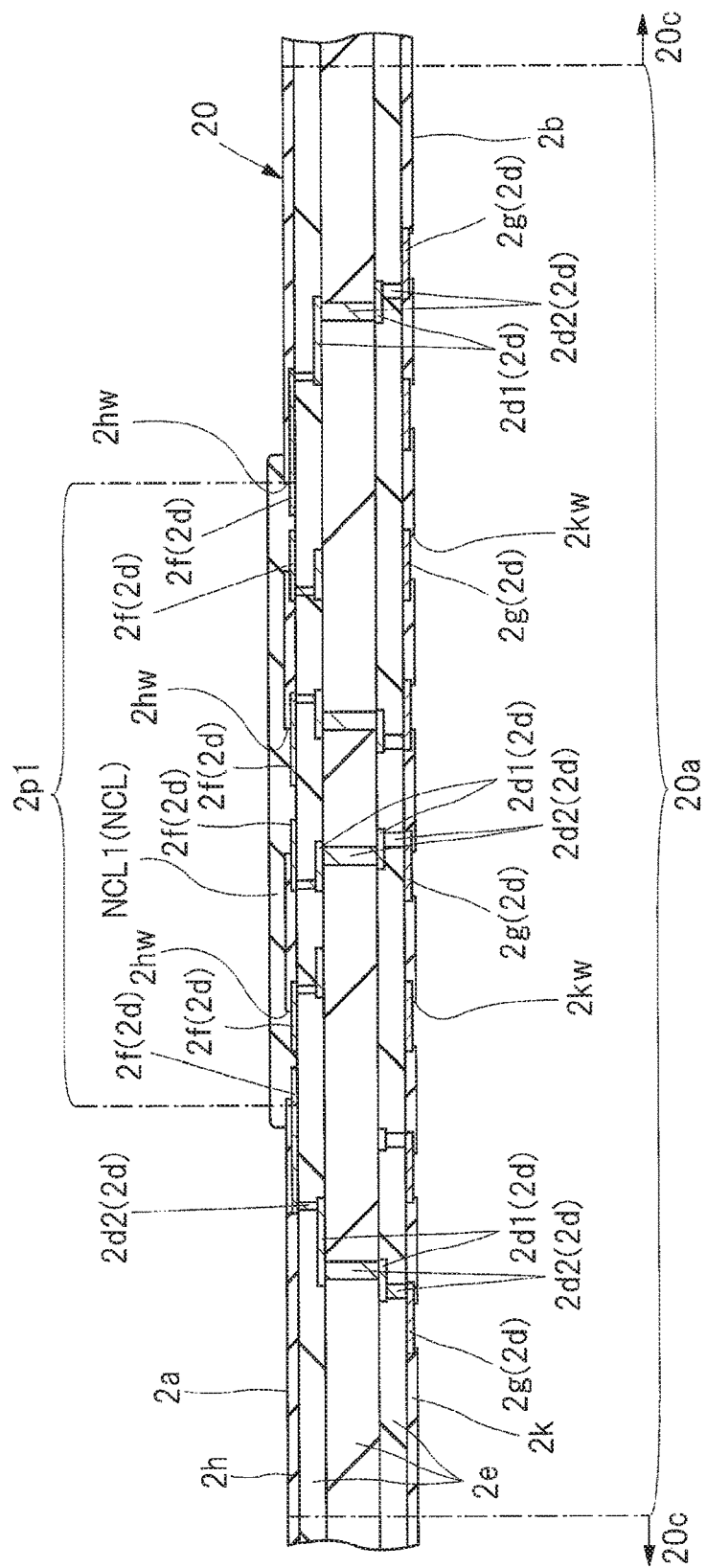
FIG. 22 is an enlarged sectional view taken along a line A-A of FIG. 21.

Next, in a first adhesive arranging process illustrated in FIG. 16, an adhesive NCL1 is arranged on the chip mounting region 2p1 of the top surface 2a of the wiring substrate 20 as illustrated in FIGS. 21 and 22. FIG. 21 is an enlarged plan view illustrating a state in which the adhesive is arranged in the chip mounting region illustrated in FIG. 18, and FIG. 22 is an enlarged sectional view taken along a line A-A of FIG. 21. In FIG. 21, in order to indicate the positions of the chip mounting regions 2p1 and 2p2, the device region 20a and the dicing line 20c, the contours of the chip mounting regions 2p1 and 2p2, the device region 20a and the dicing line 20c are indicated by two-dot chain lines. However, since the chip mounting regions 2p1 and 2p2 are the scheduled regions where the logic chip LC and the laminated body MCS are to be mounted, actually visible boundaries need not be present. Also, regarding the device region 20a and the dicing line 20c, actually visible boundaries need not be present. Hereinafter, when the chip mounting regions 2p1 and 2p2, the device region 20a and the dicing line 20c are illustrated in a plan view, actually visible boundaries similarly need not be present.

In general, in the case where the semiconductor chip is mounted on the wiring substrate by a facedown mounting method (flip-chip connection method), a method (post-injection method) in which a connection portion is sealed with resin after electrically connecting the semiconductor chip to the wiring substrate is employed. In this case, resin is supplied from a nozzle disposed near a gap between the semiconductor chip and the wiring substrate, and the resin is embedded into the gap by using a capillary phenomenon.

On the other hand, in the example described in the present embodiment, the logic chip LC is mounted through a method (pre-coating method) in which the adhesive NCL1 is arranged in the chip mounting region 2p1 before the logic chip LC (see FIG. 9) is mounted on the wiring substrate 20 in the first chip mounting process to be described below and then the logic chip LC is electrically connect to the wiring substrate 20 by pressing the logic chip LC from above the adhesive NCL1.

In the case of the above-described post-injection method, since the resin is embedded into the gap by using the capillary phenomenon, a processing time for one device region 20a (time for injecting the resin) is increased. On the other hand, in the case of the above-described pre-coating method, the adhesive NCL1 is already embedded between the wiring substrate 20 and the logic chip LC at the time when the tip of the logic chip LC (for example, the solder material 7a formed at the tip of the protrusion electrode 7b illustrated in FIG. 6) contacts the bonding portion of the bonding lead 2f. Therefore, as compared to the above-described post-injection method, the pre-coating method is more preferable in that the processing time for one device region 20a can be reduced and the manufacturing efficiency can be improved.

However, as a modification example of the present embodiment, the post-injection method can be applied by changing the order of the first chip mounting process and the first adhesive arranging process illustrated in FIG. 16. For example, in the case where the number of product forming regions to be collectively formed is small, the difference in the processing time is reduced, and thus, the reduction of the manufacturing efficiency can be suppressed even in the case of using the post-injection method.

Also, the adhesive NCL1 is made of a resin material whose hardness (degree of hardness) becomes higher (is increased) by adding energy, and the adhesive NCL1 contains thermosetting resin or the like in the present embodiment. Also, the adhesive NCL1 before curing is softer than the external terminal 7 illustrated in FIG. 6 and can be deformed by pressing the logic chip LC.

Also, the adhesive NCL1 before curing is roughly classified into the following two types based on a difference in handling methods. One is made of a paste-like resin (insulating material paste) called NCP (Non-Conductive Paste), and this is applied from a nozzle (not illustrated) to the chip mounting region 2p1. The other is made of a resin shaped in a film form in advance (insulating material film) called NCF (Non-Conductive Film), and this is conveyed to the chip mounting region 2p1 in a film state and attached thereto. In the case of using the insulating material paste (NCP), the attaching process is unnecessary unlike the insulating material film (NCF), and it is thus possible to reduce a stress applied to the semiconductor chip and the like as compared to the case of using the insulating material film. On the other hand, in the case of using the insulating material film (NCF), the shape retention is higher than the insulating material paste (NCP), and it is thus easy to control the arrangement range and the thickness of the adhesive NCL1.

FIGS. 21 and 22 illustrate an example in which the adhesive NCL1 which is the insulating material film (NCF) is arranged on the chip mounting region 2p1 and is attached to come into close contact with the top surface 2a of the wiring substrate 20. However, although not illustrated, the insulating material paste (NCP) can be used as a modification example.

<First Chip Preparing Process>

Figure 23:
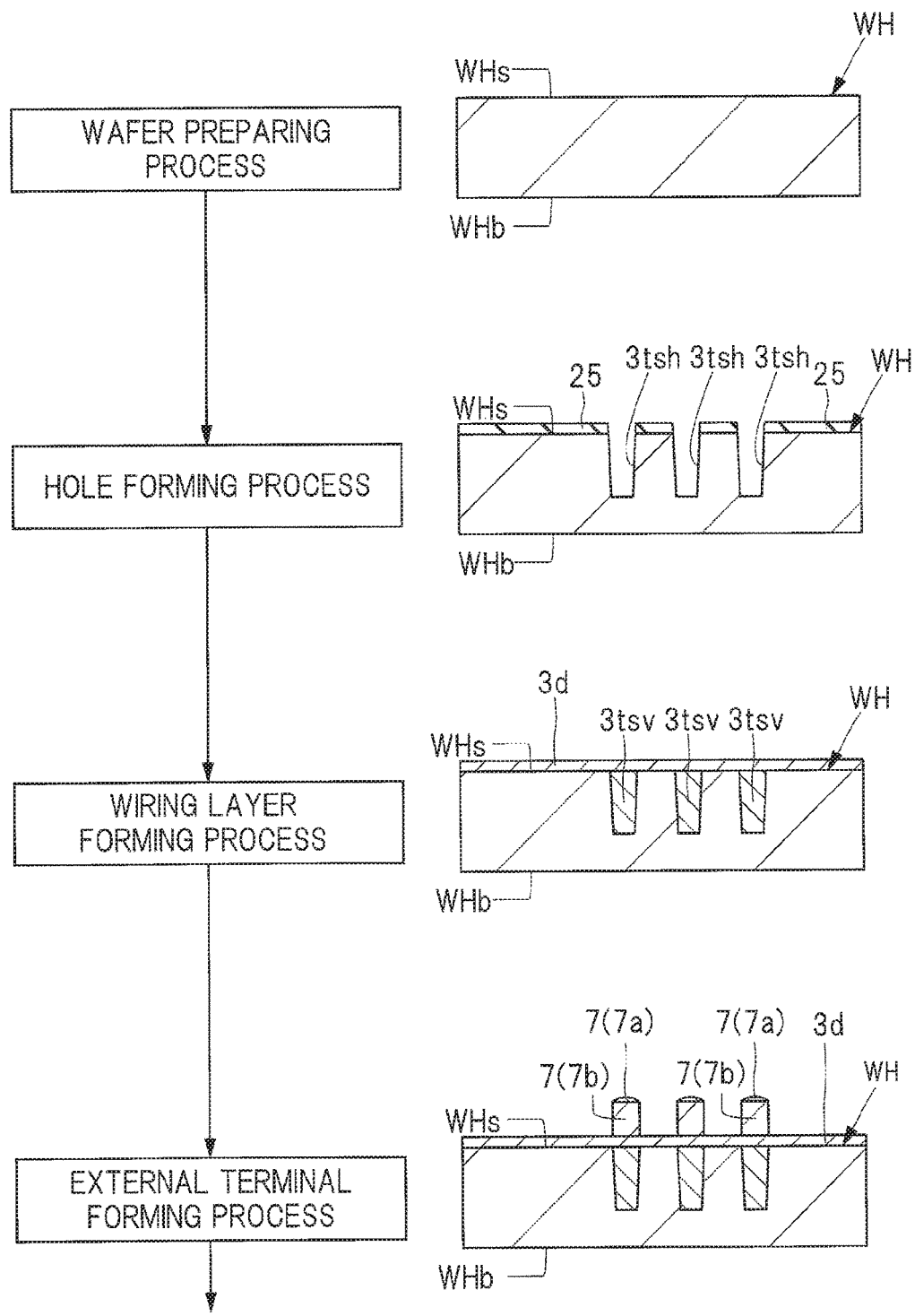
FIG. 23 is an explanatory diagram schematically illustrating an overview of a manufacturing process of a semiconductor chip including a through electrode illustrated in FIG. 6.
Figure 24:
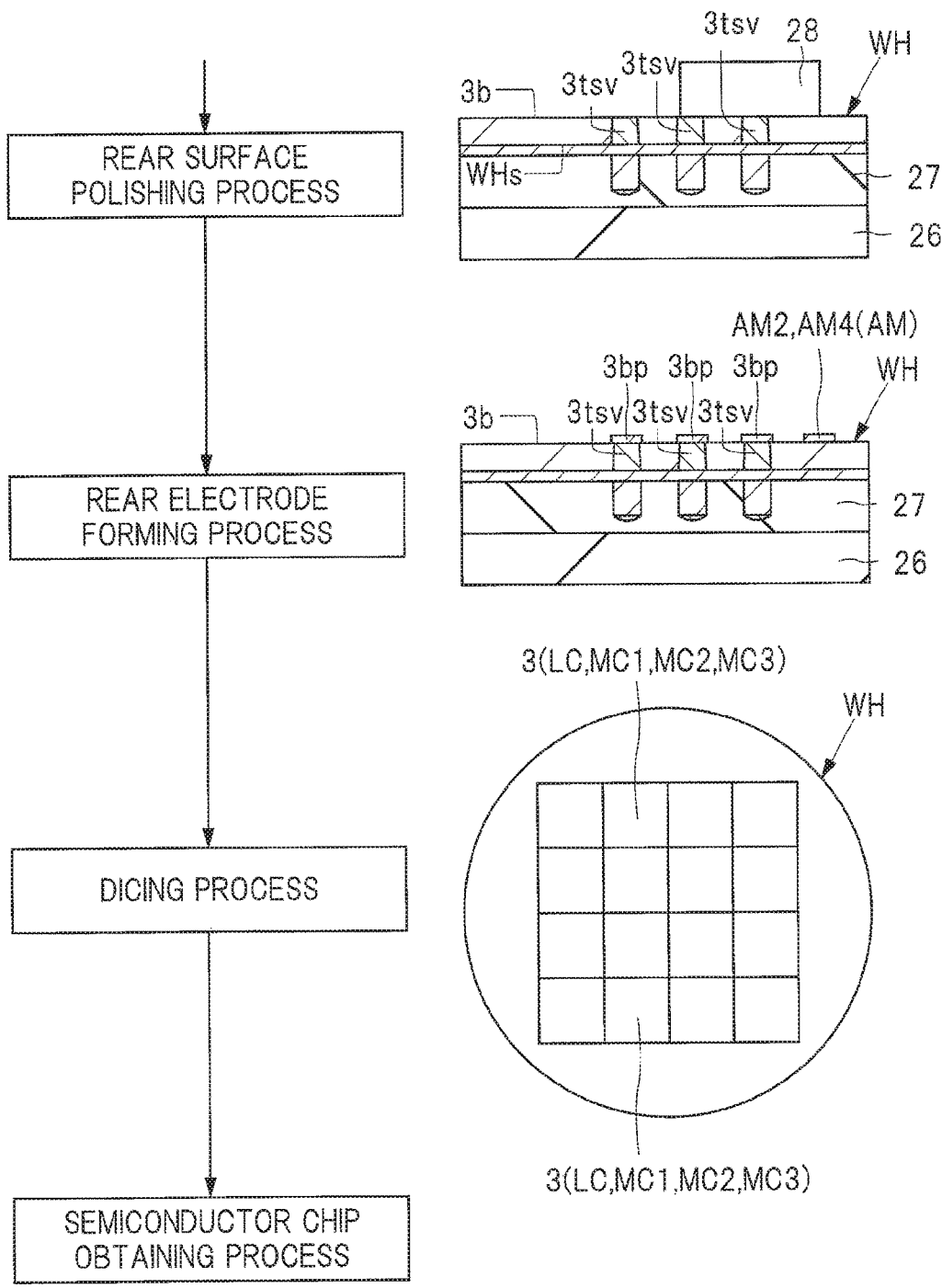
FIG. 24 is an explanatory diagram schematically illustrating the overview of the manufacturing process of the semiconductor chip continued from FIG. 23.

Also, in the first chip preparing process illustrated in FIG. 16, the logic chip LC illustrated in FIGS. 9 to 10 is prepared. FIG. 23 is an explanatory diagram schematically illustrating an overview of a manufacturing process of a semiconductor chip including the through electrode illustrated in FIG. 6. Also, FIG. 24 is an explanatory diagram schematically illustrating an overview of the manufacturing process of the semiconductor chip continued from FIG. 23. In FIGS. 23 and 24, the manufacturing method of the through electrodes 3tsv and the rear electrodes 3bp electrically connected to the through electrodes 3tsv will be mainly described, and the illustrations and descriptions regarding a process of forming various circuits other than the through electrodes 3tsv will be omitted. Also, the manufacturing method of the semiconductor chip illustrated in FIGS. 23 and 24 can be applied to a manufacturing method of the memory chips MC1, MC2 and MC3 as well as the logic chip LC illustrated in FIG. 4.

First, as a wafer preparing process, a semiconductor substrate (wafer) WH illustrated in FIG. 23 is prepared. The semiconductor substrate WH is a semiconductor substrate made of, for example, silicon (Si) and forms a circle shape when seen in a plan view. The semiconductor substrate WH includes a front surface (main surface, top surface) WHs serving as a semiconductor element forming surface and a rear surface (main surface, bottom surface) WHb opposite to the front surface WHs. Also, a thickness of the semiconductor substrate WH is larger than a thickness of the logic chip LC and the memory chips MC1, MC2 and MC3 illustrated in FIG. 4 and is, for example, about several hundreds of μm.

Subsequently, as a hole forming process, holes (bores, openings) 3tsh for forming the through electrodes 3tsv illustrated in FIG. 6 are formed. In the example illustrated in FIG. 23, a mask. 25 is disposed on the front surface WHs of the semiconductor substrate WH and an etching process is performed to form the holes 3tsh. Note that the semiconductor elements of the logic chip LC and the memory chips MC1, MC2 and MC3 illustrated in FIG. 4 can be formed, for example, after the present process and before a next wiring layer forming process.

Subsequently, through electrodes 3tsv are formed by embedding a metal material such as copper (Cu) into the holes 3tsh. Subsequently, as a wiring layer forming process, a wiring layer (chip wiring layer) 3d is formed on the front surface WHs of the semiconductor substrate WH. In the present process, a plurality of front electrodes 3ap illustrated in FIGS. 7 and 9 are formed, and the plurality of through electrodes 3tsv and the plurality of front electrodes 3ap are electrically connected to each other. The front electrodes 3ap and the uppermost wiring layer 3d integrally formed with the front electrodes 3ap are formed of, for example, a metal film made of aluminum (Al).

Also, in the present process, the semiconductor elements of the logic chip LC and the memory chips MC1, MC2 and MC3 illustrated in FIG. 4 and the plurality of front electrodes 3ap illustrated in FIGS. 7 and 9 are electrically connected to each other via the wiring layer 3d. Accordingly, the semiconductor elements of the logic chip LC and the memory chips MC1, MC2 and MC3 are electrically connected to each other via the wiring layer 3d.

Also, in the present process, marks AM1 illustrated in FIG. 7 or marks AM3 illustrated in FIG. 9 are formed. Since the marks AM1 and AM3 can be made of the same material (for example, aluminum) as the front electrodes 3ap and the uppermost wiring layer 3d, the marks AM1 and AM3 can be collectively formed when the front electrodes 3ap are formed.

Subsequently, as an external terminal forming process, external terminals 7 are formed on the front electrodes 3ap (see FIGS. 7 and 9). In the present process, as illustrated in FIG. 6, protrusion electrodes 7b are formed on the front electrodes 3ap of the logic chip LC. Solder materials 7a are formed on the tips of the protrusion electrodes 7b. Alternatively, the solder materials 7a are formed on the front electrodes 3*ap* of the memory chip MC1. The solder material 7*a* functions as an adhesive when the semiconductor chip 3 illustrated in. FIG. 6 is mounted on the wiring substrate 2 or the underlying semiconductor chip 3.

Subsequently, as a rear surface polishing process illustrated in FIG. 24, a rear surface WHb (see FIG. 23) of the semiconductor substrate WH is polished to reduce the thickness of the semiconductor substrate WH. Accordingly, the rear surface 3*b* of the semiconductor chip 3 illustrated in FIG. 6 is exposed. In other words, the through electrodes 3*tsv* pass through the semiconductor substrate WH in the thickness direction. Also, the plurality of through electrodes 3*tsv* are exposed from the semiconductor substrate WH in the rear surface 3*b* of the semiconductor substrate tag. In the example illustrated in FIG. 24, in the rear surface polishing process, the semiconductor substrate WH is polished by using a polishing jig 28 in a state of being supported by a support base 26 such as a glass plate or a protective layer 27 that protects the external terminals 7 protecting the front surface WHs.

Subsequently, in a rear electrode forming process, a plurality of rear electrodes 3*bp* are formed on the rear surface 3*b* and are electrically connected to the plurality of through electrodes 3*tsv*.

Also, in the present process, marks AM2 illustrated in FIG. 8 and marks AM4 illustrated in FIG. 10 are formed. Since the marks AM2 and the marks AM4 can be made of the same material (for example, copper) as the rear electrodes 3*bp*, the marks AM2 and the marks AM4 can be collectively formed when the rear electrodes 3*bp* are formed.

Subsequently, as a dicing process, the semiconductor substrate WH is divided along dicing lines to obtain a plurality of semiconductor chips 3. Thereafter, an inspection is performed if necessary, and the semiconductor chips 3 (the logic chip LC and the memory chips MC1, MC2 and MC3) illustrated in FIG. 4 are obtained.

<Mark Forming Method (1)>

Figure 25:
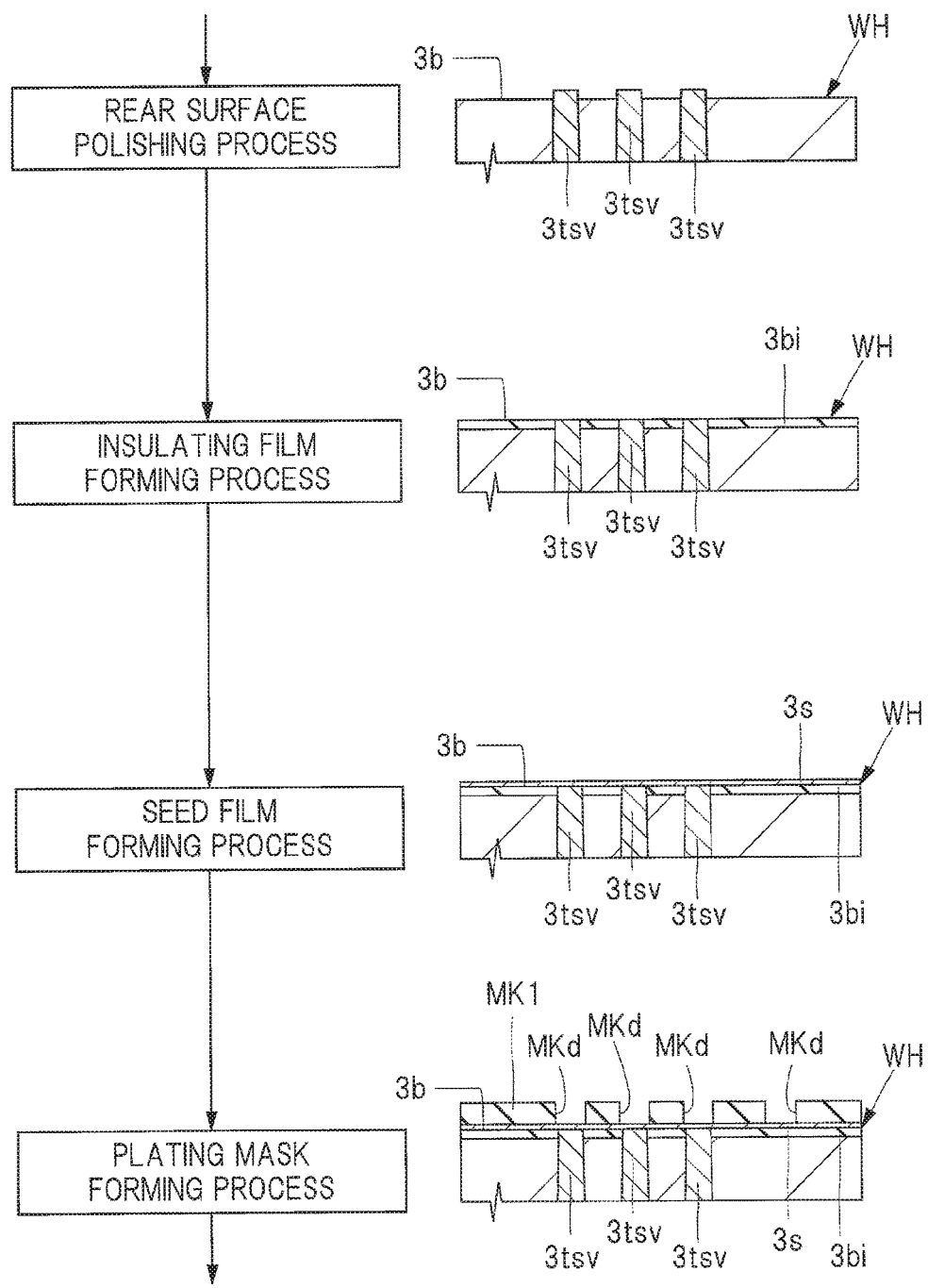
FIG. 25 is an explanatory diagram illustrating a process of collectively forming a plurality of rear electrodes and an alignment mark in the rear electrode forming process illustrated in FIG. 24.
Figure 26:
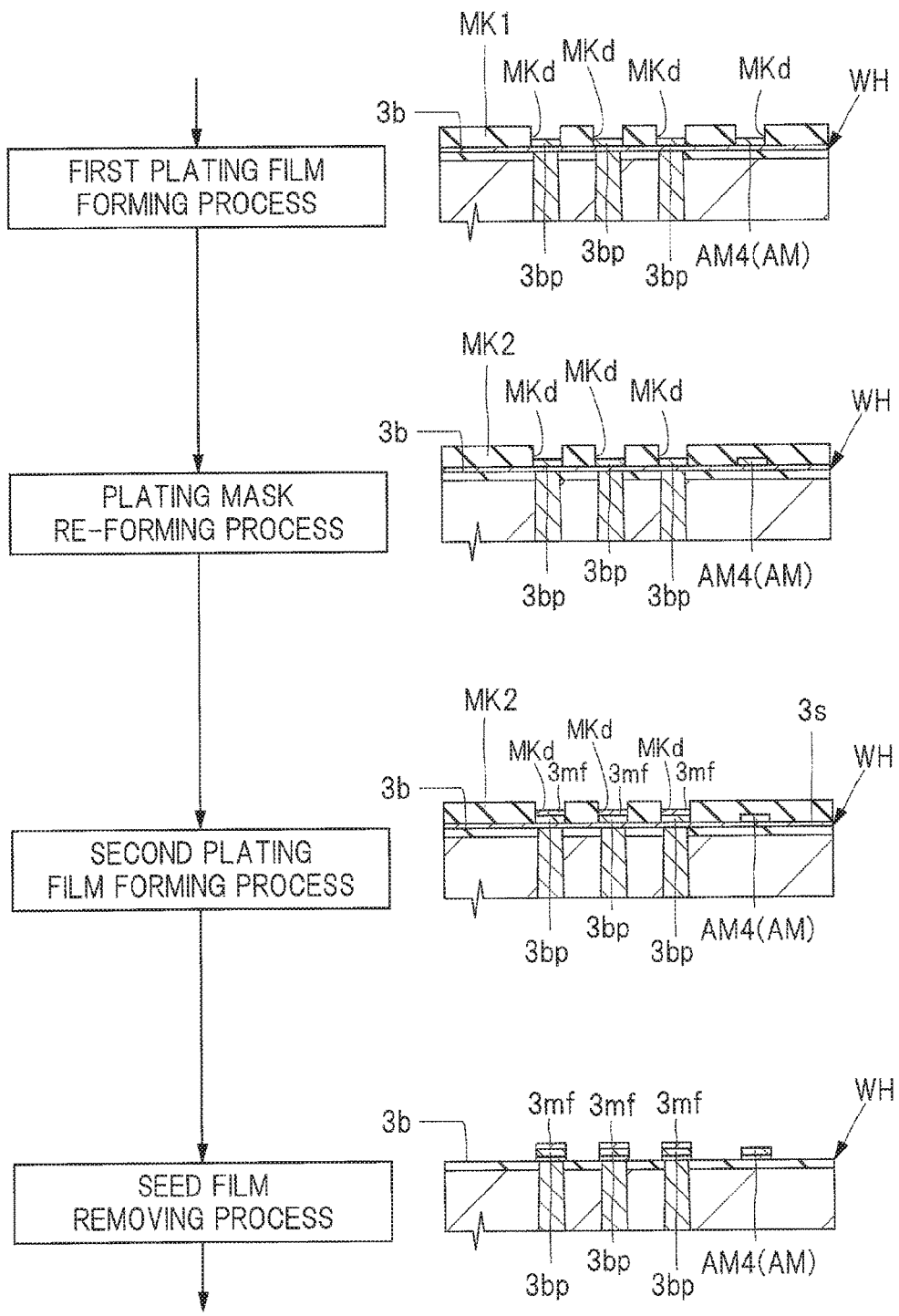
FIG. 26 is an explanatory diagram illustrating a process of collectively forming a plurality of rear electrodes and an alignment mark in the rear electrode forming process illustrated in FIG. 24.

Next, a method of collectively forming the rear electrodes 3*bp* and the alignment marks in the rear electrode forming process illustrated in FIG. 24 will be described. Since the marks AM2 illustrated in FIG. 8 and the marks AM4 illustrated in FIG. 10 can be formed by a similar method, the method of forming the marks AM4 illustrated in FIG. 10 will be described as a representative example. FIGS. 25 and 26 are explanatory diagrams illustrating the process of collectively forming the plurality of rear electrodes and the alignment marks in the rear electrode forming process illustrated in FIG. 24.

First, in the case where a chemical mechanical polishing method (CMP method) is applied in the rear surface polishing process illustrated in FIG. 24, the through electrodes 3*tsv* slightly protrude from the rear surface 3*b* of the semiconductor substrate WH as illustrated in FIG. 25 due to a difference of an etching rate (selection ratio) with respect to the constituent material of the semiconductor substrate WH and the constituent material of the through electrode 3*tsv*.

Subsequently, in an insulating film forming process illustrated in FIG. 25, an insulating film 3*bi* is formed to cover the rear surface of the semiconductor substrate WH, and then, the insulating film 3*bi* is polished to planarize the rear surface 3*b* and expose the through electrodes 3*tsv* from the rear surface 3*b*.

Subsequently, in a seed film forming process illustrated in FIG. 25, a seed film 3*s* to be a seed layer (underlying conductive layer) for performing electrolytic plating in a plating film forming process illustrated in FIG. 26 is formed. The seed film 3*s* is formed to cover the exposed surfaces of the insulating film 3*bi* and the through electrodes 3*tsv* by, for example, a sputtering method. Examples of the constituent material of the seed film 3*s* may include copper (Cu).

Subsequently, in a plating mask forming process illustrated in FIG. 25, a mask MK1 serving as a plating mask to be used in a first plating film forming process illustrated in FIG. 26 is formed. In the mask MK1, a plurality of openings MKd are formed at the positions where plating films are to be formed in the first plating film forming process illustrated in FIG. 26, and the underlying seed film 3*s* of the mask MK1 is exposed in the openings MKd. Here, in the present embodiment, in the plating mask forming process, the openings MKd are formed at the positions where the alignment marks are to be formed in addition to the positions where the rear electrodes 3*bp* illustrated in FIG. 26 are to be formed.

Subsequently, in the first plating film forming process illustrated in FIG. 26, the rear electrodes 3*bp* and the marks AM4 which are metal films such as copper films are formed by the plating method. In the present process, the plating process is performed by, for example, the electrolytic plating method, so that the plating film can be selectively formed in each of the plurality of openings MKd of the mask MK1.

Subsequently, in a plating mask re-forming process, the mask MK1 is removed, and then, a mask MK2 is formed to cover the rear surface 3*b*. The mask MK2 is a plating mask used in a second plating film forming process illustrated in FIG. 26, and openings MKd are formed at the positions where the plurality of rear electrodes 3*bp* are formed.

Here, the top surfaces of the plurality of rear electrodes 3*bp* are exposed from the mask MK2 in the openings MKd. On the other hand, the opening MKd is not formed at the position where the mark AM4 is formed, and the mark AM4 is covered with the mask MK2.

Subsequently, in the second plating film forming process, as illustrated in FIG. 26, metal foils 3*mf* are formed to cover the top surfaces of the rear electrodes 3*bp* by the plating method. The metal foil 3*mf* is a metal member for improving connectivity of the solder material 7*a* and the rear electrode 3*bp* illustrated in FIG. 6, and is, for example, a laminated film in which a nickel (Ni) film and a gold (Au) film are sequentially laminated from a lower layer. By forming a gold film on the top surface of the rear electrode 3*bp* containing copper as a main component, oxidation of the bonding surface of the rear electrode 3*bp* can be prevented and connectivity with the solder material 7*a* can be improved.

Also, in the present embodiment, when the second plating film forming process is performed, the mark AM4 is covered with the mask MK2. Therefore, the metal foil 3*mf* is not formed on the top surface of the mark AM4. As a result, a thickness of the mark AM4 can be made smaller than a thickness of the rear electrode 3*bp*.

Subsequently, in a seed film removing process, the mask MK2 is removed, and then, portions of the seed film 3*s* other than the portions where the rear electrodes 3*bp* and the mark AM4 are formed are removed by, for example, the etching method.

Through the process above, the mark AM4 whose thickness is smaller than the rear electrode 3*bp* by the thickness of the metal foil 3*mf* can be formed. Note that the marks AM2 illustrated in FIG. 8 can be formed in the same method as the mark AM4. However, since the semiconductor chip 3 having the same planar size is laminated on the upper layers of the memory chips MC1, MC2 and MC3 where the marks AM2 are formed, the laminated state of the memory chips MC1, MC2 and MC3 is different from that of the logic chip LC. Therefore, in the case where a probability that the marks AM2 contact the semiconductor chip 3 of the upper layer is low, the marks AM2 may be formed by the same forming method as the rear electrodes 3bp. In this case, the thickness of the mark AM2 is equal to the thickness of the rear electrode 3bp.

<Mark Forming Method (2)>

Figure 27:
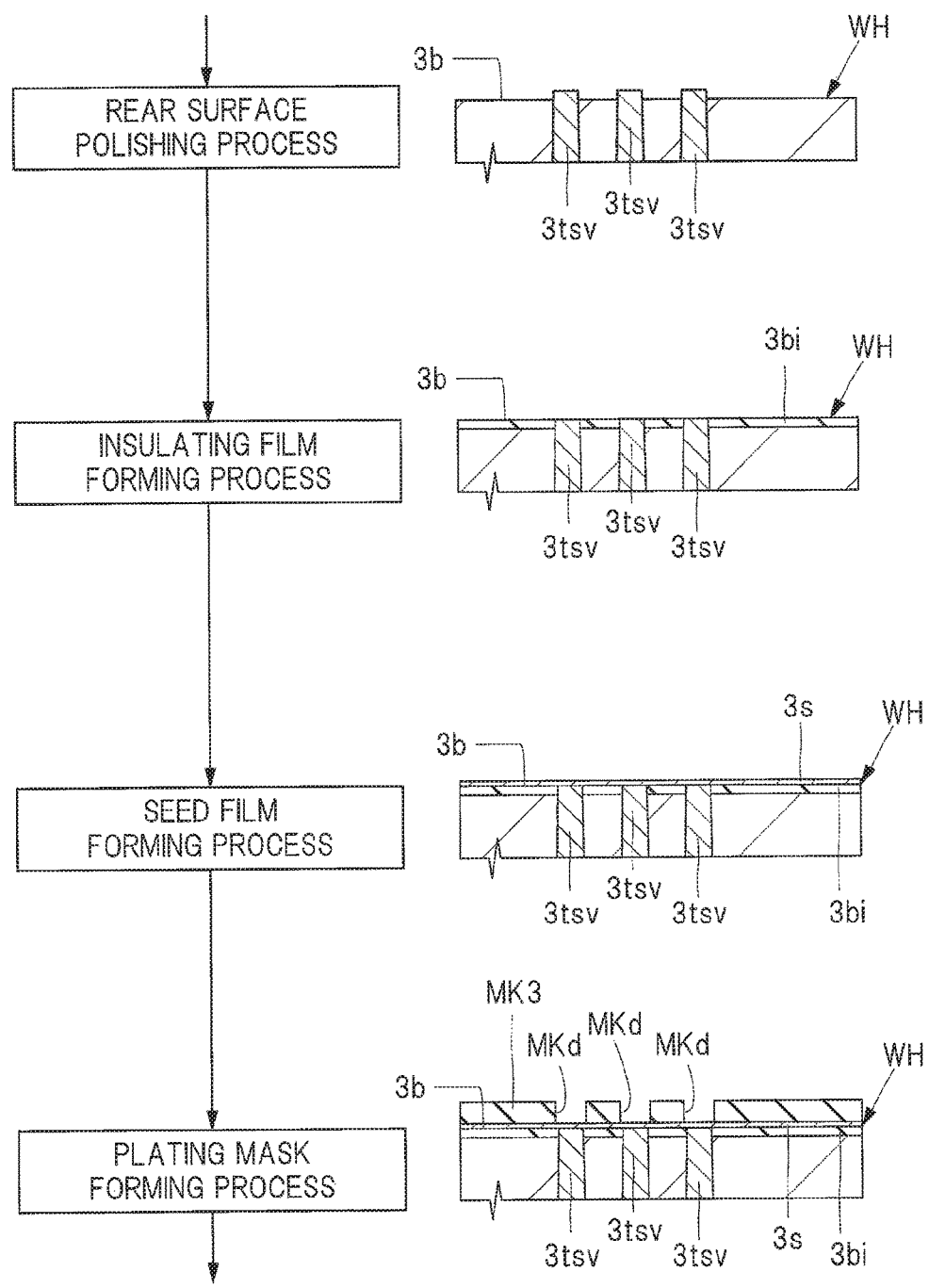
FIG. 27 is an explanatory diagram illustrating a modification example of the method of forming the rear electrodes and the alignment mark described with reference to FIG. 25.
Figure 28:
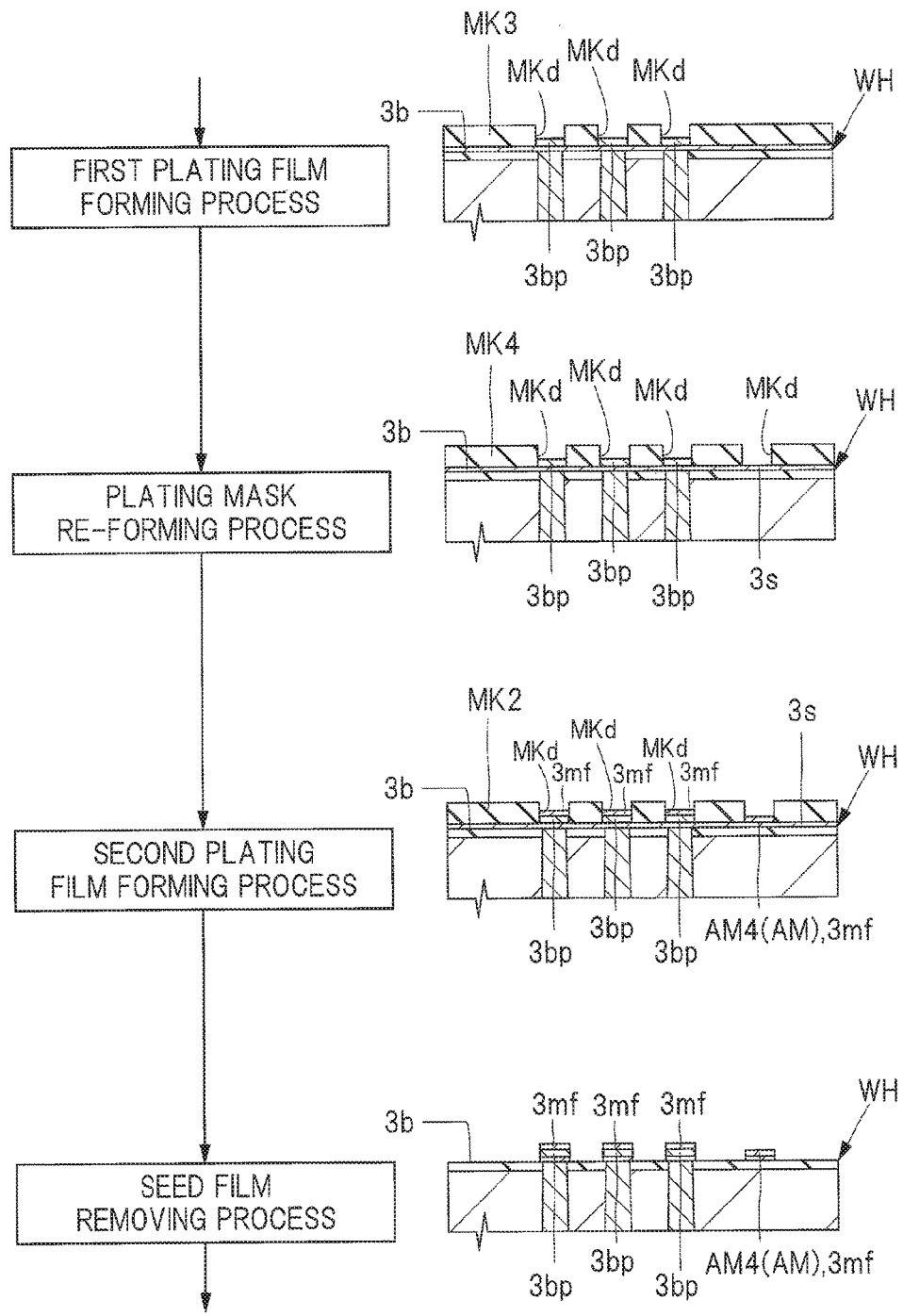
FIG. 28 is an explanatory diagram illustrating a modification example of the method of forming the rear electrodes and the alignment mark described with reference to FIG. 26.

Next, another method of collectively forming the rear electrodes 3bp and the alignment marks in the rear electrode forming process illustrated in FIG. 24 will be described. FIGS. 27 and 28 are explanatory diagrams illustrating a modification example of the method of forming the rear electrodes and the alignment marks described above with reference to FIGS. 25 and 26. Since the present section is a modification example of the method described above with reference to FIGS. 25 and 26, the differences from the processes described above will be mainly described and redundant descriptions will be omitted in principle.

First, since a rear surface polishing process, an insulating film forming process and a seed film forming process illustrated in FIG. 27 are the same as the method described above with reference to FIG. 25, redundant descriptions thereof will be omitted. In the present modification example, a mask MK3 formed in a plating mask forming process is different from the method illustrated in FIG. 25.

In the plating mask forming process illustrated in FIG. 27, the mask MK3 serving as a plating mask to be used in a first plating film forming process illustrated in FIG. 28 is formed. In the mask MK3, a plurality of openings MKd are formed at positions where plating films are to be formed in the first plating film forming process illustrated in FIG. 28, and the underlying seed film 3s of the mask MK1 is exposed in the openings MKd. Here, in the present modification example, in the plating mask forming process, the openings MKd are formed at the positions where the rear electrodes 3bp illustrated in FIG. 27 are to be formed, but the opening MKd is not formed at the positions where the alignment marks are to be formed.

Subsequently, in a first plating film forming process illustrated in FIG. 28, the rear electrodes 3bp which are metal films such as copper films are formed by a plating method. At this time, since the position where the mark AM4 is to be formed is covered with the mask MK3, the mark AM4 is not formed.

Subsequently, in a plating mask re-forming process, the mask MK1 is removed, and then, a mask MK4 is formed to cover the rear surface 3b. The mask MK4 is a plating mask used in a second plating film forming process illustrated in FIG. 26, and openings MKd are formed at the positions where the plurality of rear electrodes 3bp are formed and the positions where the marks AM4 are formed.

Here, the top surfaces of the plurality of rear electrodes 3bp are exposed from the mask MK2 in the openings MKd. Since the openings MKd are formed also at the positions where the masks AM4 are to be formed, the seed film 3s is exposed in the openings MKd.

Subsequently, in a second plating film forming process, as illustrated in FIG. 28, metal foils 3mf are famed by a plating method. At this time, since the seed film 3s is exposed at the positions where the marks AM4 are to be formed, the marks AM4 made of the metal foils 3mf can be formed by forming a metal film by using, for example, the electrolytic plating method.

Subsequently, in a seed film removing process illustrated in FIG. 28, the mask MK4 is removed, and then, portions of the seed film 3s other than the portions where the rear electrodes 3bp and the marks AM4 are formed are removed by, for example, the etching method in the same manner as described above.

Through the above processes, the marks AM4 made of the metal foils 3mf can be formed. The metal foils 3mf are less likely to be oxidized than copper films. Therefore, since light reflectivity of the exposed surface of the mark AM4 is hardly changed, the detection accuracy can be improved in the case where the position of the mark AM4 is optically detected in the second alignment process illustrated in FIG. 16.

Also, the metal foil 3mf is formed to have the thickness smaller than the copper film that is a main film of the rear electrode 3bp (a film constituting a main component). Therefore, according to the present modification example, it is possible to further reduce the thickness of the mark AM4 than the method described above with reference to FIGS. 25 and 26. For example, the thickness of the mark AM4 formed by the present modification example can be made to be equal to or smaller than half the thickness of the rear electrode 3bp.

<Mark Forming Method (3)>

Figure 29:
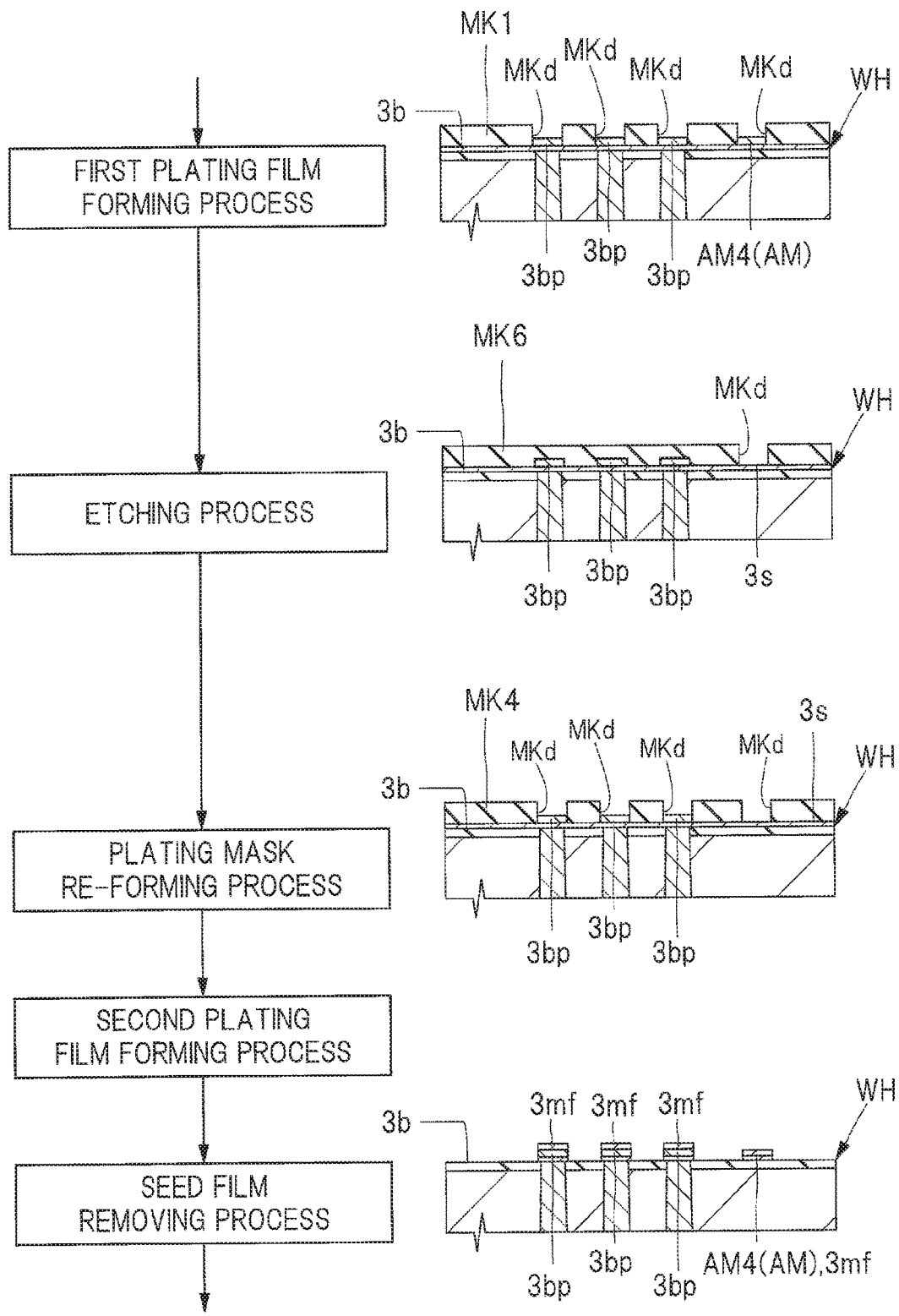
FIG. 29 is an explanatory diagram illustrating another modification example of the method of forming the rear electrodes and the alignment mark described with reference to FIGS. 25 and 26.

Next, another method of collectively forming the rear electrodes 3bp and the alignment marks in the rear electrode forming process illustrated in FIG. 24 will be described. FIG. 29 is an explanatory diagram illustrating another modification example of the method of forming the rear electrodes and the alignment marks described with reference to FIGS. 25 and 26. Since the present section is a modification example of the method described above with reference to FIGS. 25 and 26, the differences from the processes described above will be mainly described and redundant descriptions will be omitted in principle. Also, since the present modification example is the same as each process illustrated in FIG. 25, the illustrations and descriptions thereof will be omitted, and processes subsequent to a first plating film forming process illustrated in FIG. 29 will be described.

The first plating film forming process illustrated in FIG. 29 is the same as the first plating film forming process illustrated in FIG. 26. The modification example illustrated in FIG. 29 is different from the method illustrated in FIG. 26 in that an etching process is included between the first plating film forming process and the plating mask re-forming process.

In the etching process illustrated in FIG. 29, after the mask MK1 is removed, a mask (etching mask) MK5 in which openings MKd exposing the marks AM4 are formed at the positions where the marks AM4 are formed is formed so as to cover the rear surface 3b of the semiconductor substrate WH. The mask MK5 is formed to cover the plurality of rear electrodes 3bp, and the rear electrodes 3bp are not exposed. Therefore, when the etching process is performed in this state, the marks AM4 can be selectively removed.

Subsequently, in the plating mask re-forming process, after the mask MK1 is removed, a mask MK4 is formed to cover the rear surface 3b. The mask MK4 is a plating mask used in a second plating film forming process illustrated in FIG. 26, and openings MKd are formed at the positions where the plurality of rear electrodes 3bp are formed and the positions where the marks AM4 are formed.

Here, the top surfaces of the plurality of rear electrodes 3bp are exposed from the mask MK2 in the openings MKd. Since the openings MKd are also formed at the positions where the masks AM4 are formed, the seed film 3s is exposed in the openings MKd.

Hereinafter, since a second plating film forming process and a seed film removing process are the same as the method described above with reference to FIG. 28, redundant descriptions thereof will be omitted. In the case of the present modification example, when compared with the example described above with reference to FIGS. 27 and 28, the number of processes is increased, but the marks AM4 made of the metal foils 3*mf* can be formed.

Also, when a part of the seed film 3*s* exposed in the opening MKd is removed in the etching process, the thickness of the mark AM4 can be further reduced compared to the example illustrated in FIGS. 27 and 28.

<Mark Forming Method (4)>

Figure 30:
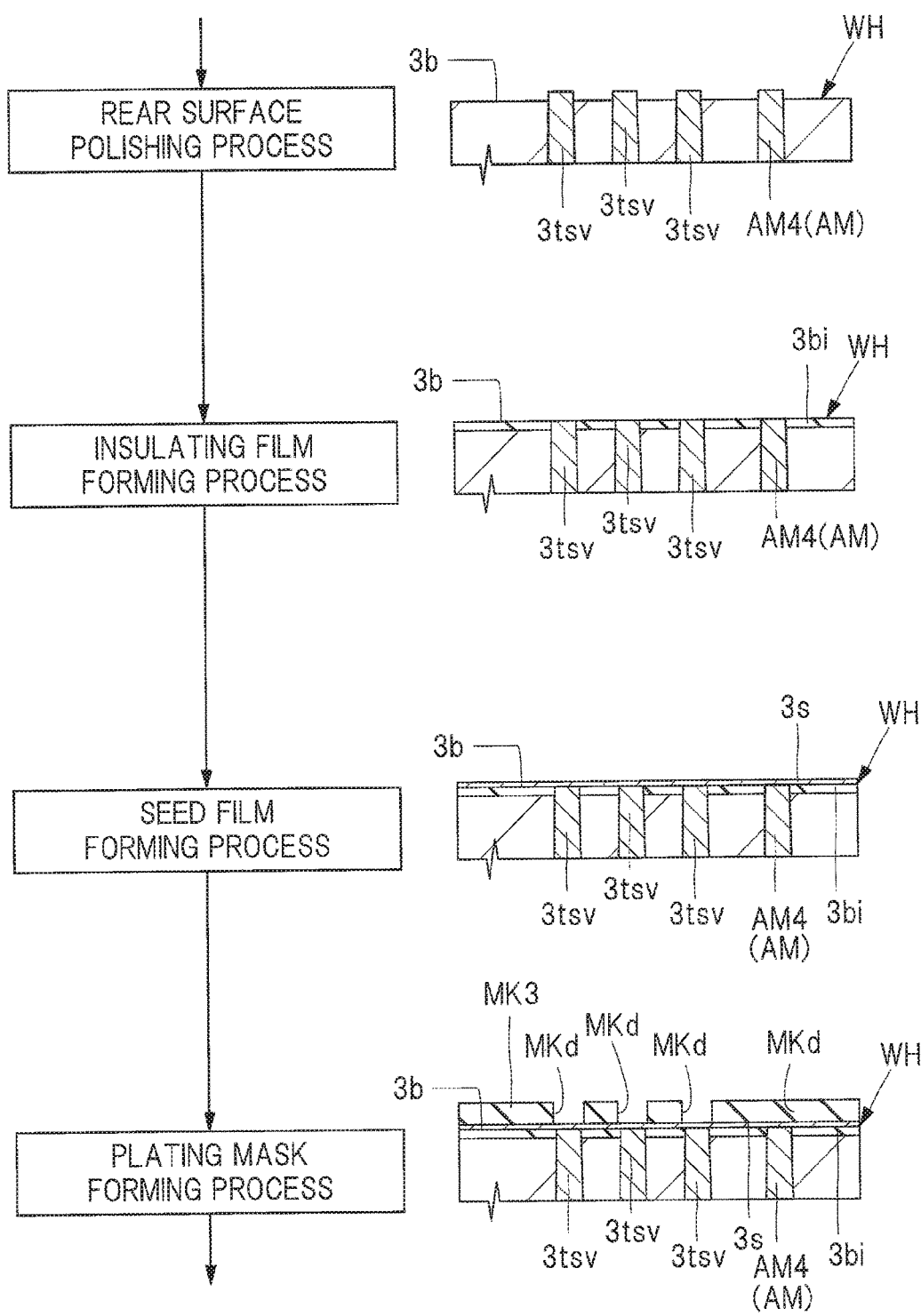
FIG. 30 is an explanatory diagram illustrating another modification example of the method of forming the rear electrodes and the alignment mark described with reference to FIG. 25.
Figure 31:
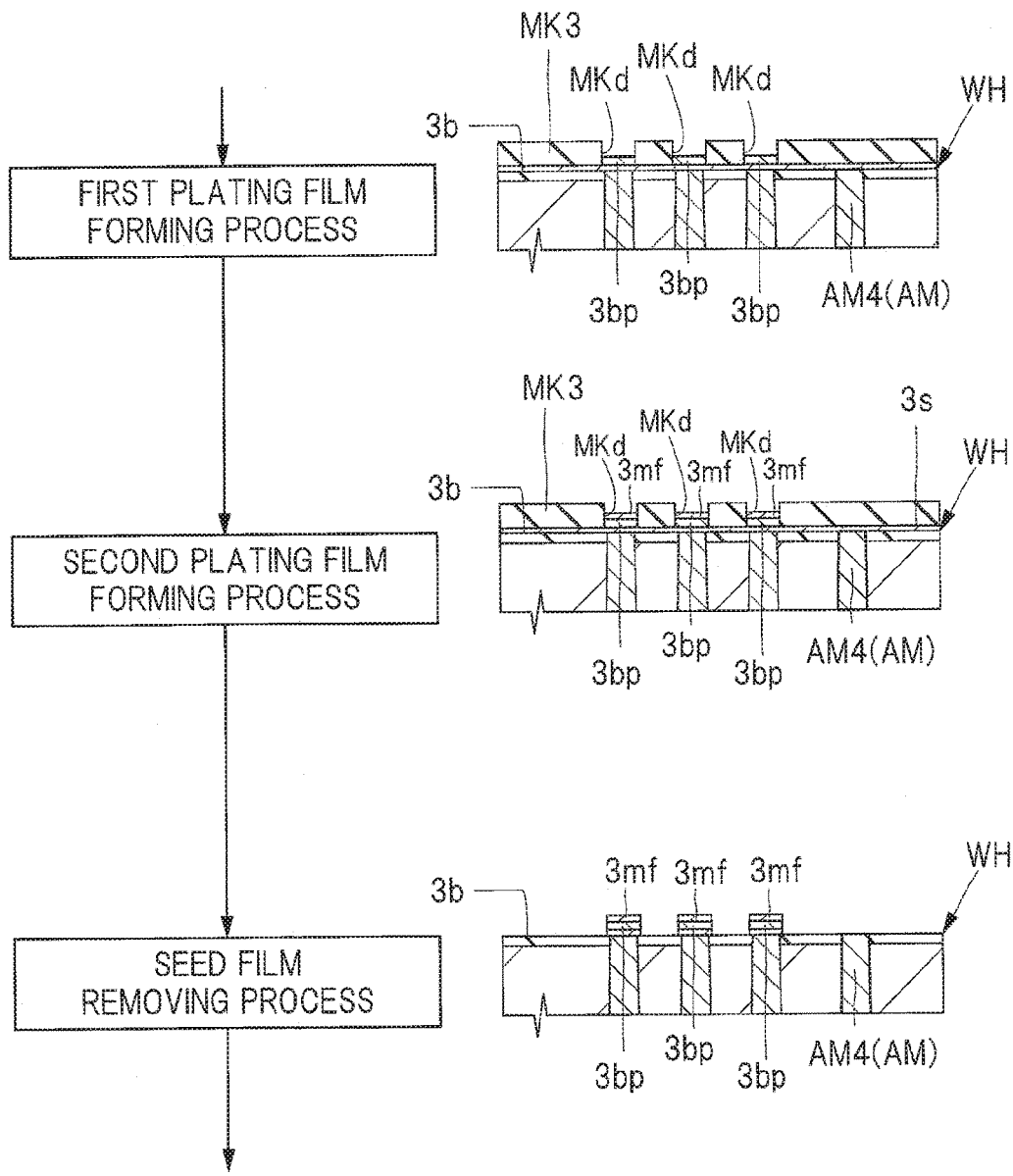
FIG. 31 is an explanatory diagram illustrating another modification example of the method of forming the rear electrodes and the alignment mark described with reference to FIG. 26.

Next, a method of forming the alignment marks according to the modification example described above with reference to FIG. 15 will be described. FIGS. 30 and 31 are explanatory diagrams illustrating another modification example of the method of forming the rear electrodes and, the alignment marks described above with reference to FIGS. 25 and 26. Since the present section is a modification example of the method described above with reference to FIGS. 25 and 26, the differences from the above-described processes will be mainly described and redundant descriptions will be omitted in principle. Also, in the present modification example, the alignment marks are formed in the semiconductor substrate, but since a method of forming the alignment marks in the semiconductor substrate is the same as the method of forming the through electrodes described above with reference to FIGS. 23 and 24, the illustrations thereof will be omitted and the descriptions will be given with reference to FIGS. 23 and 24.

As illustrated in FIG. 30, in the manufacturing process of the present modification example, the marks AM4 already embedded in the semiconductor substrate WH are formed in the rear surface polishing process. The marks AM4 are formed by the same method as the through electrodes 3*tsv*. Namely, in the hole forming process illustrated in FIG. 23, the holes 3*tsh* are formed at the positions where the marks AM4 are formed in addition to the positions where the through electrodes 3*tsv* are formed. Subsequently, the marks AM4 illustrated in FIG. 30 are formed by embedding a metal material such as copper (Cu) into the holes 3*tsh*. Since the marks AM4 are the metal material used as the alignment marks, the marks AM4 are not used as terminals. Thus, it is unnecessary to electrically connect the marks AM4 to the wiring layer 3*d* and the external terminals 7 in the wiring layer forming process and the external terminal forming process illustrated in FIG. 23.

Subsequently, in the case where the chemical mechanical polishing method (CMP method) is applied in the rear surface polishing process illustrated in FIG. 30, the through electrodes 3*tsv* and the marks AM4 slightly protrude from the rear surface 3*b* of the semiconductor substrate WH due to a difference of an etching rate (selection ratio) with respect to the constituent material of the semiconductor substrate WH and the constituent materials of the through electrode 3*tsv* and the marks AM4.

Subsequently, in an insulating film forming process illustrated in FIG. 30, an insulating film 3*bi* is formed to cover the rear surface of the semiconductor substrate WH, and then, the insulating film 3*bi* is polished to planarize the rear surface 3*b* and expose the through electrodes 3*tsv* and the marks AM4 from the rear surface 3*b*.

Subsequently, in a seed film farming process illustrated in FIG. 30, a seed film 3*s* serving as a seed layer (underlying conductive layer) for performing electrolytic plating in a plating film forming process illustrated in FIG. 31 is formed. The seed film 3*s* is formed to cover the exposed surfaces of the insulating film 3*bi*, the through electrodes 3*tsv* and the marks AM4 by, for example, the sputtering method. Examples of the constituent material of the seed film 3*s* may include copper (Cu).

Subsequently, in a plating mask forming process illustrated in FIG. 30, a mask MK3 serving as a plating mask to be used in a first plating film forming process illustrated in FIG. 31 is formed. In the mask MK3, openings MKd are formed at the same positions as the mask MK3 used in the plating mask forming process illustrated in FIG. 27. Namely, in the plating mask forming process, the openings MKd are formed at the positions where the rear electrodes 3*bp* illustrated in FIG. 27 are formed, but the opening MKd is not formed at the position where the mark AM4 is formed.

Subsequently, in a first plating film forming process illustrated in FIG. 31, the rear electrodes 3*bp* which are metal films such as copper films are formed by the plating method. At this time, since the marks AM4 are covered with the mask MK3, the metal film is not formed on the mark AM4.

Also, in the present modification example, after the first plating film forming process, the second plating film forming process is continuously performed without removing the mask MK3. Namely, in the present modification example, the plating mask re-forming process illustrated in FIGS. 26 and 28 is omitted. In the second plating film forming process, metal foils 3*mf* are formed by the plating method. At this time, since the marks AM4 are covered with the mask MK3, the metal foil 3*mf* is not formed on the mark AM4.

Subsequently, in a seed film removing process illustrated in FIG. 31, the mask MK3 is removed, and then, portions of the seed film 3*s* (portions including the upper portions of the marks AM4) other than the portions where the rear electrodes 3*bp* are formed are removed by, for example, the etching method.

Through the above processes, marks AM4 embedded in the semiconductor substrate WH and exposed in the rear surface 3*b* are formed. Since the exposed surface of the mark AM4 formed by the present modification example is located at substantially the same height as the rear surface 3*b*, it is particularly preferable in terms of the reduction in the protrusion height of the mark AM4. Also, since the manufacturing process can be most simplified as compared to the above-described modification examples, it is also preferable in terms of the manufacturing efficiency. However, in the case of the present modification example, since a portion containing copper as a main component is exposed in the exposed surface of the mark AM4, the exposed surface is likely to be oxidized. Therefore, from the viewpoint of stabilizing light reflectivity, the modification example described above with reference to FIGS. 27 and 28 or the modification example described above with reference to FIG. 29 are more preferable.

<First Chip Mounting Process>

Figure 32:
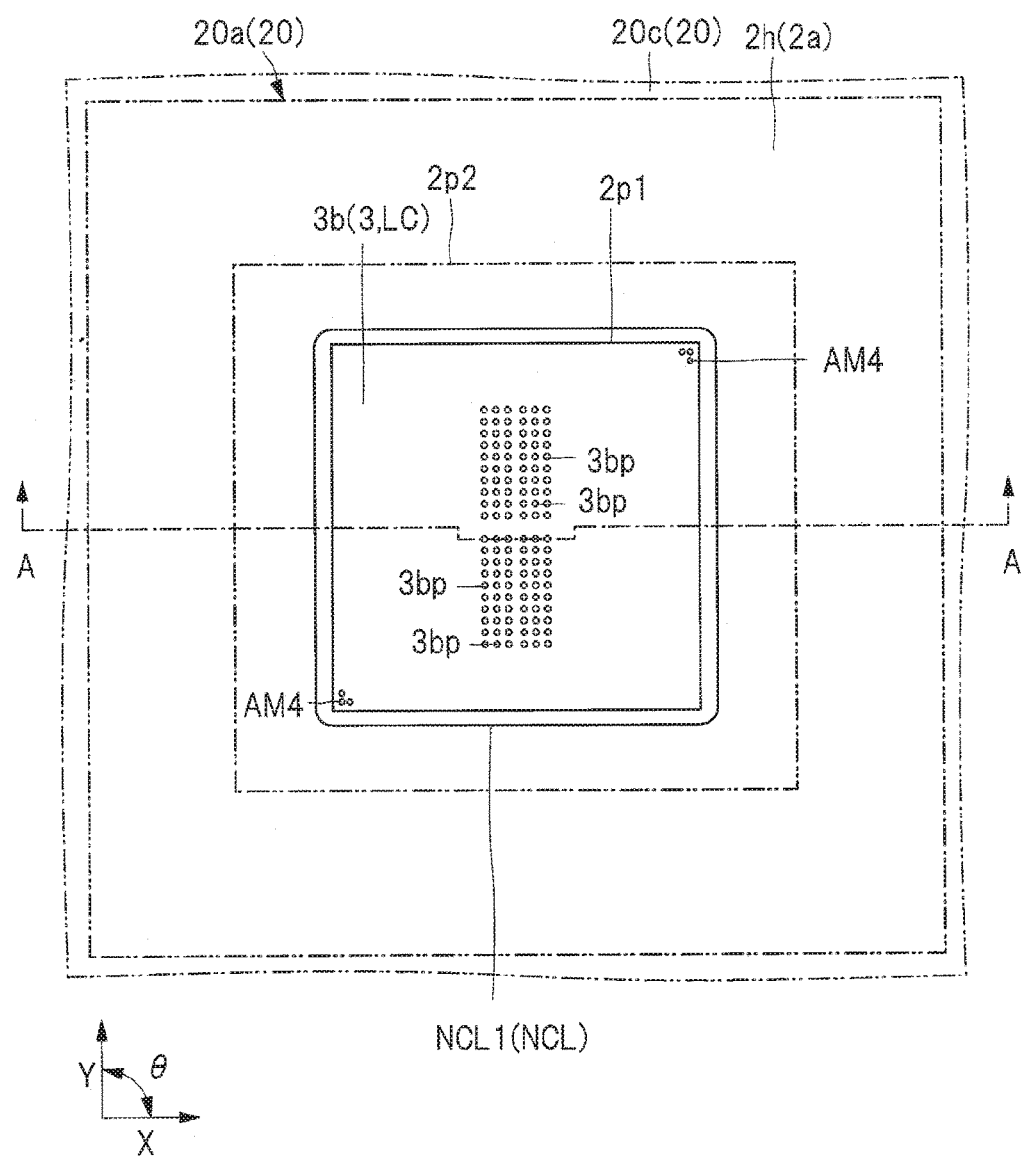
FIG. 32 is an enlarged plan view illustrating a state in which a logic chip LC is mounted on a chip counting region of a wiring substrate illustrated in FIG. 21.
Figure 33:
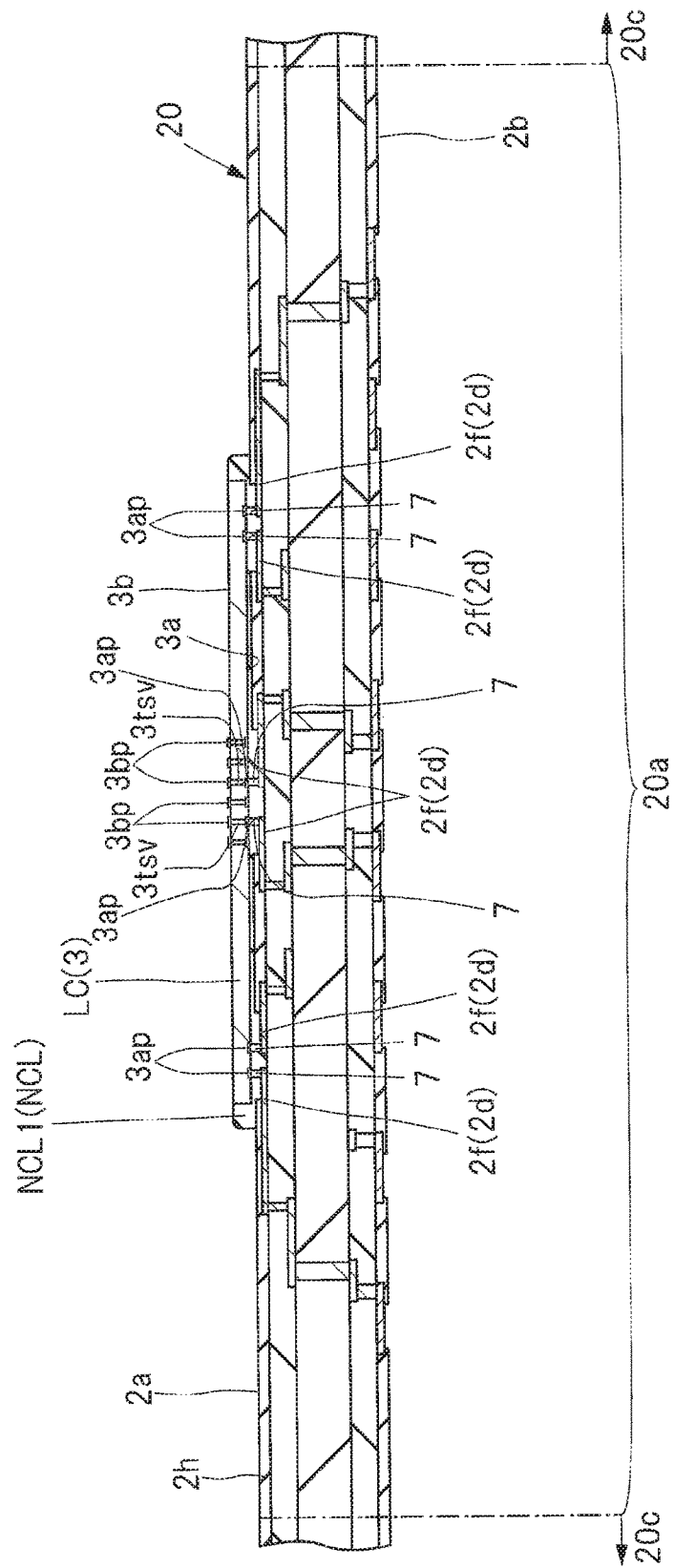
FIG. 33 is an enlarged sectional view taken along a line A-A of FIG. 32.
Figure 34:
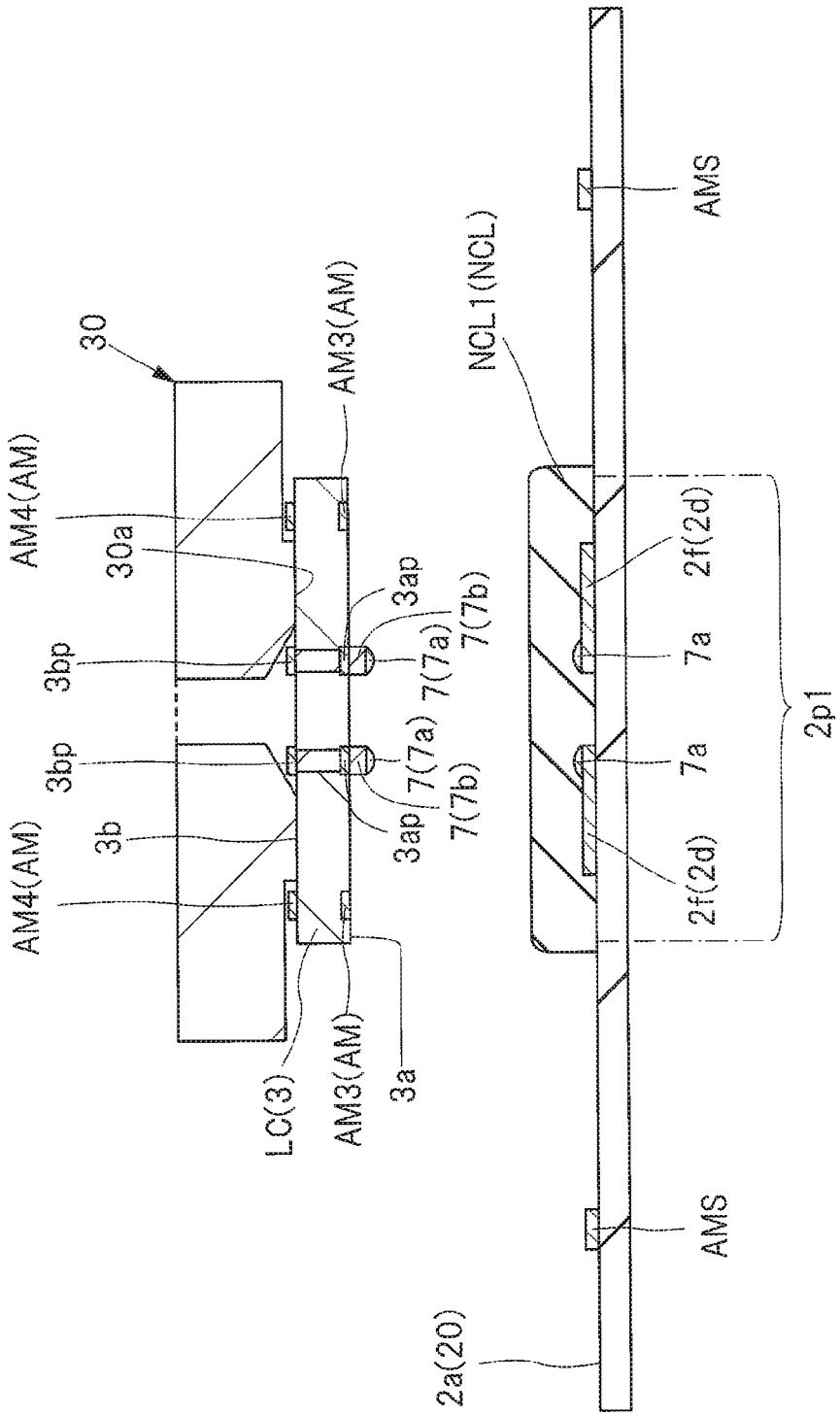
FIG. 34 is an explanatory diagram schematically illustrating an essential part of a first chip transferring process illustrated in FIG. 16.
Figure 35:
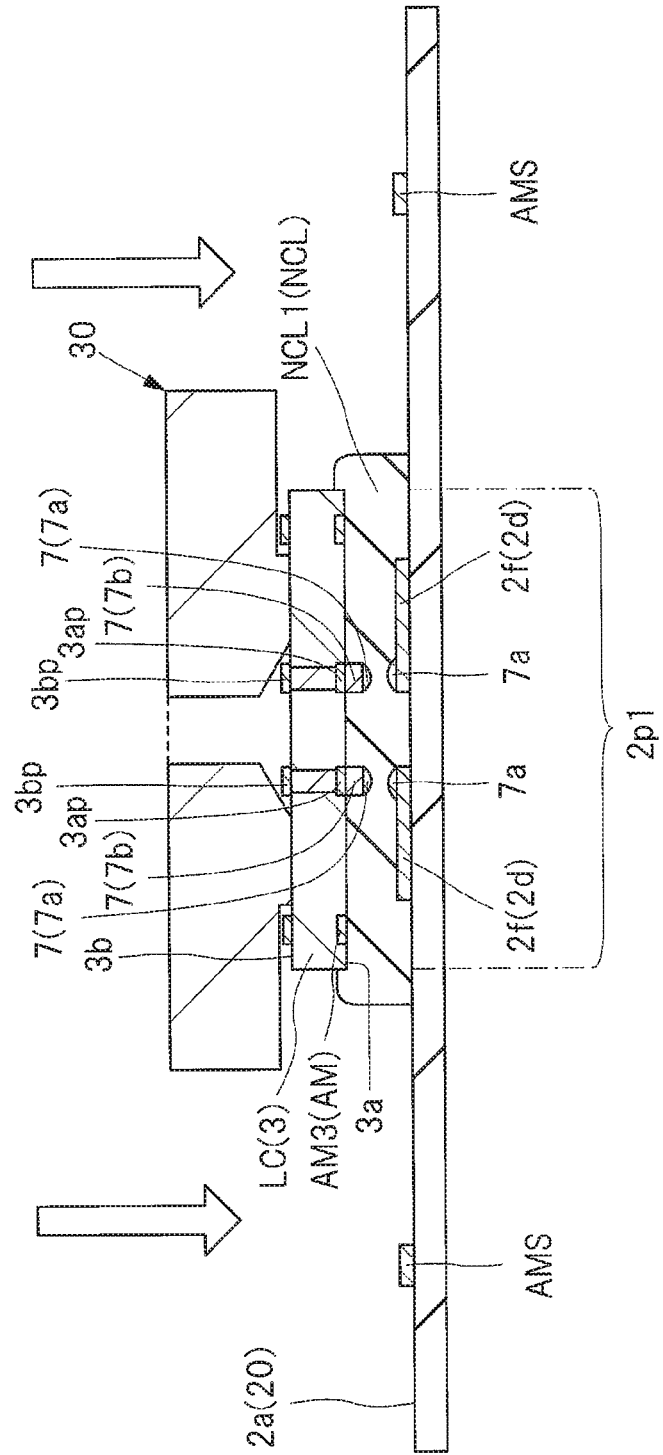
FIG. 35 is an explanatory diagram schematically illustrating a state in which a logic chip is moved toward a wiring substrate after a first alignment process illustrated in FIG. 34.
Figure 36:
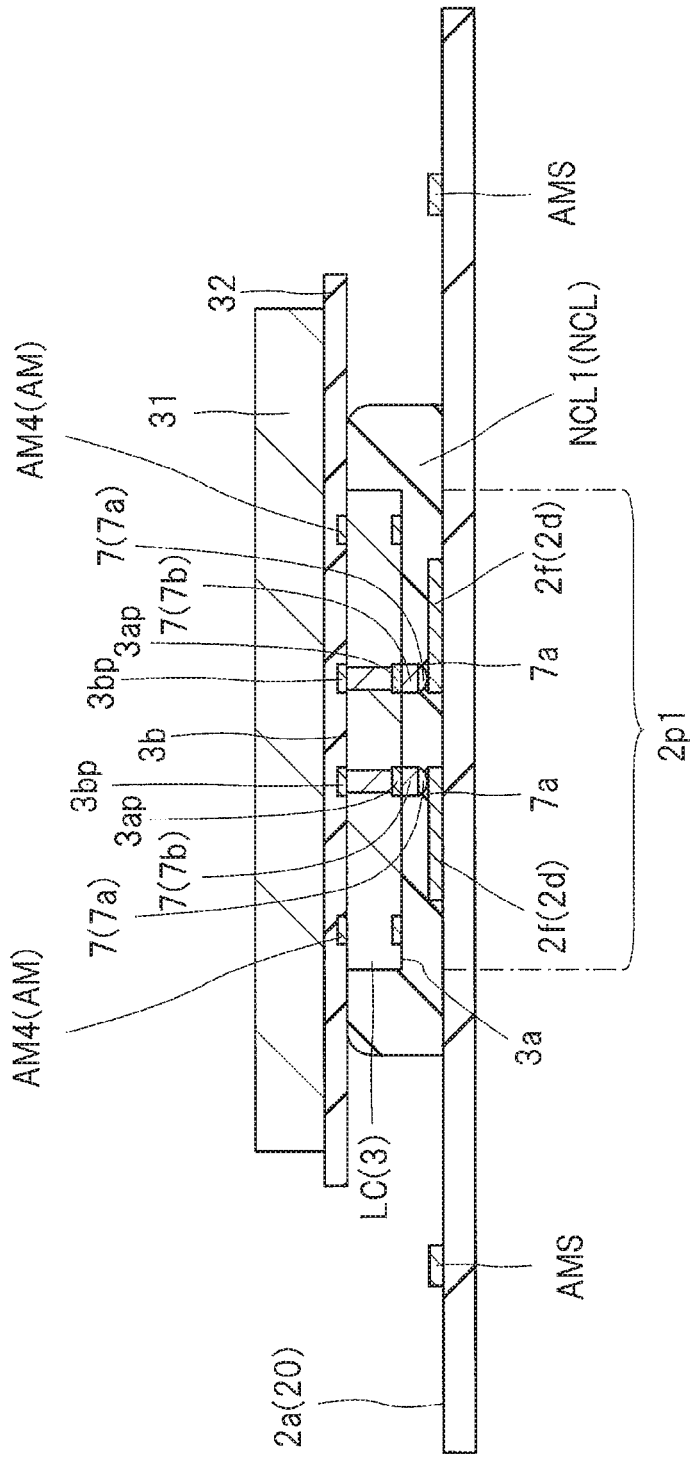
FIG. 36 is an explanatory diagram schematically illustrating a state in which a holding jig illustrated in FIG. 34 is removed and a bonding jig is pressed to a rear surface side of a semiconductor chip.

Subsequently, in the first chip mounting process illustrated in FIG. 16, the logic chip LC is mounted on the wiring substrate 2 as illustrated in FIGS. 32 and 33. FIG. 32 is an enlarged plan view illustrating a state in which the logic chip LC is mounted on the chip mounting region of the wiring substrate illustrated in FIG. 21. Also, FIG. 33 is an enlarged sectional view taken along a line A-A of FIG. 32. Also, FIG. 34 is an explanatory diagram schematically illustrating an essential part of a first chip transferring process illustrated in FIG. 16. Also, FIG. 35 is an explanatory diagram schematically illustrating a state in which the logic chip is moved toward the wiring substrate after a first alignment process illustrated in FIG. 34. Also, FIG. 36 is an explanatory diagram illustrating a state in which a holding jig illustrated in FIG. 34 is removed and a bonding jig is pressed to a rear surface of a semiconductor chip.

Note that the first chip transferring process and the first alignment process described in FIG. 16 can be considered as sub-processes included in the process of mounting the logic chip LC on the wiring substrate 20. Therefore, in the present embodiment, the first chip transferring process and the first alignment process will be described as sub-processes included in the first chip mounting process.

In the present process, as illustrated in FIG. 33, the logic chip LC is mounted in a so-called facedown mounting method (flip-chip connection method) so that the front surface 3a of the logic chip LC faces the top surface 2a of the wiring substrate 20. Also, the logic chip LC and the wiring substrate 20 are electrically connected to each other by the present process. Specifically, the plurality of front electrodes 3ap formed on the front surface 3a of the logic chip LC and the plurality of bonding leads 2f formed on the top surface 2a of the wiring substrate 20 are electrically connected to each other via the external terminals 7 (the protrusion electrodes 7b and the solder materials 7a illustrated in FIG. 6). Hereinafter, the detailed flow of the present process will be described with reference to FIGS. 34 to 36.

First, as illustrated in FIG. 34, the first chip transferring process of transferring the logic chip LC (semiconductor chip 3) onto the chip mounting region 2p1 of the wiring substrate 20 is included in the first chip mounting process. The logic chip LC is transferred onto the chip mounting region 2p1 in a state in which the rear surface 3b is held by a holding jig (collet) 30, and is then arranged on the chip mounting region 2p1 (or on the adhesive NCL1) so that the front surface 3a located on the element forming surface faces the top surface 2a of the wiring substrate 20. The holding jig 30 includes a holding surface 30a that sucks and holds the rear surface 3b of the logic chip LC, and transfers the logic chip LC in a state of being held by the holding surface 30a.

Also, protrusion electrodes 7b are formed on the front surface 3a of the logic chip LC, and solder materials 7a are formed at the tips of the protrusion electrodes 7b. On the other hand, solder materials 7a, which are bonding materials for electrical connection to the protrusion electrodes 7b, are formed in advance in the bonding portions of the bonding leads 2f formed on the top surface 2a of the wiring substrate 20.

Also, the first alignment process of adjusting a planar positional relationship between the wiring substrate 20 and the logic chip LC is included in the first chip mounting process. In the first alignment process, the alignment marks AMS of the wiring substrate 20 and the marks AM3 of the logic chip LC illustrated in FIG. 34 are detected (recognized). Also, the position of the chip mounting region 2p1 and the position of the logic chip LC are calculated based on the detection result of the alignment marks AMS and the marks AM3, and the position is adjusted by operating the holding jig 30. As the method of detecting the alignment marks AMS and the marks AM3, the alignment marks AMS and the marks AM3 can be optically detected by using an optical device such as an image sensor.

Also, in the example illustrated in FIG. 34, a plurality of alignment marks AMS are formed on the wiring substrate 20, and a plurality of marks AM3 are formed on the front surface 3a of the logic chip LC. By forming the plurality of alignment marks on the wiring substrate 20 and the front surface 3a of the logic chip LC and detecting the positions of the plurality of alignment marks in this manner, θ-direction data indicating a slope of a coordinate axis can be obtained in addition to the coordinate data of an XY plane illustrated in FIG. 17. Also, if the coordinate data of the alignment marks 50 and the θ-direction data are obtained, the positions of the plurality of bonding leads 2f (see FIG. 18) or the positions of the plurality of front electrodes 3ap (see FIG. 9) can be accurately calculated.

Also, in the first alignment process, relative positions of the logic chip LC and the wiring substrate 20 are moved along the top surface 2a of the wiring substrate 20, so that the bonding portions of the plurality of bonding leads 2f and the plurality of external terminals 7 formed on the front surface 3a of the logic chip LC are arranged to face each other. As described above, according to the present embodiment, the positions of the plurality of bonding leads 2f and the positions of the plurality of front electrodes 3ap can be calculated with high accuracy. Therefore, the alignment can be performed with high accuracy by moving the relative positions of the logic chip LC and the wiring substrate 20 based on these calculated data.

As the method of moving the relative positions of the logic chip LC and the wiring substrate 20, there is a method of moving the holding jig 30 that holds the logic chip LC along the top surface 2a of the wiring substrate 20. However, since it is only necessary to move the relative positional relationship between the logic chip LC and the wiring substrate 20, either or both of the logic chip LC and the wiring substrate 20 can be moved.

Subsequently, as illustrated in FIG. 35, the logic chip LC is moved toward the wiring substrate 20. At this time, the adhesive NCL1 is arranged on the wiring substrate 20 in a soft state before being cured by heat. Therefore, the front surface 3a of the logic chip LC is embedded in the adhesive NCL1. Also, the relative positions of the logic chip LC and the wiring substrate 20 are accurately aligned by the above-described first alignment process. Therefore, if the logic chip LC is linearly moved toward the wiring substrate 20, the state where the bonding portions of the plurality of bonding leads 2f and the plurality of external terminals 7 formed on the front surface 3a of the logic chip LC are arranged to face each other can be maintained.

Subsequently, as illustrated in FIG. 36, the logic chip LC is pressed toward the wiring substrate 20 by pressing the bonding jig 31 to the rear surface 3b of the logic chip LC. As described above, since the adhesive NCL1 is in a soft state before being cured, the logic chip LC approaches to the wiring substrate 20 when the logic chip LC is pressed by the bonding jig 31. When the logic chip LC approaches to the wiring substrate 20, the tips of the plurality of external terminals 7 (specifically, the solder materials 7a) formed in the front surface 3a of the logic chip LC contact the bonding regions of the bonding leads 2f (specifically, the solder materials 7a).

Also, the thickness of the adhesive NCL1 is larger than at least the sum of the height (protrusion height) of the external terminal 7 and the thickness of the bonding lead 2f. Therefore, when the logic chip LC is pressed by the bonding jig 31, a part of the front surface 3a of the logic chip LC is embedded in the adhesive NCL1. In other words, at least a part of the side surfaces of the logic chip LC on the side close to the front surface 3a is embedded in the adhesive NCL1. Also, a part of the adhesive NCL1 is pushed out to the periphery of the logic chip LC.

Here, since the marks AM4 and the rear electrodes 3bp are formed in the logic chip LC, it is necessary to prevent the adhesive NCL1 from wrapping around the rear surface 3b to cover the marks AM4 and the rear electrodes 3bp. Therefore, as illustrated in FIG. 36, it is preferable that a member (low-elasticity member), for example, a resin film (film) 32 which is softer than the bonding jig 31 and the logic chip LC is interposed between the bonding jig 31 and the logic chip LC and the rear surface 3b of the logic chip LC is covered with the resin film 32. If the logic chip LC is pressed through the resin film 32, the resin film 32 closely contacts the rear surface 3b of the logic chip LC, and it is thus possible to prevent the adhesive NCL1 from wrapping around the rear surface 3b of the logic chip LC even when the thickness of the adhesive NCL1 is increased. The resin film 32 according to the present embodiment is made of, for example, fluorine resin.

Subsequently, the logic chip LC and the adhesive NCL1 are heated through the bonding jig (heating jig) 31 in a state in which the logic chip LC is pressed to the bonding jig 31 as illustrated in FIG. 36. In the bonding portions of the logic chip LC and the wiring substrate 20, the solder material 7a of the bonding lead 2f and the solder material 7a of the external terminal are melted and integrated, so that the bonding material that electrically connects the external terminal 7 to the bonding lead 2f is formed. Namely, by heating the logic chip LC through the bonding jig 31, the protrusion electrodes 7b and the bonding leads 2f are electrically connected to each other via the solder materials 7a.

Also, the adhesive NCL1 is cured by heating. In this manner, the adhesive NCL1 cured in a state in which a part of the logic chip LC is embedded is obtained. Also, since the marks AM4 and the rear electrodes 3bp of the logic chip LC are covered with the resin film 32, the marks AM4 and the rear electrodes 3bp are exposed from the cured adhesive NCL1. Note that it is unnecessary to completely cure the adhesive NCL1 by the heat from the bonding jig 31, and an embodiment in which a part of the thermosetting resin contained in the adhesive NCL1 is cured (temporary curing) to the extent that can fix the logic chip LC, and then the wiring substrate 20 is transferred to a heating furnace (not illustrated) to cure the remaining thermosetting resin (main curing) is also applicable. The time is required until the completion of the main curing to cure the entire thermosetting resin component contained in the adhesive NCL1, but the manufacturing of efficiency can be improved by performing the main curing process in the heating furnace.

<Second Adhesive Arranging Process>

Figure 37:
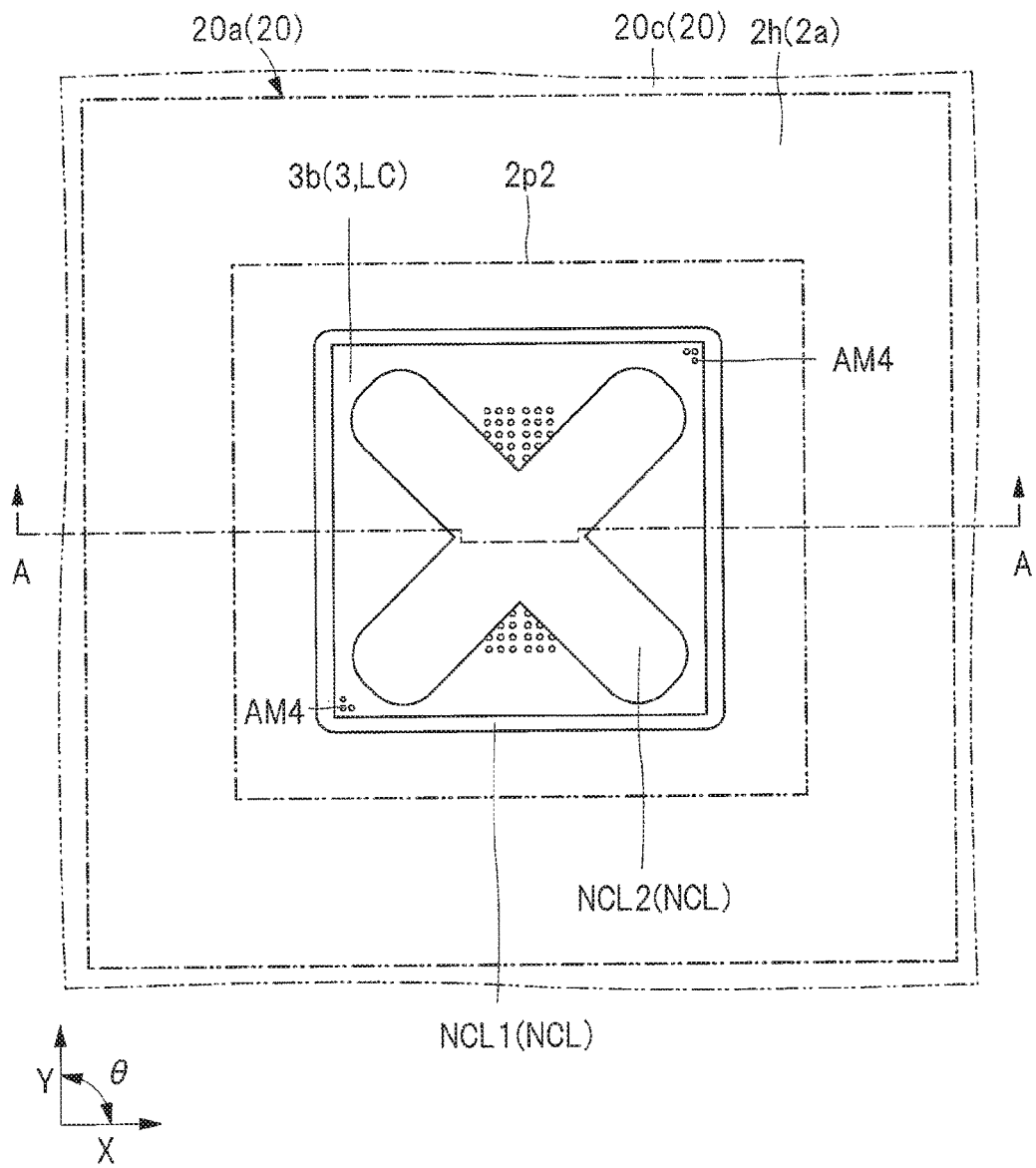
FIG. 37 is an enlarged plan view illustrating a state in which an adhesive is arranged on a rear surface of a semiconductor chip illustrated in FIG. 32 and a surrounding region thereof.
Figure 38:
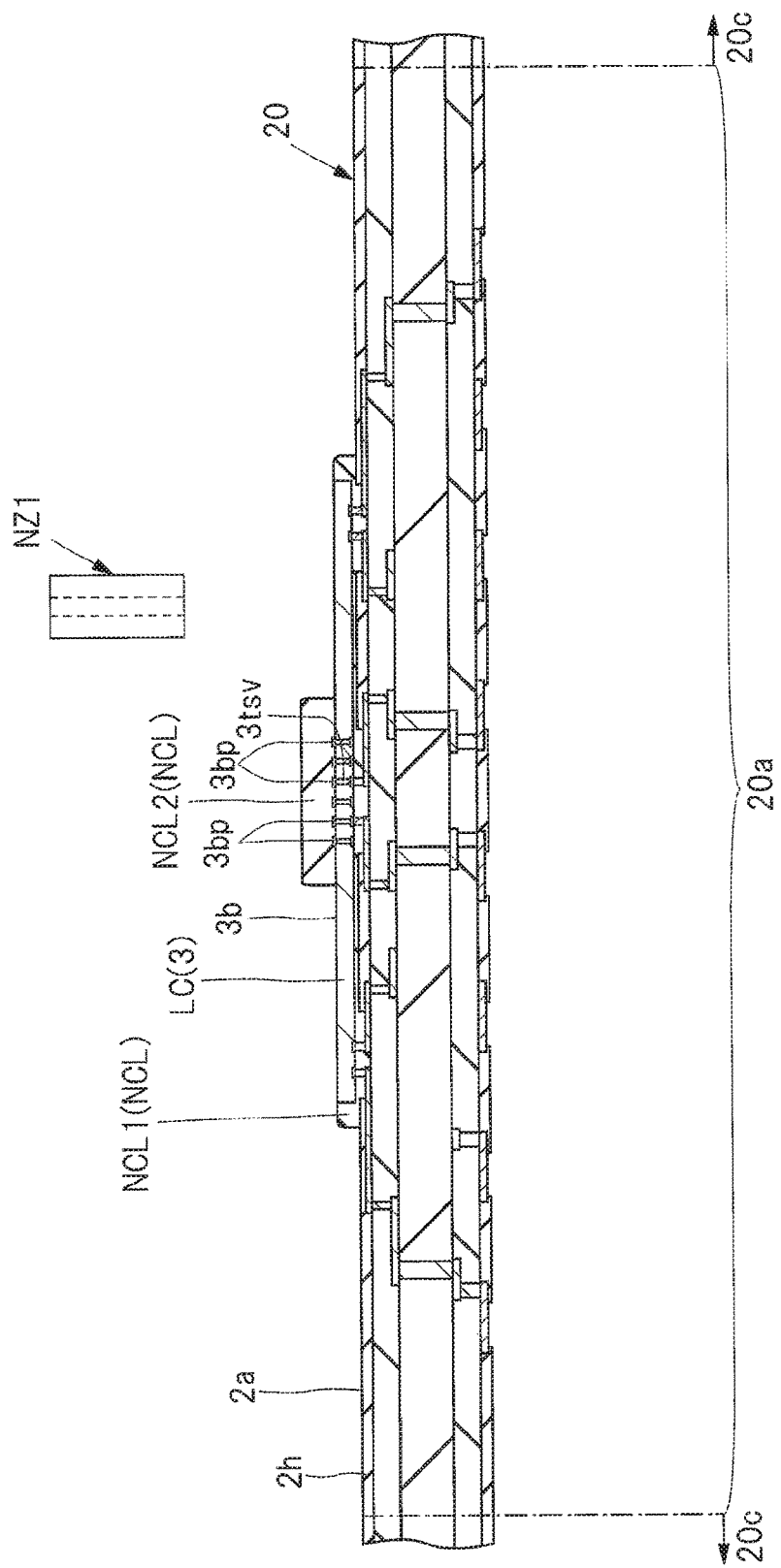
FIG. 38 is an enlarged sectional view taken along a line A-A of FIG. 37.

Next, in a second adhesive arranging process illustrated in FIG. 16, an adhesive NCL2 is arranged on the rear surface 3b of the logic chip LC (semiconductor chip 3) as illustrated in FIG. 37. FIG. 37 is an enlarged plan view illustrating a state in which the adhesive is arranged on the rear surface of the semiconductor chip illustrated in FIG. 32 and the surrounding region thereof, and FIG. 38 is an enlarged sectional view taken along a line A-A of FIG. 37.

As illustrated in FIG. 6, in the semiconductor device 1 according to the present embodiment, the logic chip LC mounted on the lowermost stage (for example, first stage) and the memory chip MC1 mounted on the second stage counted from the lower stage among the plurality of laminated semiconductor chips 3 are all mounted by the face-down mounting method (flip-chip connection method). Therefore, as described in the first adhesive arranging process, it is preferable to apply the pre-coating method because the processing time for one device region 20a (see FIGS. 37 and 38) can be reduced and the manufacturing efficiency can be improved.

Also, as described above, the adhesive NCL2 used in the pre-coating method is made of an insulating (non-conductive) material (for example, a resin material). Also, the adhesive NCL2 is made of a resin material whose hardness (degree of hardness) becomes higher (is increased) by adding energy, and the adhesive NCL2 contains thermosetting resin or the like in the present embodiment. Also, the adhesive NCL2 before curing is softer than the protrusion electrode 7b illustrated in FIG. 6 and is deformed by pressing the logic chip LC.

Also, the adhesive NCL2 before curing is roughly classified into a paste-like resin (insulating material paste) called NCP and a resin shaped in a film form in advance (insulating material film) called NCF from the difference of the handling method. As the adhesive NCL2 used in the present process, either of the NCP and NCF can be used. In the example illustrated in FIGS. 37 and 38, the adhesive NCL2 is arranged on the rear surface 3b of the logic chip LC by discharging the NCP from a nozzle NZ1 (see FIG. 38).

Note that the discharging of the paste-like adhesive NCL2 from the nozzle NZ1 is common to the post-injection method described above in the first adhesive arranging process. However, in the present embodiment, the adhesive NCL2 is supplied in advance before the memory chip MC1 illustrated in FIG. 4 is mounted. Therefore, when compared with the post-injection method of injecting the resin by using the capillary phenomenon, the coating speed of the adhesive NCL2 can be considerably improved.

Also, as illustrated in FIG. 37, since the plurality of marks AM4 formed on the rear surface of the logic chip LC are objects to be detected in the second mark detecting process illustrated in FIG. 16, it is preferable that the adhesive NCL2 is arranged so that the marks AM4 are exposed. If the adhesive NCL2 is made of a material that is transparent or semitransparent to visible light, the positions of the marks AM4 can be detected even when the marks AM4 are covered with the adhesive NCL2. However, from the viewpoint of improving the degree of freedom in material selection, it is preferable that the adhesive NCL2 is arranged so that the marks AM4 are exposed as illustrated in FIG. 37. Also, since the insulating material paste (NCP) can reduce the arrangement region of the adhesive as compared to the insulating material film (NCF), the marks AM4 can be easily exposed.

The adhesive NCL2 has a fixing material function of bonding and fixing the memory chip MC1 (see FIG. 4) and the logic chip LC (see FIG. 4) in the second chip mounting process illustrated in FIG. 16. Also, the adhesive NCL2 has a sealing material function of sealing and protecting the bonding portions of the memory chip MC1 and the logic chip LC. Note that the sealing material function includes a stress relaxing function of protecting the bonding portions of the memory chip MC1 and the logic chip LC by dispersing and relaxing a stress transmitted to the bonding portions.

Since the sealing material function can be satisfied by arranging the adhesive NCL2 so as to surround the bonding portions of the memory chip MC1 and the logic chip LC, it is preferable that the plurality of external terminals 7 illustrated in FIG. 6 are sealed by the adhesive NCL2 at least when the memory chip MC1 is mounted.

<Second Chip Preparing Process>

Figure 40:
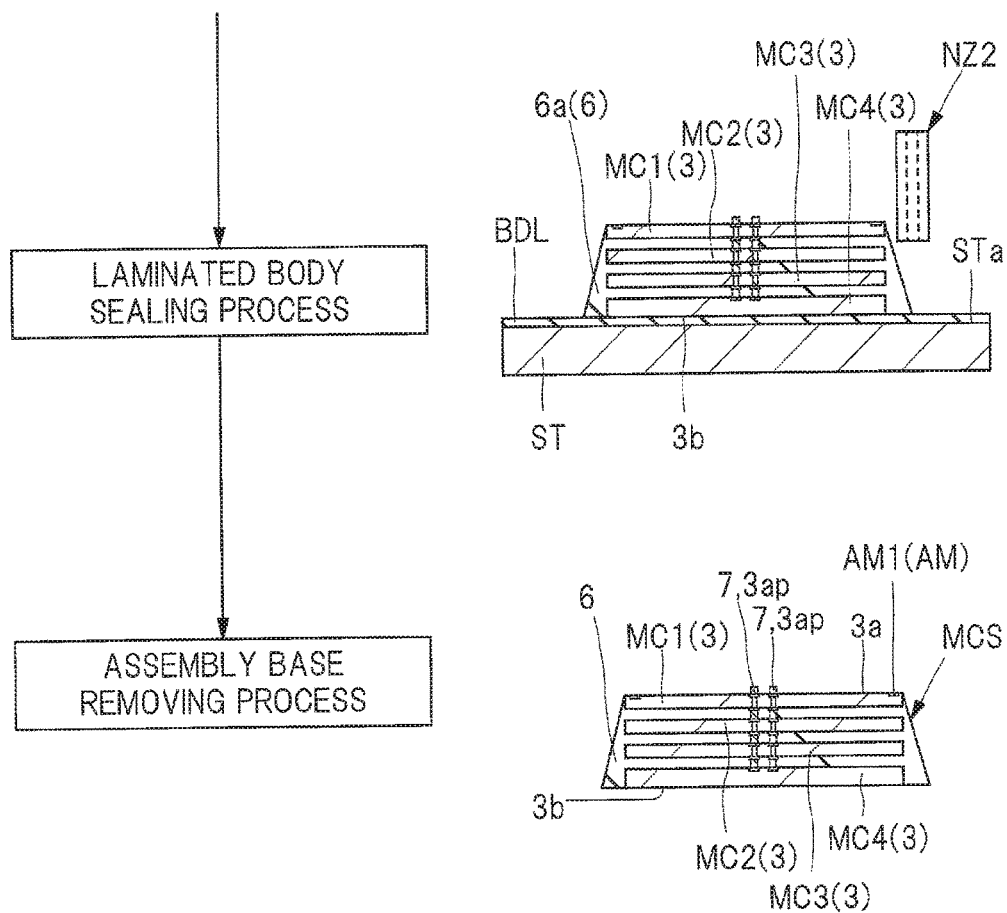
FIG. 40 is an explanatory diagram schematically illustrating an overview of the process of assembling the laminated body of memory chips continued from FIG. 39.

Also, in the second chip preparing process illustrated in FIG. 16, a laminated body MCS of memory chips MC1, MC2, MC3 and MC4 illustrated in FIG. 40 is prepared. As a modification example of the present embodiment, the memory chips MC1, MC2, MC3 and MC4 can be sequentially laminated on the logic chip LC. However, in the present embodiment described below, the laminated body (memory chip laminated body, semiconductor chip laminated body) MCS illustrated in FIG. 40 is formed by laminating the memory chips MC1, MC2, MC3 and MC4 in advance.

As described below, in the case of forming the laminated body MCS of the memory chips MC1, MC2, MC3 and MC4, for example, the formation thereof can be performed at the place separate from the processes other than the second chip preparing process illustrated in FIG. 16 independently of other processes. For example, the laminated body MCS can be prepared as a purchased part. Therefore, this is preferable in that the assembling process illustrated in FIG. 16 can be simplified and the manufacturing efficiency can be improved as a whole.

Figure 39:
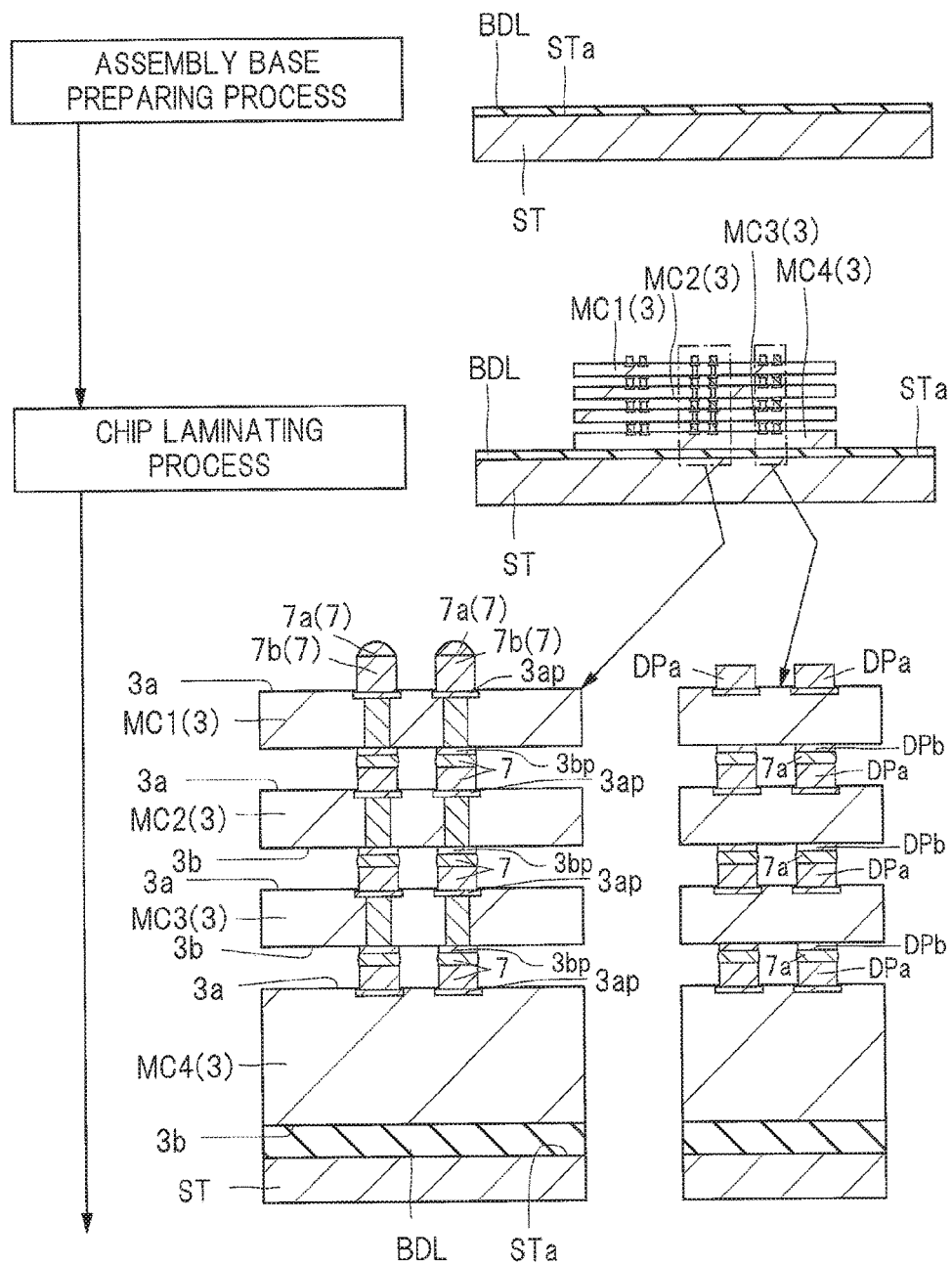
FIG. 39 is an explanatory diagram schematically illustrating an overview of a process of assembling a laminated body of memory chips illustrated in FIG. 4.

FIG. 39 is an explanatory diagram schematically illustrating an overview of a process of assembling the laminated body of the memory chips illustrated in FIG. 4. Also, FIG. 40 is an explanatory diagram schematically illustrating an overview of a process of assembling the laminated body of the memory chips continued from FIG. 39. Since each of the plurality of memory chips MC1, MC2, MC3 and MC4 illustrated in FIGS. 39 and 40 can be manufactured by applying the manufacturing method of the semiconductor chips described above with reference to FIGS. 23 to 31, descriptions thereof will be omitted.

First, as an assembly base preparing process, a base (assembly substrate) ST for assembling the laminated body MCS illustrated in FIG. 40 is prepared. The base ST includes an assembling surface STa on which the plurality of memory chips MC1, MC2, MC3 and MC4 are laminated, and an adhesive layer 35 is provided in the assembling surface STa.

Subsequently, as a chip laminating process, the memory chips MC1, MC2, MC3 and MC4 are laminated on the assembling surface STa of the base ST. In the example illustrated in FIG. 39, the memory chips MC4, MC3, MC2 and MC1 are sequentially laminated in this order so that the rear surfaces 3b of the respective laminated semiconductor chips 3 face the assembling surface STa of the base ST. The rear electrodes 3bp of the semiconductor chip 3 of the upper stage and the front electrodes 3ap of the semiconductor chip 3 of the lower stage are bonded to each other by, for example, the external terminals 7 (the protrusion electrodes 7b and the solder materials 7a illustrated in FIG. 6).

At this time, as illustrated in FIG. 7, on the front surfaces 3a of the memory chips MC1, MC2, MC3 and MC4, a plurality of dummy patterns (metal patterns) DPa are formed around the region where the plurality of front electrodes 3ap are formed and at the positions that do not overlap the memory region MR when seen in a plan view. The plurality of dummy patterns DPa are metal patterns made of the same metal as the protrusion electrodes 7b bonded to the plurality of front electrodes 3ap illustrated in FIG. 39. Also, the plurality of dummy patterns DPa have the same configuration as the protrusion electrodes 7b bonded to the plurality of front electrodes 3ap except that the plurality of dummy patterns DPa are electrically isolated from the circuits formed in the memory chips MC1, MC2, MC3 and MC4.

Also, as illustrated in FIG. 8, in the rear surfaces 3b of the memory chips MC1, MC2 and MC3, a plurality of dummy patterns (metal patterns, dummy pads, metal pads) DPb are formed at the positions that overlap the plurality of dummy patterns DPa formed in the front surface 3a (see FIG. 7), when seen in a plan view. The dummy patterns DPb of the rear surface 3b are metal patterns made of the same metal material as the plurality of rear electrodes 3bp. Also, the plurality of dummy patterns DPb of the rear surface 3b have the same configuration as the plurality of rear electrodes 3bp except that the plurality of dummy patterns DPb are electrically isolated from the circuits formed in the memory chips MC1, MC2 and MC3.

Also, in the example illustrated in FIGS. 7 and 8, a front electrode group in which the plurality of front electrodes 3ap (see FIG. 7) are arranged and a rear electrode group in which the plurality of rear electrodes 3bp (see FIG. 8) are arranged extend in a Y direction. On the other hand, the plurality of dummy patterns DPa of the front surface 3a and the plurality of dummy patterns DPb of the rear surface 3b are arranged in an X direction perpendicular to the Y direction.

In the chip laminating process illustrated in FIG. 39, when the protrusion electrodes 7b and the plurality of rear electrodes 3bp are connected to each other via the solder materials 7a, the dummy patterns DPa of the front surface 3a and the dummy patterns DPb of the rear surface 3b are connected to each other via the solder materials 7a. In this manner, it is possible to suppress each semiconductor chip 3 from being inclined when the memory chips MC1, MC2, MC3 and MC4 are laminated.

Subsequently, in a laminated body sealing process illustrated in FIG. 40, a resin (underfill resin) is supplied between the plurality of laminated semiconductor chips 3 to form a sealing body (a sealing body for a chip laminated body, a resin body for a chip laminated body) 6. The sealing body 6 is formed by the post-injection method described above in the first adhesive arranging process. Namely, after the plurality of semiconductor chips 3 are laminated in advance, an underfill resin 6a is supplied from the nozzle NZ2 and is embedded between the plurality of laminated semiconductor chips 3. The underfill resin 6a has a lower viscosity than the sealing resin used in the sealing process illustrated in FIG. 16 and can be embedded between the plurality of semiconductor chips 3 by using a capillary phenomenon. Thereafter, the underfill resin 6a embedded between the semiconductor chips 3 is cured to obtain the sealing body 6.

Since the method of forming the sealing body 6 through the post-injection method has excellent gap filling characteristics as compared to a so-called transfer mold method, this method is effectively applicable when a gap between the laminated semiconductor chips 3 is narrow. Also, in the case where gaps to be filled by the underfill resin 6a are formed in multiple stages as illustrated in FIG. 40, the plurality of gaps can be collectively filled with the underfill resin 6a. Therefore, the processing time can be reduced as a whole.

Subsequently, in an assembly base removing process, the base ST and an adhesive layer BDL are removed by peeling from the rear surface 3b of the memory chip MC4. As an example of the method of removing the base ST and the adhesive layer BDL, a method of curing the resin component contained in the adhesive layer BDL (for example, ultraviolet curable resin) can be applied. Through the above processes, the laminated body MCS in which the plurality of memory chips MC1, MC2, MC3 and MC4 are laminated and the bonding portions of the memory chips MC1, MC2, MC3 and MC4 are sealed by the sealing body 6 is obtained. The laminated body MCS can be regarded as one memory chip including the front surface 3a where the plurality of front electrodes 3ap are formed (the front surface 3a of the memory chip MC1) and the rear surface 3b located on the opposite side of the front surface 3a (the rear surface 3b of the memory chip MC4).

<Second Chip Mounting Process>

Figure 41:
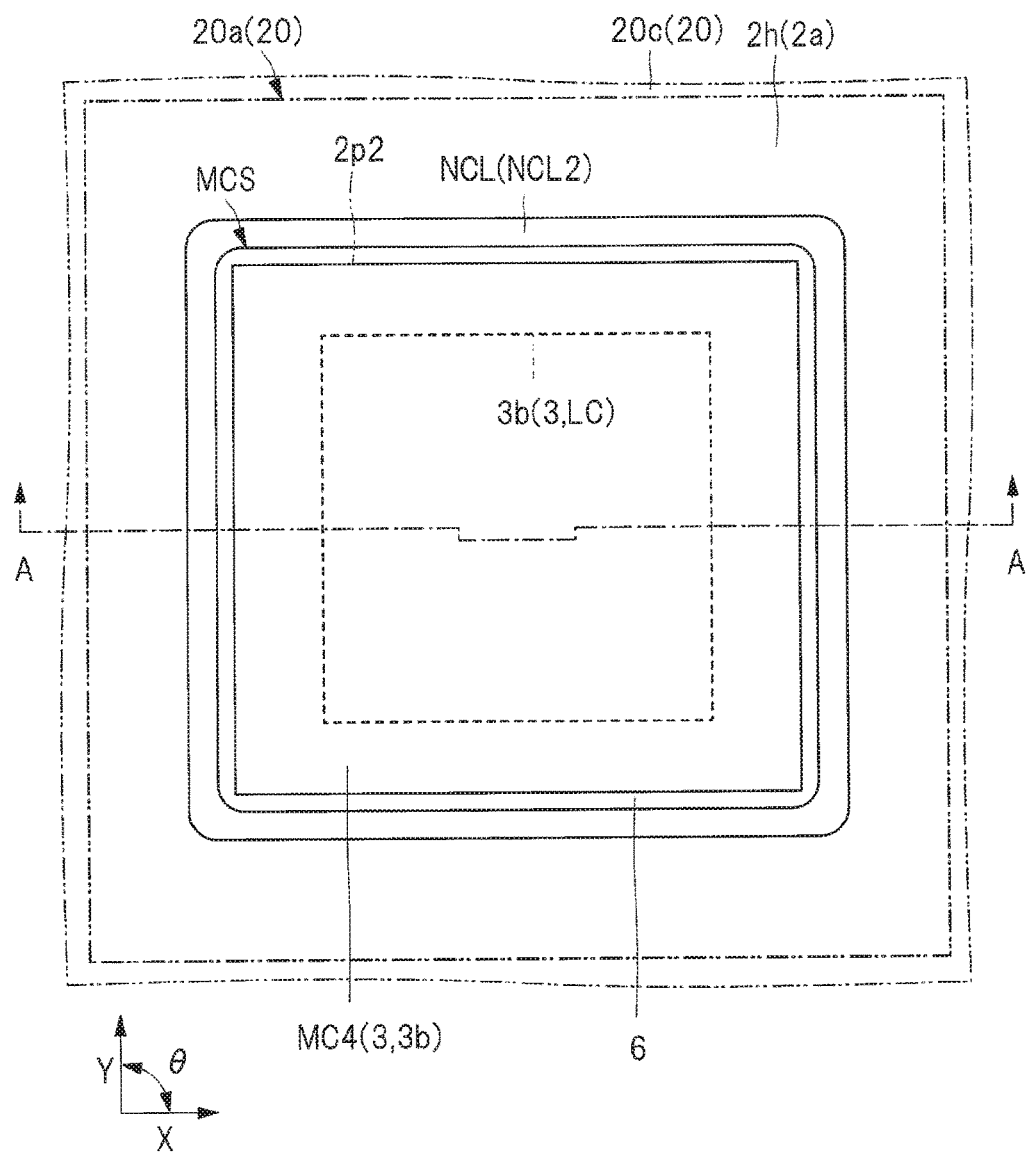
FIG. 41 is an enlarged plan view illustrating a state in which a laminated body is mounted on a rear surface of a logic chip illustrated in FIG. 37.
Figure 42:
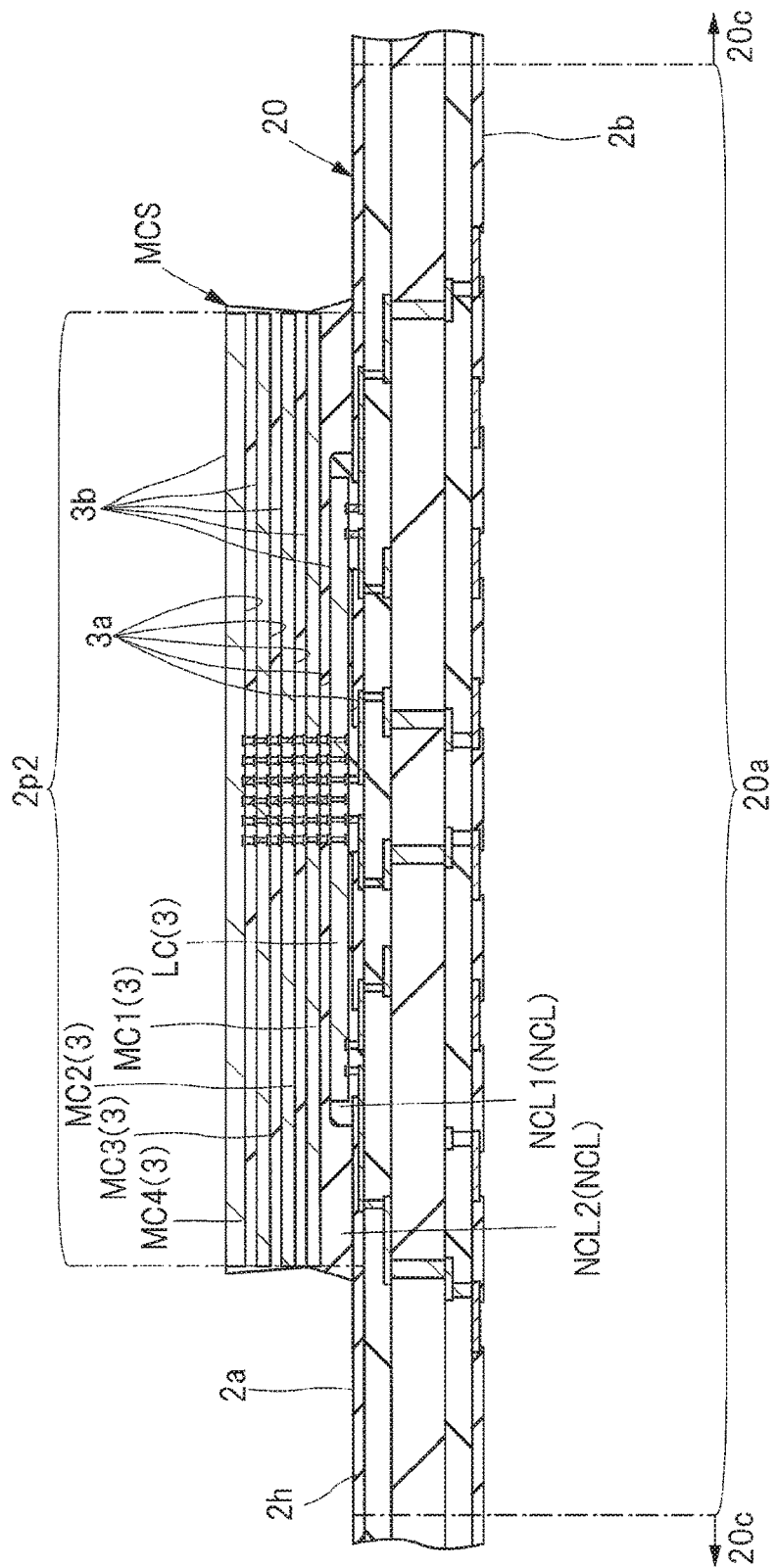
FIG. 42 is an enlarged sectional view taken along a line A-A of FIG. 41.

Subsequently, in the second chip mounting process illustrated in FIG. 16, the laminated body MCS is mounted on the rear surface 3b of the logic chip LC as illustrated in FIGS. 41 and 42. Note that the second chip transferring process and the second alignment process described in FIG. 16 can be considered as sub-processes included in the process of mounting the laminated body MCS on the logic chip LC. Therefore, in the present embodiment, the second chip transferring process and the second alignment process will be described as sub-processes included in the second chip mounting process.

Figure 43:
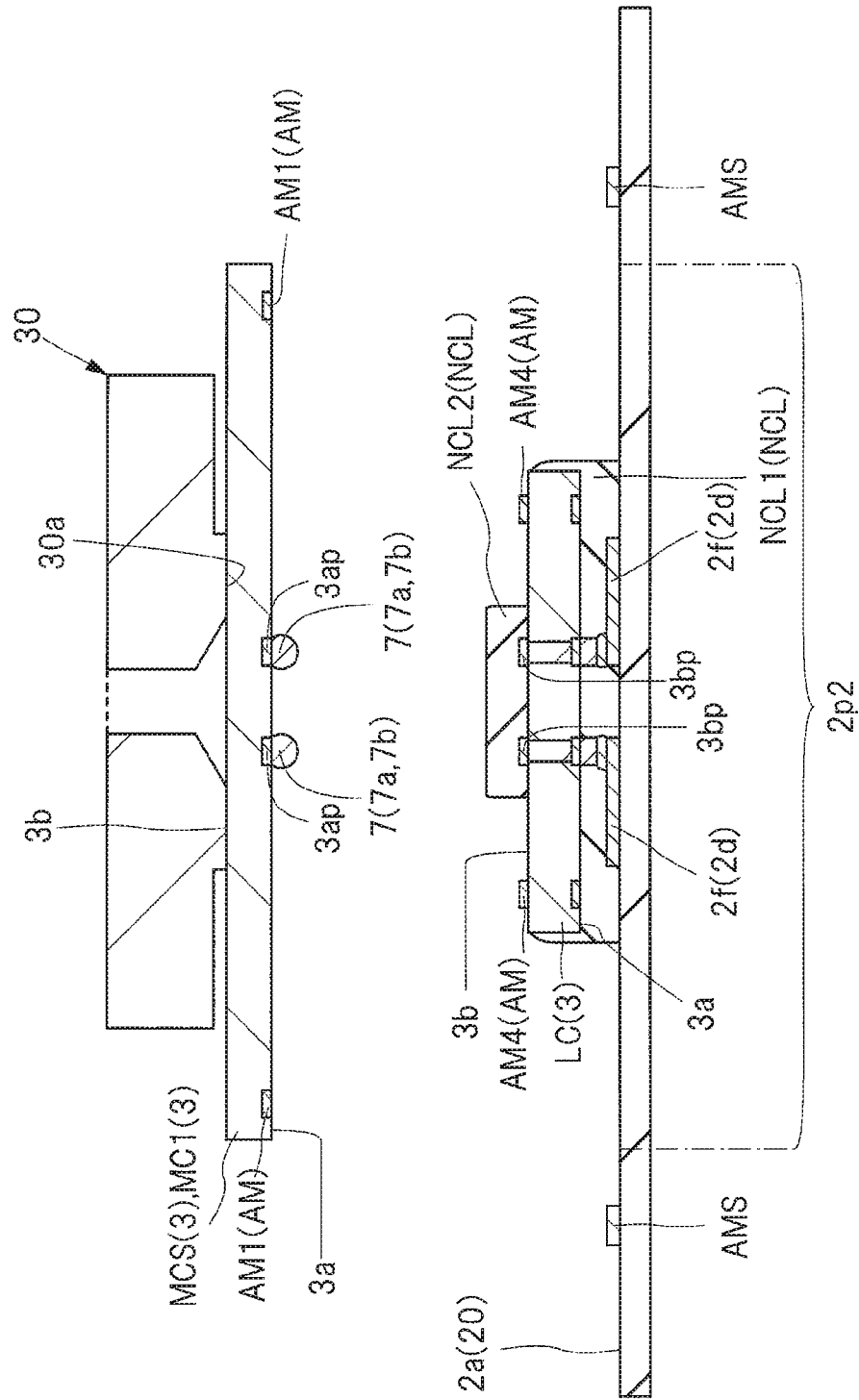
FIG. 43 is an explanatory diagram schematically illustrating an essential part of a second chip transferring process illustrated in FIG. 16.
Figure 44:
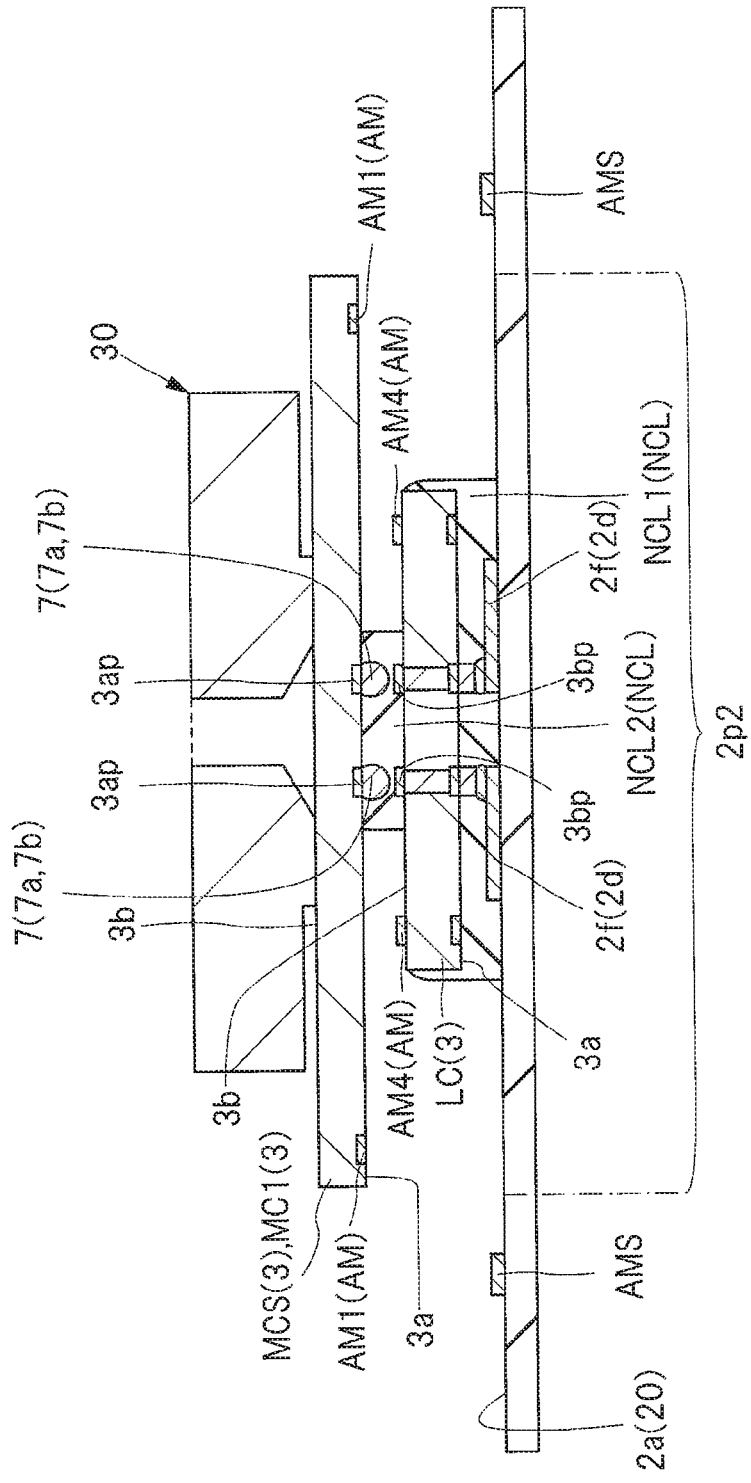
FIG. 44 is an explanatory diagram schematically illustrating a state in which a chip laminated body is moved toward a wiring substrate after a second alignment process.
Figure 45:
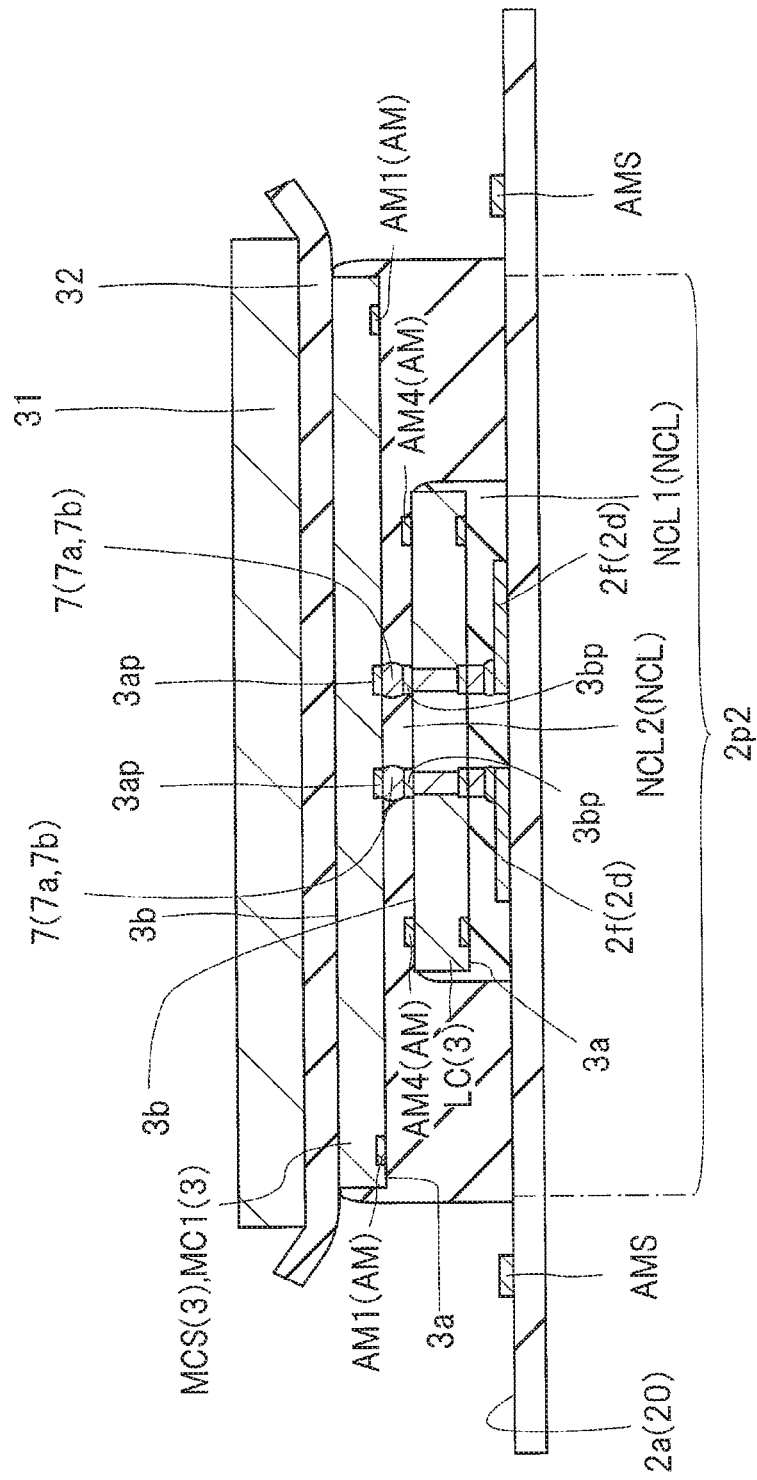
FIG. 45 is an explanatory diagram schematically illustrating a state in which a holding jig illustrated in FIG. 44 is removed and a bonding jig is pressed to a rear surface side of a semiconductor chip.

FIG. 41 is an enlarged plan view illustrating a state in which the laminated body is mounted on the rear surface of the logic chip illustrated in FIG. 37. Also, FIG. 42 is an enlarged sectional view taken along a line A-A of FIG. 41. Also, FIG. 43 is an explanatory diagram schematically illustrating an essential part of the second chip transferring process illustrated in FIG. 16. Also, FIG. 44 is an explanatory diagram schematically illustrating a state in which the chip laminated body is moved toward the wiring substrate after the second alignment process. Also, FIG. 45 is an explanatory diagram schematically illustrating a state in which a holding jig illustrated in FIG. 44 is removed and a bonding jig is pressed to a rear surface of a semiconductor chip.

In the present process, as illustrated in FIG. 42, the laminated body MCS is mounted by a so-called facedown mounting method (flip-chip connection method) so that the front surface 3a of the laminated body MCS (the front surface 3a of the memory chip MC1) faces the rear surface 3b of the logic chip LC. Also, the plurality of memory chips MC1, MC2, MC3 and MC4 and the logic chip LC are electrically connected to each other by the present process. Specifically, as illustrated in FIG. 6, the plurality of front electrodes 3ap formed on the front surface 3a of the laminated body MCS (memory chip MC1) and the plurality of rear electrodes 3bp formed on the rear surface 3b of the logic chip LC are electrically connected to each other via the external terminals 7 (the solder materials 7a and the protrusion electrodes 7b illustrated in FIG. 6). Hereinafter, the detailed flow of the present process will be described with reference to FIGS. 43 to 45.

First, as illustrated in FIG. 43, the second chip transferring process of arranging the laminated body MCS (semiconductor chip 3) on the chip mounting region 2p2 of the wiring substrate 20 is included in the second chip mounting process. The laminated body MCS is transferred onto the chip mounting region 2p2 in a state in which the rear surface 3b is held by the holding jig (collet) 30, and is arranged on the chip mounting region 2p2 (or on the adhesive NCL2) so that the front surface 3a located on an element forming surface faces the top surface 2a of the wiring substrate 20. The holding jig 30 includes a holding surface 30a that sucks and holds the rear surface 3b of the laminated body MCS, and transfers the laminated body MCS in a state of being held by the holding surface 30a. The chip mounting region 2p2 is the scheduled region where the laminated body MCS is to be mounted in the present process, and actually visible boundaries need not be present like the chip mounting region 2p1 described above in the first chip mounting process.

Also, the external terminals 7 are formed on the front surface 3a of the laminated body MCS. In the example illustrated in FIG. 43, an example in which the plurality of protrusion electrodes 7b and the plurality of solder materials 7a are bonded as the external terminals 7 to the plurality of front electrodes 3ap is shown.

Also, in the example illustrated in FIG. 43, a bonding material such as the solder material is not formed on the top surfaces of the rear electrodes 3bp formed on the rear surface 3b of the logic chip LC. However, as described above with reference to FIGS. 27 to 29, in the case where the metal foils 3mf (see FIG. 28) made of a metal material such as gold (Au) which is less likely to be oxidized than copper (Cu) are formed on the exposed surfaces of the rear electrodes 3bp, the bonding characteristics of the solder materials 7a can be improved.

Also, the second alignment process of adjusting a planar positional relationship between the logic chip LC and the laminated body MCS is included in the second chip mounting process. In the second alignment process, the marks AM4 of the rear surface 3b of the logic chip LC and the marks AM1 of the laminated body MCS illustrated in FIG. 43 are detected (recognized). Also, the position of the logic chip LC and the position of the laminated body MCS are calculated based on the detection result of the marks AM4 and the marks AM1, and the position adjustment is performed by operating the holding jig 30. As the method of detecting the marks AM4 and the marks AM1, the marks AM4 and the marks AM1 can be optically detected by using an optical device such as an image sensor.

Here, as illustrated in FIG. 43, since the alignment marks AMS are formed in the wiring substrate 20, a method of performing the alignment by using the alignment marks AMS of the wiring substrate 20 without forming the marks AM4 on the rear surface 3b of the logic chip LC may be considered.

However, even when the high-accuracy alignment is performed in the first chip mounting process described above, misalignment occurs in the positions (coordinate positions of an XY plane illustrated in FIG. 32) or angle (θ-direction angle illustrated in FIG. 32) of the plurality of rear electrodes 3bp. For example, after the first alignment process, misalignment may occur during the process of transferring the logic chip LC toward the wiring substrate 20 or when the holding jig 30 illustrated in FIG. 35 is switched to the bonding jig 31 illustrated in FIG. 36.

Therefore, when the position of the laminated body MCS is aligned by using the alignment marks AMS of the wiring substrate 20 in the present process, the misalignment amount of the external terminals 7 of the laminated body MCS and the rear electrodes 3bp of the logic chip LC is the sum of the misalignment amount of the wiring substrate 20 and the logic chip LC and the misalignment amount of the wiring substrate 20 and the laminated body MCS. Namely, the misalignment amount of the external terminals 7 of the laminated body MCS and the rear electrodes 3bp of the logic chip LC is larger than the misalignment amount of each of the semiconductor chips 3 in some cases.

Therefore, in the present embodiment, as described above, the marks AM4 are formed on the rear surface 3b of the logic chip LC, and the laminated body MCS and the logic chip LC are aligned by using the marks AM4. Accordingly, the misalignment amount of the external terminals 7 of the laminated body MCS and the rear electrodes 3bp of the logic chip LC falls within the range of the misalignment amount between the laminated body MCS and the logic chip LC.

Also, in the example illustrated in FIG. 43, a plurality of marks AM4 are formed on the logic chip LC, and a plurality of marks AM1 are formed on the front surface 3a side of the laminated body MCS. By forming the plurality of alignment marks on the rear surface 3b of the logic chip LC and the front surface 3a of the laminated body MCS and detecting the respective positions of the plurality of alignment marks in this manner, θ-direction data indicating a slope of a coordinate axis can be obtained in addition to coordinate data of an XY plane illustrated in FIG. 41. Also, if the coordinate data of the alignment marks and the θ-direction data are obtained, the positions of the plurality of rear electrodes 3bp of the logic chip LC (see FIG. 10) or the positions of the plurality of front electrodes 3*ap* of the laminated body MCS (see FIG. 7) can be accurately calculated.

Also, as illustrated in FIG. 10, the plurality of marks AM4 are arranged at opposite corner portions so as to be arranged on one diagonal line of the rear surface 3*b* forming a rectangle when seen in a plan view. Also, as illustrated in FIG. 7, the plurality of marks AM1 are arranged at opposite corner portions so as to be arranged on one diagonal line of the front surface 3*a* forming a rectangle when seen in a plan view. By arranging the marks AM at the corner portions diagonal to each other, the accuracy of the θ-direction data can be improved. As a result, it is possible to improve accuracy of calculating the positions of the plurality of rear electrodes 3*bp* (see FIG. 10) or the positions of the plurality of front electrodes 3*ap* (see FIG. 7).

Also, in the second alignment process, relative positions of the laminated body MCS and the logic chip LC (in other words, the wiring substrate 20) are moved along the top surface 2*a* of the wiring substrate 20, so that the plurality of rear electrodes 3*bp* of the logic chip LC and the plurality of external terminals 7 formed on the front surface 3*a* of the laminated body MCS are arranged to face each other.

As described above, according to the present embodiment, the positions of the plurality of rear electrodes 3*bp* of the logic chip LC and the positions of the plurality of front electrodes 3*ap* of the laminated body MCS can be calculated with high accuracy. Therefore, the alignment can be performed with high accuracy by moving the relative positions of the laminated body MCS and the logic chip LC based on these calculated data.

As the method of moving the relative positions of the laminated body MCS and the logic chip LC, there is a method of moving the holding jig 30 that holds the laminated body MCS along the top surface 2*a* of the wiring substrate 20. However, since it is only necessary to move the relative positional relationship between the laminated body MCS and the logic chip LC, either or both of the laminated body MCS and the logic chip LC can be moved.

Subsequently, as illustrated in FIG. 44, the laminated body MCS is moved toward the logic chip LC. The relative positions of the laminated body MCS and the logic chip LC are accurately aligned by the above-described second alignment process. Therefore, if the laminated body MCS is linearly moved toward the logic chip LC, the state where the plurality of rear electrodes 3*bp* of the logic chip LC and the plurality of external terminals 7 formed on the front surface 3*a* of the laminated body MCS are arranged to face each other can be maintained.

Subsequently, as illustrated in FIG. 45, the laminated body MCS is pressed toward the logic chip LC by pressing the bonding jig 31 to the rear surface 3*b* of the laminated body MCS. At this time, since the adhesive NCL2 is in a soft state before being cured, the laminated body MCS approaches to the logic chip LC when the laminated body MCS is pressed by the bonding jig 31. When the laminated body MCS approaches to the logic chip LC, the tips of the plurality of external terminals 7 formed in the front surface 3*a* of the laminated body MCS (specifically, the solder materials 7*a*) contact the bonding regions of the rear electrodes 3*bp* (specifically, the solder materials 7*a*).

Also, the adhesive NCL2 applied between the laminated body MCS and the logic chip LC is spread along the rear surface 3*b* of the logic chip LC. In the example illustrated in FIG. 45, the adhesive NCL2 is spread up to the peripheral portion of the logic chip LC to cover the side surface of the logic chip LC and the side surface of the adhesive NCL1. In this case, since the contact area of the adhesive NCL2 and the semiconductor chip 3 is increased, the adhesive strength between the adhesive NCL2 and the semiconductor chip 3 (the laminated body MCS and the logic chip LC) can be improved.

Subsequently, the laminated body MCS and the adhesive NCL2 are heated through the bonding jig (heating jig) 31 in a state in which the laminated body MCS is pressed to the bonding jig 31 as illustrated in FIG. 45. In the bonding portions of the laminated body MCS and the logic chip LC, the solder materials 7*a* of the external terminals are melted and bonded to the rear electrodes 3*bp* of the logic chip LC. Namely, by heating the laminated body MCS through the bonding jig (heating jig) 31, the plurality of front electrodes 3*ap* of the laminated body MCS and the plurality of rear electrodes 3*bp* of the logic chip LC are electrically connected to each other via the plurality of solder materials 7*a*.

Also, the adhesive NCL2 is cured by heating. As described above in the first chip mounting process, it is unnecessary to completely cure the adhesive NCL1 by heat from the bonding jig (heating jig) 31. An embodiment in which a part of the thermosetting resin contained in the adhesive NCL1 is cured (temporary curing) to the extent that can fix the laminated body MCS, and then the logic chip LC is transferred to a heating furnace (not illustrated) to cure the remaining thermosetting resin (main curing) is also applicable. The time is required until the completion of the main curing to cure the entire thermosetting resin component contained in the adhesive NCL1, but the manufacturing efficiency can be improved by performing the main curing process in the heating furnace.

Here, the warpage deformation occurring in the semiconductor chip 3 described above with reference to FIGS. 11 and 12 occurs in the main curing (as illustrated in FIG. 45, the process of pressing the laminated body MCS toward the logic chip LC of the process of heating in the pressed state). However, according to the present embodiment, as described above, the protrusion height of the mark AM4 with respect to the rear surface 3*b* of the logic chip LC is smaller than a protrusion height of the rear electrode 3*bp* with respect to the rear surface 3*b* of the logic chip LC. Therefore, even in the case where the warpage deformation occurs in the logic chip LC like in the mode illustrated in FIG. 11, in the case where the warpage deformation occurs in the laminated body MCS like in the mode illustrated in FIG. 12 or in the case where the warpage deformation occurs in both modes in combination, the contact of the mark AM4 and the laminated body MCS can be suppressed.

<Sealing Process>

Figure 46:
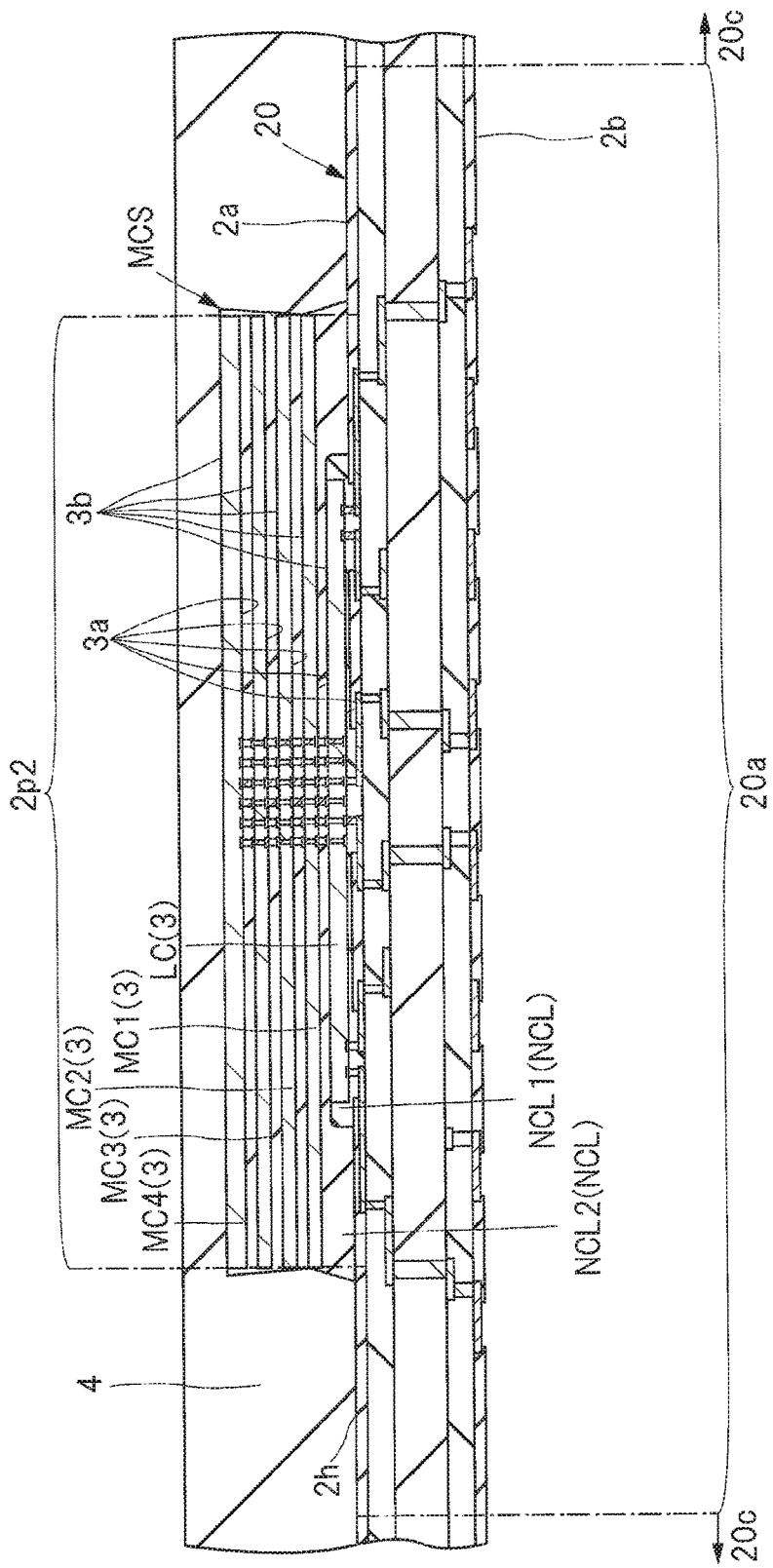
FIG. 46 is an enlarged sectional view illustrating a state in which a sealing body is formed on a wiring substrate illustrated in FIG. 42 and a plurality of laminated semiconductor chips are sealed.

Subsequently, in the sealing process illustrated in FIG. 16, as illustrated in FIG. 46, a sealing body 4 is formed by sealing the top surface 2*a* of the wiring substrate 20, the logic chip LC and the laminated body MCS of the plurality of memory chips MC1, MC2, MC3 and MC4. FIG. 46 is an enlarged sectional view illustrating a state in which the sealing body is formed on the wiring substrate illustrated in FIG. 42 and the plurality of laminated semiconductor chips are sealed. Also, FIG. 47 is a plan view illustrating the entire configuration of the sealing body illustrated in FIG. 46.

Figure 47:
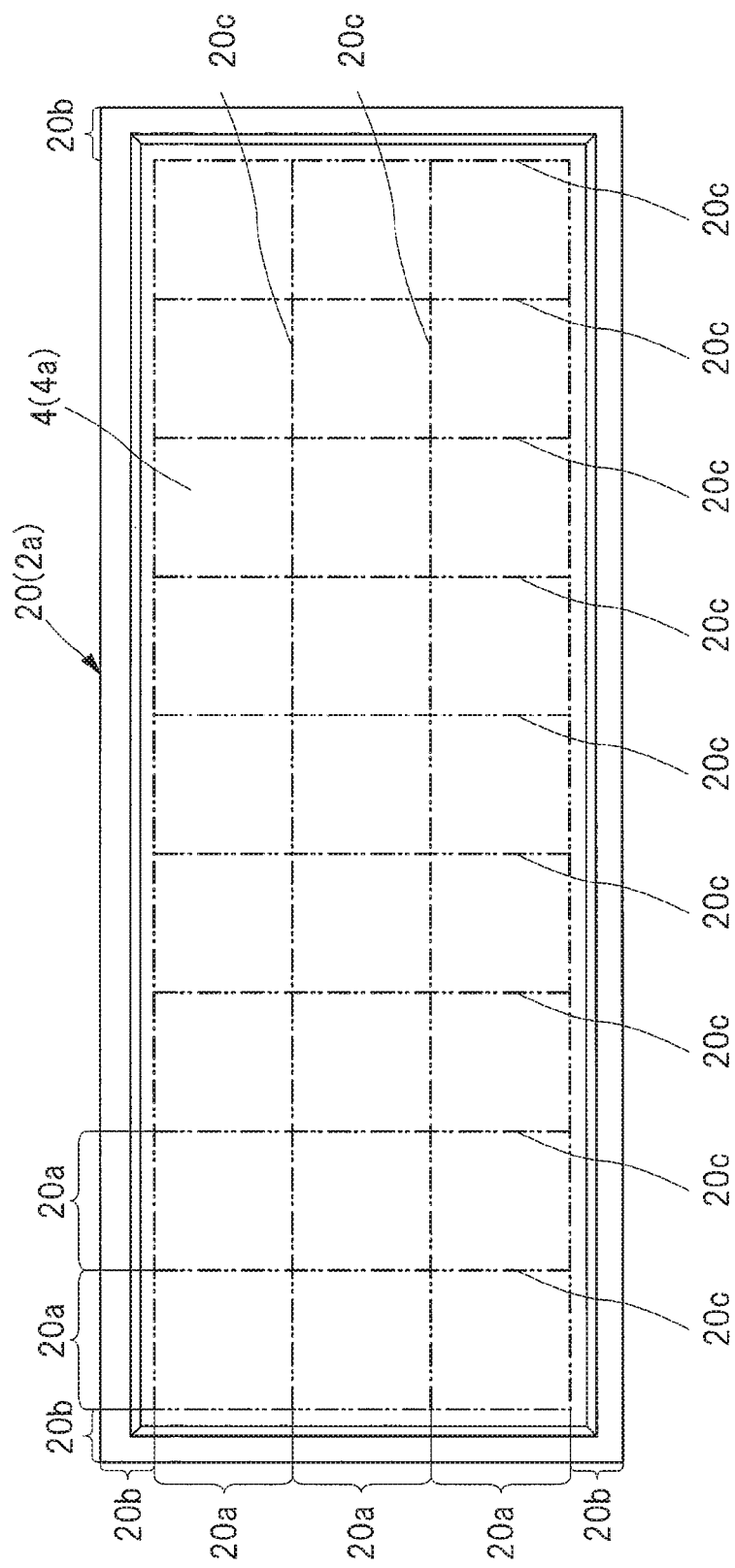
FIG. 47 is a plan view illustrating an entire configuration of the sealing body illustrated in FIG. 46.

According the present embodiment, as illustrated in FIG. 47, the sealing body 4 in which the plurality of device regions 20*a* are collectively sealed is formed. This method of forming the sealing body 4 is referred to a collective sealing (block molding) method, and a semiconductor package manufactured by the collective sealing method is referred to as a MAP (Multi Array Package) semiconductor device. In the collective sealing method, since the interval of the device regions 20a can be reduced, an effective area of one wiring substrate 20 is increased. Namely, the number of products that can be obtained from one wiring substrate 20 is increased. Thus, the efficiency of the manufacturing process can be improved by increasing the effective area of one wiring substrate 20.

Also, in the present embodiment, the sealing body 4 is formed by a so-called transfer mold method in which a heat-softened resin is pressed into a mold (not illustrated) and the resin is then thermally cured. As compared to a sealing body obtained by curing a liquid resin like the sealing body 6 that seals the laminated body MCS illustrated in FIG. 46, the sealing body 4 formed by the transfer mold method has high durability, and thus the sealing body 4 is suitable as a protective member. Also, the function of the sealing body 4 (for example, resistance to the warpage deformation) can be improved by mixing filler particles such as silica (silicon dioxide: $SiO_2$) particles with the thermosetting resin.

In the present embodiment, the bonding portions (electrical connection portions) of the plurality of laminated semiconductor chips 3 are sealed by the adhesives NCL1 and NCL2 and the sealing body 6. Therefore, an embodiment in which the sealing body 4 is not formed is also applicable as the modification example. In this case, the present sealing body process can be omitted.

<Ball Mounting Process>

Figure 48:
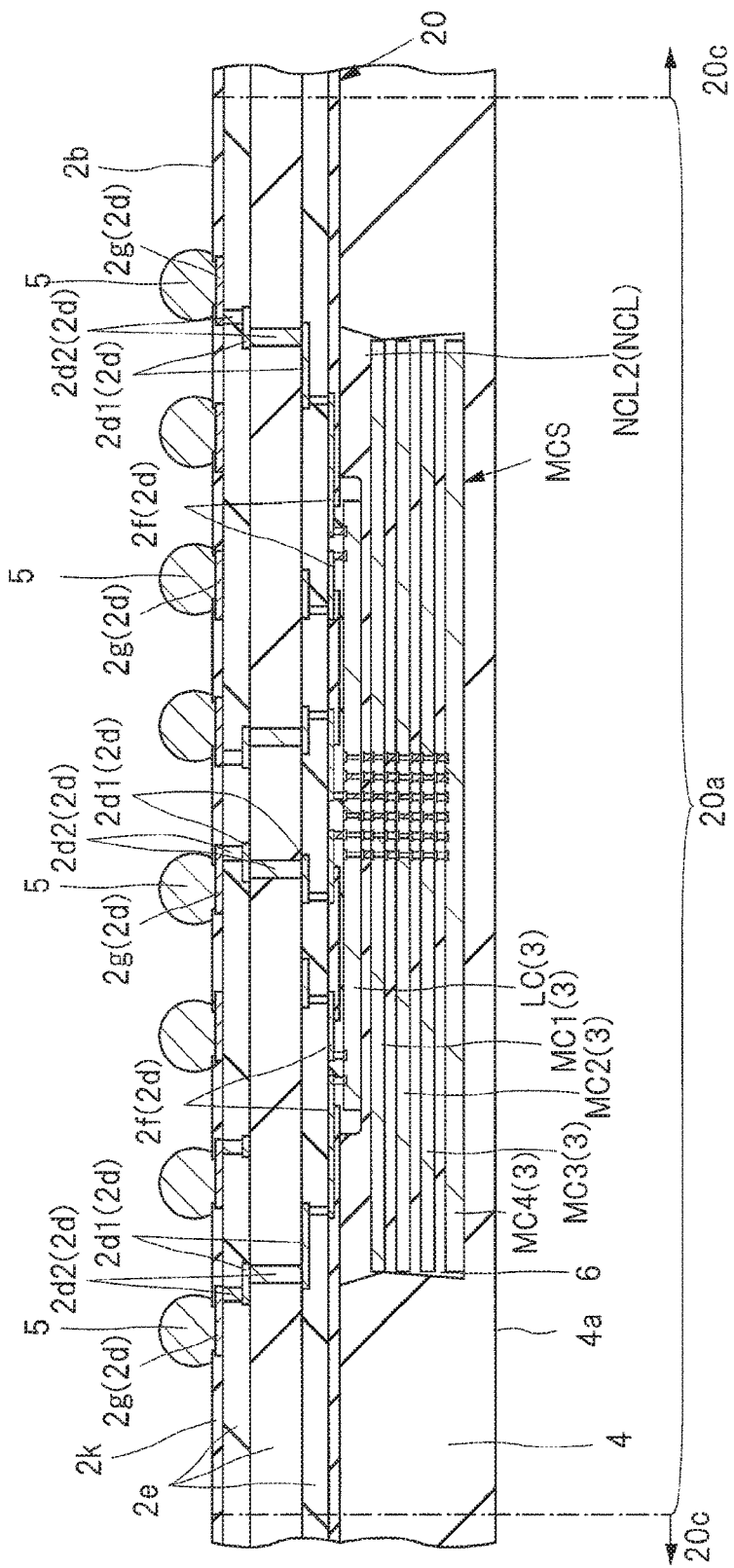
FIG. 48 is an enlarged sectional view illustrating a state in which solder balls are bonded on a plurality of lands of a wiring substrate illustrated in FIG. 46.

Subsequently, in the ball mounting process illustrated in FIG. 16, as illustrated in FIG. 48, the plurality of solder balls 5 to be external terminals are bonded to the plurality of lands 2g formed on the bottom surface 2b of the wiring substrate 20. FIG. 48 is an enlarged sectional view illustrating a state in which the solder balls are bonded on the plurality of lands of the wiring substrate illustrated in FIG. 46.

In the present process, after the wiring substrate 20 is turned upside down as illustrated in FIG. 48, the solder balls 5 are arranged on the plurality of lands 2g exposed on the bottom surface 2b of the wiring substrate 20, and then, the plurality of solder balls 5 and the lands 2g are bonded to each other by heating. By the present process, the plurality of solder balls 5 are electrically connected to the plurality of semiconductor chips 3 (the logic chip LC and the memory chips MC1, MC2, MC3 and MC4) via the wiring substrate 20. However, the application of the technique described in the present embodiment is not limited to a so-called ball grid array (BGA) semiconductor device in which the solder balls 5 are bonded in an array form. For example, as a modification example of the present embodiment, a so-called land grid array (LGA) semiconductor device which is shipped in a state in which the lands 2g are exposed without forming the solder balls 5 or in a state in which a solder paste thinner than the solder balls 5 is coated on the land 2g is also applicable. In the case of the LGA semiconductor device, the ball mounting process can be omitted.

<Dicing Process>

Figure 49:
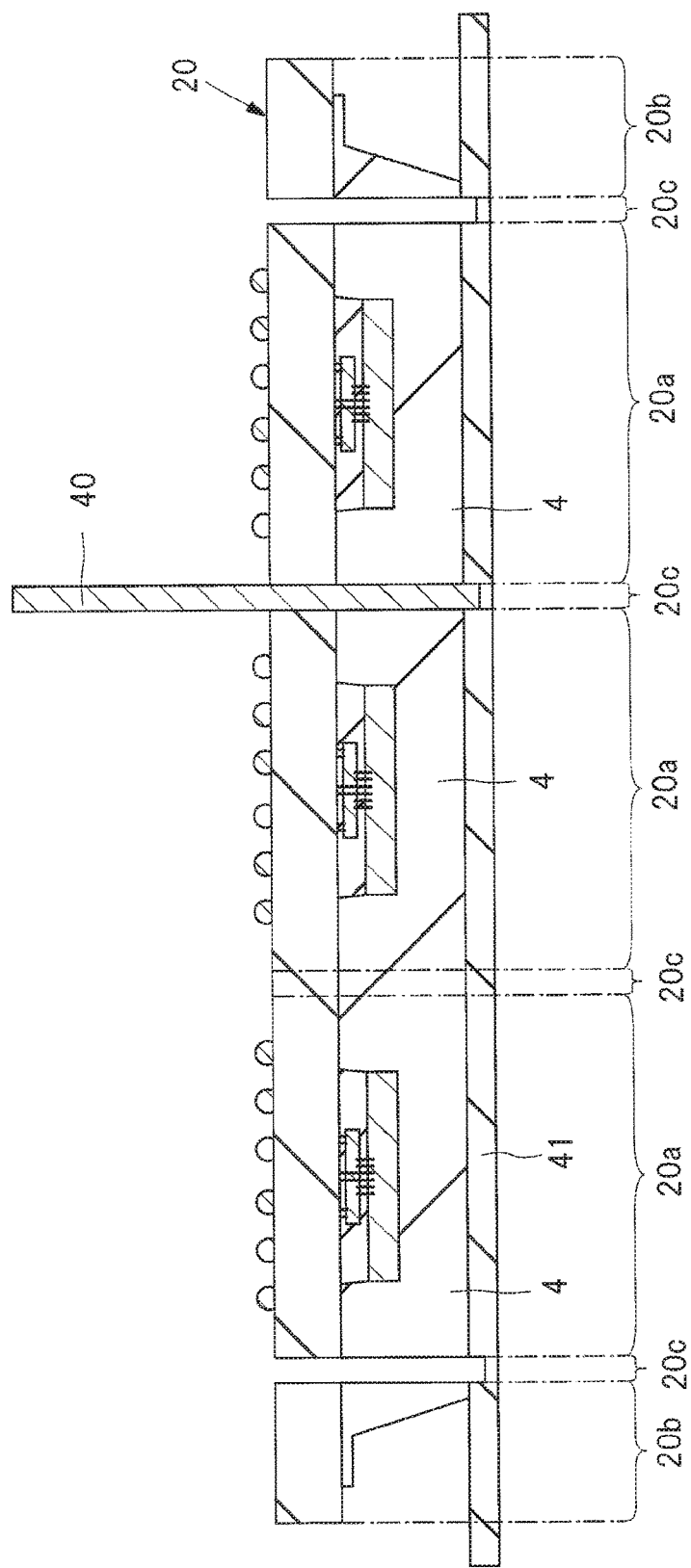
FIG. 49 is a sectional view illustrating a state in which a multi-piece wiring substrate illustrated in FIG. 48 is diced.

Subsequently, in the dicing process illustrated in FIG. 16, the wiring substrate 20 is divided into device regions 20a as illustrated in FIG. 49. FIG. 49 is a sectional view illustrating a state in which a multi-piece wiring substrate illustrated in FIG. 48 is diced. In the present process, as illustrated in FIG. 49, the wiring substrate 20 and the sealing body 4 are cut along the dicing lines (dicing regions) 20c to obtain a plurality of diced semiconductor devices 1 (see FIG. 4). The cutting method is not particularly limited, but the example illustrated in FIG. 49 illustrates an embodiment in which the wiring substrate 20 and the sealing body 4 bonded and fixed to a tape material (dicing tape) 41 are cut by using a dicing blade (rotating blade) 40 from the bottom surface 2b of the wiring substrate 20. However, the application of the technique described in the present embodiment is not limited to a case of using the wiring substrate 20 that is the multi-piece substrate including the plurality of device regions 20a. For example, the technique can be applied also to a semiconductor device in which a plurality of semiconductor chips 3 are laminated on the wiring substrate 2 (see FIG. 4) corresponding to one semiconductor device. In this case, the dicing process can be omitted.

The semiconductor device 1 described above with reference to FIGS. 1 to 15 can be obtained by the above-described processes. Thereafter, necessary inspections and tests such as an appearance inspection and an electrical test are performed, and the semiconductor device is then shipped or is mounted on a packaging board (not illustrated).

Second Embodiment

In the embodiment above, the technique in which the protrusion height of the metal pattern formed in the peripheral portion of the rear surface 3b of the semiconductor chip 3A mounted on the lower stage is made smaller than the protrusion height of the plurality of rear electrodes 3bp, thereby suppressing the contact between the metal pattern and the semiconductor chip 3B of the upper stage even when the warpage deformation occurs has been described. Also, in the embodiment above, the alignment marks has been described as an example of the metal pattern formed in the peripheral portion of the rear surface 3b of the semiconductor chip 3A.

However, the metal pattern formed in the periphery of the region (electrode group forming region) 3b1 (see FIG. 13) where the plurality of rear electrodes 3bp are formed is not limited to the alignment marks. For example, a metal pattern (dummy pattern) electrically isolated from the circuit of the semiconductor chip 3 like the dummy pattern DPa illustrated in FIG. 7 and the dummy pattern DPb illustrated in FIG. 8 is formed in some cases. Also, as described in the second chip preparing process of the above-described embodiment, the dummy pattern may be used for various purposes other than the purpose of suppressing the inclination when the semiconductor chips 3 are laminated. In the present embodiment, a case where the plurality of dummy patterns are formed on the rear surface 3b of the semiconductor chip 3B will be described.

Figure 50:
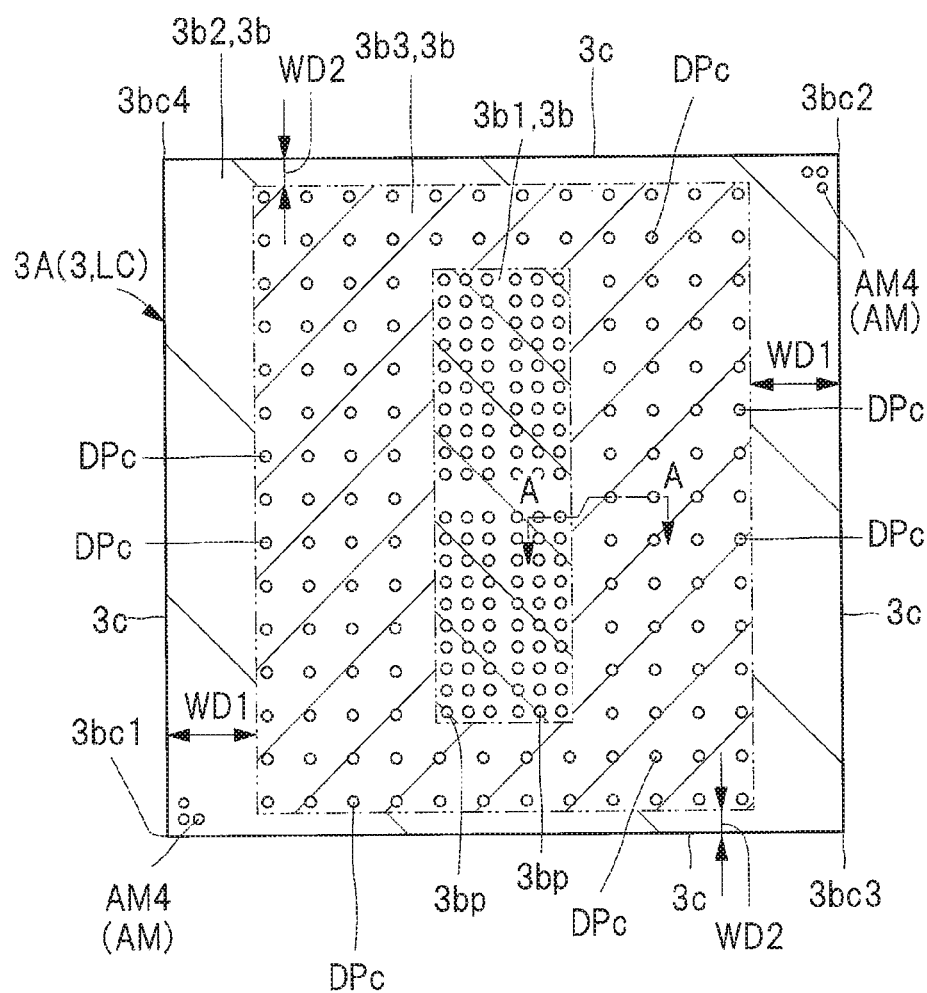
FIG. 50 is a plan view illustrating a rear surface side of a logic chip that is a modification example of FIG. 13.
Figure 51:
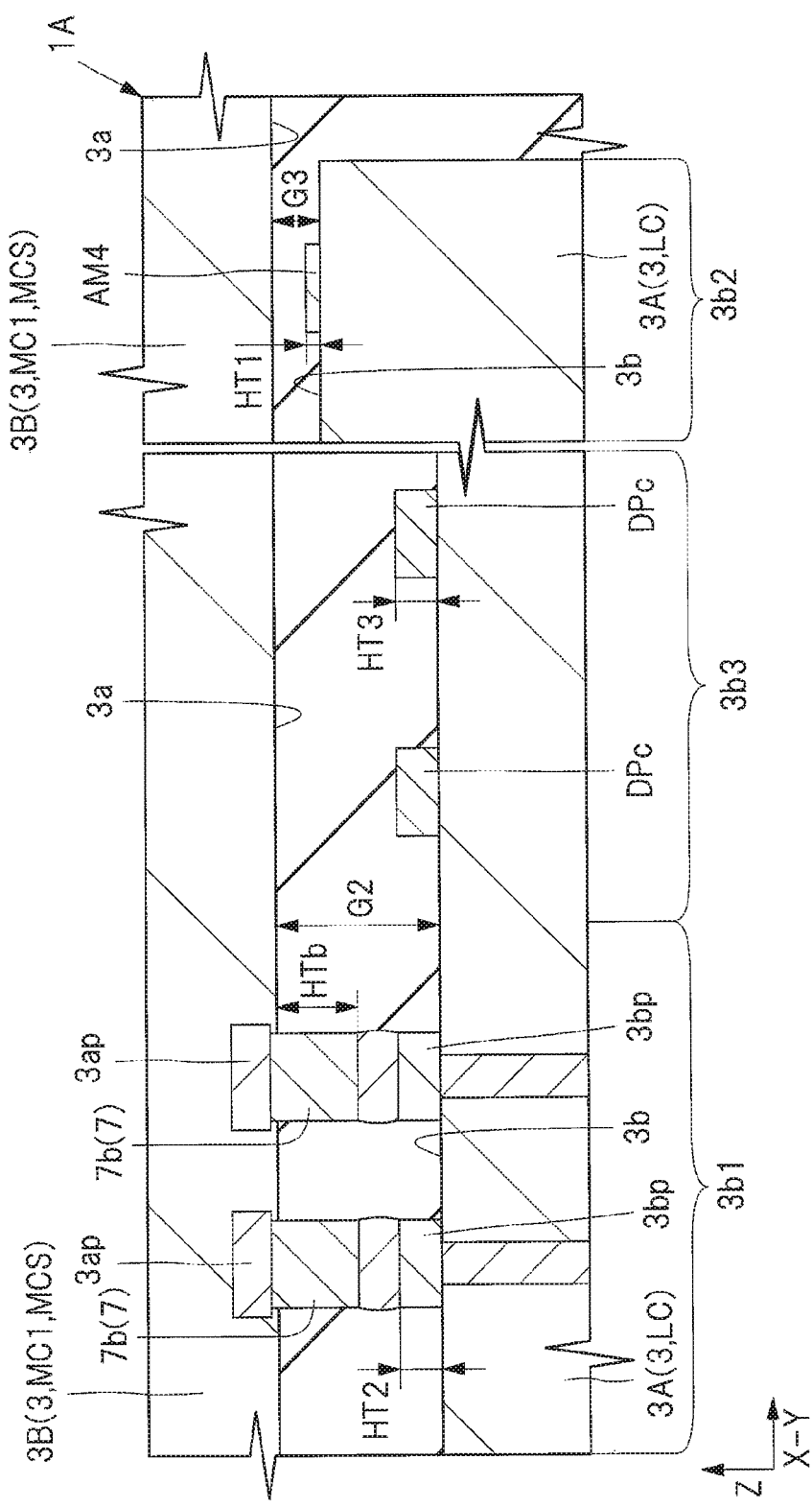
FIG. 51 is an enlarged sectional view taken along a line A-A of FIG. 50.
Figure 52:
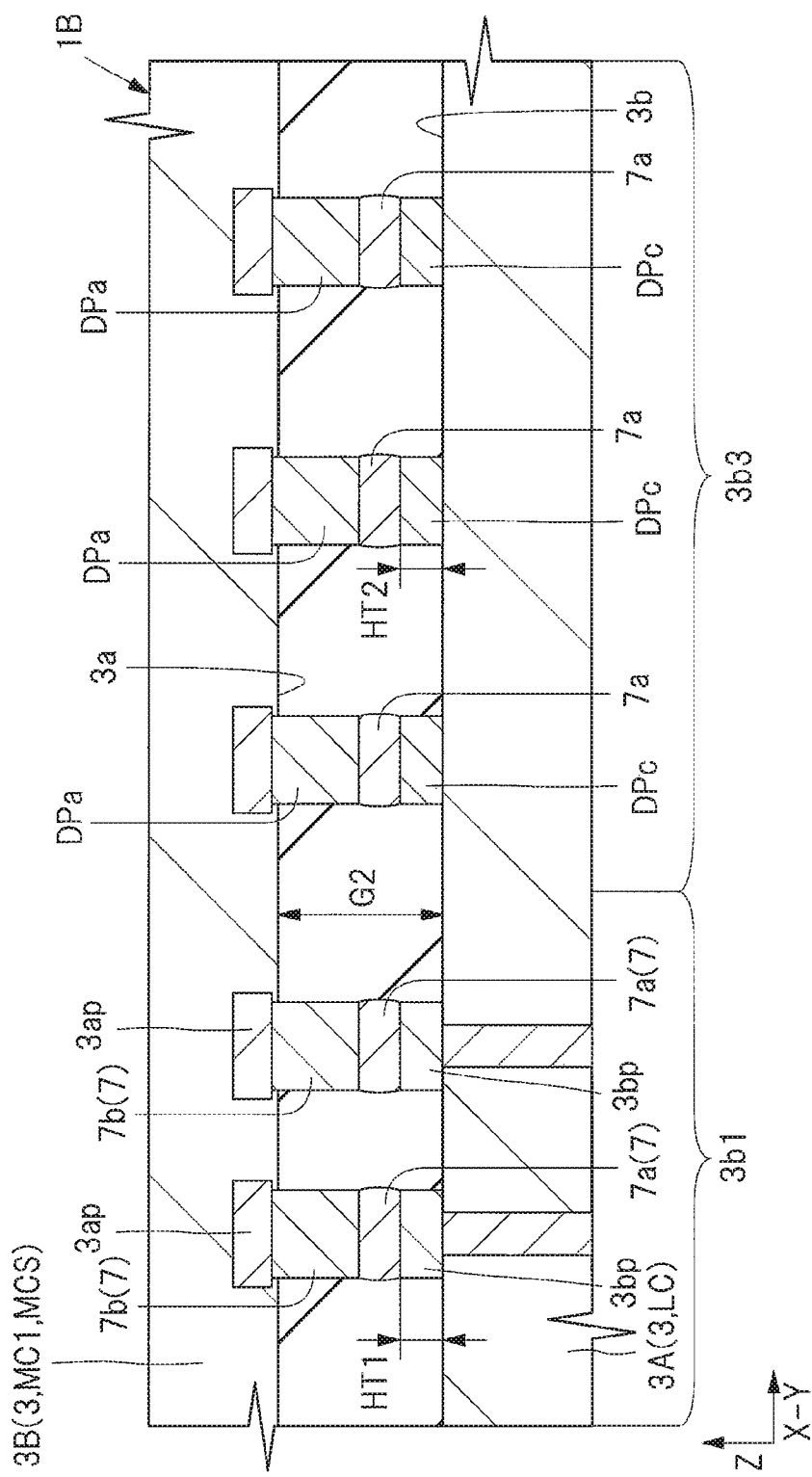
FIG. 52 is an enlarged sectional view illustrating a semiconductor device that is a modification example of FIG. 51.

FIG. 50 is a plan view illustrating a rear surface of a logic chip that is a modification example of FIG. 13. Also, FIG. 51 is an enlarged sectional view taken along a line A-A of FIG. 50. Also, FIG. 52 is an enlarged sectional view illustrating a semiconductor device that is a modification example of FIG. 51. Although FIG. 50 is a plan view, for easier viewing of the boundaries of a region 3b1, a region 3b2 and a region 3b3, each region is denoted by different hatches, and the boundary of each region is denoted by two-dot chain line. Also, in FIG. 51, for clarifying a difference of a protrusion height between a mark AM4 and a dummy pattern DPc, the cross-section of the mark AM4 enlarged at the same magnification is illustrated next to the enlarged cross-section taken along the line A-A of FIG. 50.

The semiconductor device 1A (see FIG. 51) of the present embodiment is different from the first embodiment in the configuration of the rear surface 3b of the logic chip LC. Since the others are the same as the semiconductor device 1 described above in the first embodiment, redundant descriptions thereof will be omitted.

As illustrated in FIG. 50, a plurality of rear electrodes 3*bp* are formed in a central region (electrode group forming region) 3*b*1 of the rear surface 3*b* of the logic chip LC of the present embodiment (in other words, the semiconductor chip 3A mounted on the lower stage). Also, in the rear surface 3*b*, the mark AM4 serving as the alignment mark is formed in the region 3*b*2 on the peripheral side relative to the region 3*b*1, but the rear electrode 3*bp* is not formed. Also, in the rear surface 3*b*, the plurality of dummy patterns (metal patterns, dummy patterns, metal pads) DPc are formed in the region 3*b*3 between the region 3*b*1 and the region 3*b*2. The dummy patterns DPc are metal patterns made of the same metal material as the plurality of rear electrodes 3*bp*. Also, the plurality of dummy patterns DPc of the rear surface 3*b* have the same configuration as the plurality of rear electrodes 3*bp* except that the dummy patterns DPc are electrically isolated from the circuit formed in the logic chip LC.

The region 3*b*3 where the plurality of dummy patterns DPc are formed is arranged to surround the periphery of the region 3*b*1, and the plurality of dummy patterns DPc are regularly arranged in the region 3*b*3 (a matrix form in the example illustrated in FIG. 50). When the dummy patterns DPc having the same configuration as the rear electrodes 3*bp* are regularly arranged around the plurality of rear electrodes 3*bp* as illustrated in FIG. 50, it is possible to improve the film quality of the metal film constituting the rear electrodes 3*bp* in the process of forming the rear electrodes 3*bp*.

As described above in the first chip preparing process of the first embodiment, the rear electrodes 3*bp* are formed by precipitating a metal by, for example, the electrolytic plating method. At this time, in the case where the plurality of rear electrodes 3*bp* are collectively formed by the electrolytic plating method, the film quality of the metal film can be improved by uniformizing the distribution of current density of each of the plurality of electrode forming positions. Therefore, in the case where the dummy patterns DPc having the same configuration as the rear electrodes 3*bp* are regularly arranged around the plurality of rear electrodes 3*bp* like in the present embodiment, the current density in the region 3*b*1 can be uniformized. As a result, the film quality of the rear electrodes 3*bp* is improved, and the reliability of the electrical characteristics of the semiconductor device is improved.

As described above, from the viewpoint of improving the film quality of the plurality of rear electrodes 3*bp*, it is preferable to regularly arrange the dummy patterns DPc, but if the dummy patterns DPc are formed in a wide range, there arises a problem that the dummy patterns DPc contact the semiconductor chip 3 (for example, the laminated body MCS illustrated in FIG. 4) mounted on the logic chip LC.

When the plurality of rear electrodes 3*bp* described above with reference to FIGS. 25 to 31 of the first embodiment are formed, the dummy patterns DPc are collectively formed together with the rear electrodes 3*bp* by the same forming method as the rear electrodes 3*bp*. Therefore, as illustrated in FIG. 51, the protrusion height (thickness) HT2 of the rear electrode 3*bp* with respect to the rear surface 3*b* is equal to the protrusion height (thickness) HT3 of the dummy pattern DPc with respect to the rear surface 3*b*. In other words, the protrusion height HT2 of the rear electrode 3*bp* and the protrusion height HT3 of the dummy pattern DPc are larger than the protrusion height (thickness) HT1 of the mark AM4 with respect to the rear surface 3*b*.

Therefore, in the present embodiment, as illustrated in FIG. 50, the range to form the plurality of dummy patterns DPc is limited to the region 3*b*3, and the dummy patterns DPc are not formed in the region 3*b*2 existing on the peripheral side relative to the region 3*b*3. Specifically, in the rear surface 3*b* of the logic chip LC, the region 3*b*3 is formed to surround the region 3*b*1 arranged in the central portion, and the region 3*b*2 is arranged to further surround the periphery of the region 3*b*3. In addition, the plurality of rear electrodes 3*bp* electrically connected to the circuit included in the logic chip LC are formed in the region 3*b*1 and are not formed in the regions 3*b*3 and 3*b*2. Also, the plurality of dummy patterns DPc whose protrusion height HT3 with respect to the rear surface 3*b* (see FIG. 51) is equal to the protrusion height HT2 of the plurality of rear electrodes 3*bp* (see FIG. 51) are formed in the region 3*b*3 and are not formed in the region 3*b*2.

Also, in the region 3*b*2 which includes the outer periphery of the rear surface 3*b* and in which the dummy patterns DPc are not formed, a distance (separation distance) G3 between the rear surface 3*b* of the semiconductor chip 3A and the front surface 3*a* of the semiconductor chip 3B is smaller than a protrusion height HTb of the protrusion electrode 7*b* with respect to the front surface 3*a* of the memory chip MCS. In other words, the distance G3 is smaller than the thickness of the protrusion electrode 7*b*. Therefore, if the metal patterns having the same thickness as the rear electrodes 3*bp* are formed in the region 3*b*2, there is a probability that the metal patterns contact the semiconductor chip 3B. However, in the present embodiment, since the dummy patterns DPc are not formed in the region where the distance G3 is smaller than the protrusion height HTb of the protrusion electrode 7*b*, it is possible to suppress the damage caused by the contact between the semiconductor chip 3B and the dummy patterns DPc.

As a modification example of FIG. 50, an embodiment in which the dummy patterns DPc are formed in the region 3*b*1 may be considered. However, from the viewpoint of securing the space for arranging the plurality of rear electrodes 3*bp*, it is preferable that the dummy patterns DPc are not formed in the region 3*b*1.

Also, the expression "the dummy patterns DPc are not formed in the region 3*b*2" means that the metal patterns whose protrusion height HT3 with respect to the rear surface 3*b* is equal to or larger than the protrusion height HT2 of the rear electrode 3*bp* are not formed. Therefore, an embodiment in which the metal patterns whose protrusion height is smaller than that of the dummy patterns DPc are formed in the region 3*b*2 may not be excluded. For example, in the example illustrated in FIG. 50, the marks AM4 whose protrusion height HT1 is smaller than the protrusion height HT2 of the rear electrodes 3*bp* are formed in the region 3*b*2.

However, from the viewpoint of suppressing the contact between the semiconductor chip 3 mounted on the upper stage and the metal patterns, it is preferable that the metal patterns are not formed in the region 3*b*2 including the marks AM4 illustrated in FIG. 50. In this case, the alignment marks are formed in the region 3*b*3. Alternatively, in the second chip mounting process described in the above embodiment, the alignment is performed by using the alignment marks formed in the wiring substrate. Alternatively, in the case where the marks AM4 are formed to be embedded in the semiconductor substrate as described in the embodiment above with reference to FIG. 15, the protrusion height of the marks AM4 with respect to the rear surface 3*b* can be reduced to the extent regarded as "zero", and thus it is preferable to form the marks AM4 in the region 3*b*2 in this case.

Also, in the case where the region 3*b*1 in which the electrode group including the plurality of rear electrodes 3*bp* is arranged extends in one direction like in the present embodiment, the degree of warpage on the extension line in the extension direction of the region 3b1 (Y direction in the example of FIG. 50) is smaller than the degree of warpage on the extension line in the direction (X direction in the example of FIG. 50) perpendicular to the extension direction of the region 3b1. Namely, in the example illustrated in FIG. 50, a relatively large warpage deformation occurs along the X direction.

Therefore, as illustrated in FIG. 50, it is preferable that the shape of the region 3b2 where the dummy patterns DPc are not formed has the following configuration. That is, a width WD1 of the region 3b2 in the X direction perpendicular to the extension direction of the electrode group is larger than a width WD2 of the region 3b2 in the Y direction along the extension direction of the electrode group. Accordingly, since the dummy patterns DPc are not formed at the positions where the warpage deformation amount is relatively large, it is possible to suppress the contact between the dummy patterns DPc and other semiconductor chips 3. Also, since the dummy patterns DPc can be formed on the extension line in the extension direction of the electrode group, it is possible to improve the film quality of the rear electrodes 3bp formed in the end portion in the extension direction of the electrode group.

The plurality of dummy patterns DPc illustrated in FIGS. 50 and 51 can be formed by using any one of methods of forming the rear electrodes 3bp described above in the first embodiment. Therefore, redundant descriptions thereof will be omitted.

As described above, according to the present embodiment, the film quality of the metal films constituting the rear electrodes 3bp can be improved by forming the dummy patterns DPc made of the same metal film as the rear electrodes 3bp in the periphery of the plurality of rear electrodes 3bp of the logic chip LC.

Also, according to the present embodiment, the protrusion height HT3 of the dummy patterns DPc with respect to the rear surface 3b is equal to the protrusion height HT2 of the rear electrodes 3bp, but the dummy patterns DPc are not formed in the region 3b2 including the outer periphery of the rear surface 3b. Namely, the dummy patterns DPc are not formed in the region that is particularly likely to contact the semiconductor chip 3 of the upper stage when warpage deformation occurs in the semiconductor chip 3. Accordingly, it is possible to suppress the contact between the dummy patterns DPc and the memory chip MC1.

By the way, as illustrated in FIG. 7 described above in the first embodiment, on the front surfaces 3a of the memory chips MC1, MC2, MC3 and MC4, the plurality of dummy patterns DPa are formed around the region where the plurality of front electrodes 3ap are formed and at the positions that do not overlap the memory region MR when seen in a plan view. The plurality of dummy patterns DPa are metal patterns made of the same metal as the protrusion electrodes 7b bonded to the plurality of front electrodes 3ap illustrated in FIG. 39.

From the viewpoint of suppressing the dummy patterns DPa from contacting the rear surface 3b of the logic chip LC illustrated in FIG. 4, it is preferable that the dummy patterns DPa are not formed on the front surface 3a of the memory chip MC1 mounted to face the logic chip LC. However, the manufacturing efficiency of the memory chips MC1, MC2 and MC3 can be improved by forming the memory chips MC1, MC2 and MC3 to have the same configuration. Therefore, from the viewpoint of the manufacturing efficiency, it is preferable that the plurality of dummy patterns DPa are formed on the front surface 3a of the memory chip MC1.

Thus, the dummy patterns DPa formed on the front surface 3a of the memory chip MC1 and the dummy patterns DPc formed on the rear surface 3b of the logic chip LC may be arranged to face each other and may be connected to each other via the solder materials 7a like in the semiconductor device 1B illustrated in FIG. 52 which is a modification example of the semiconductor device 1A illustrated in FIG. 51.

In the semiconductor device 1B, the plurality of dummy patterns DPc are regularly arranged in the region 3b3 of the rear surface 3b of the logic chip LC like in the example illustrated in FIG. 50. Also, some of the plurality of dummy patterns DPc are formed at the positions opposite to the dummy patterns DPa of the front surface 3a of the memory chip MC1 illustrated in FIG. 51. Then, the dummy patterns DPa and the dummy patterns DPc arranged to face each other are mechanically connected to each other via the solder materials 7a.

According to the configuration of the semiconductor device 1B, since the dummy patterns DPa and the dummy patterns DPc are mechanically connected to each other, it is possible to suppress the dummy patterns DPa from contacting the logic chip LC even when the dummy patterns DPa are formed in the memory chip MC1.

Also, according to the configuration of the semiconductor device 1B, in the second chip mounting process described above in the first embodiment, the dummy patterns DPa of the front surface 3a and the dummy patterns DPc of the rear surface 3b of the logic chip LC are connected to each other via the solder materials 7a when the plurality of protrusion electrodes 7b of the memory chip MC1 and the plurality of rear electrodes 3bp of the logic chip LC are connected to each other via the solder materials 7a. Accordingly, when the laminated body MCS is laminated on the logic chip LC, the dummy patterns DPa and DPc function to suppress the inclination, and it is thus possible to suppress the laminated body MCS from being inclined on the logic chip LC.

Also, according to the configuration of the semiconductor device 1B, since the dummy patterns DPa and the dummy patterns DPc are mechanically connected to each other, it is possible to reduce the degree of warpage deformation occurring in the semiconductor chip 3 in the periphery of the dummy patterns DPa and DPc. Therefore, in the case where the plurality of dummy patterns DPa and DPc are arranged to face each other, it is only necessary to connect some of the plurality of dummy patterns DPa and DPc via the solder materials 7a instead of connecting all of the plurality of dummy patterns DPa and DPc. However, from the viewpoint of stably suppressing the warpage deformation, when the plurality of dummy patterns DPa are formed, it is preferable that the dummy patterns DPc are formed at the positions respectively corresponding to all of the dummy patterns DPa and are connected via the solder materials 7a.

MODIFICATION EXAMPLE

In the foregoing, the invention made by the inventors of the present invention has been concretely described based on the embodiments. However, it is needless to say that the present invention is not limited to the foregoing embodiments and various modifications and alterations can be made within the scope of the present invention.

First Modification Example

For example, in the embodiment above, a technique in which the contact with the semiconductor chip 3 of the upper stage is suppressed by reducing the height of the mark AM2 or providing the region where the dummy patterns DPc are not formed in a state in which the warpage deformation has occurred in the semiconductor chip 3 has been described. However, the technique above is not limited to the case where the warpage deformation has occurred, but is a technique that is effectively applied to the case where it is feared that the warpage deformation will occur. Therefore, as a modification example of the semiconductor device exemplarily illustrated in FIG. 14, 15 or 51, the technique can be applied also to the case where the distance G1 and the distance G2 between the semiconductor chips 3 are equal to each other.

Second Modification Example

Also, for example, in the embodiment above, the case where the area of the semiconductor chip 3B mounted on the upper stage is larger than the area of the semiconductor chip 3A mounted on the lower stage has been described. However, as a modification example, the case where the area of the rear surface 3b of the semiconductor chip 3B is equal to or smaller than the area of the front surface 3a of the semiconductor chip 3A is also applicable. However, as described in the embodiment above, the problem that the circuit is damaged due to the contact between the metal patterns and the circuit region of the semiconductor chip 3B of the upper stage in the case where the warpage deformation occurs in the semiconductor chip 3 arises when the area of the semiconductor chip 3B is larger than the area of the semiconductor chip 3A.

Third Modification Example

Also, for example, in the embodiment above, as the metal patterns arranged in the peripheral portion of the rear surface 3b of the semiconductor chip 3A of the lower stage, the marks AM4 which are the metal patterns electrically isolated from the circuit of the semiconductor chip 3A have been described. However, as a modification example, the case where the metal patterns electrically connected to the circuit of the semiconductor chip 3A are formed in the peripheral portion of the rear surface 3b is also applicable. Also, metal patterns formed for various purposes are also applicable other than the marks AM4 serving as the alignment marks.

Also, the modification examples can be applied in combination without departing from the scope and spirit of the technical ideas described in the embodiments.

REFERENCE SIGNS LIST 1, 1A, 1B semiconductor device
2, 20 wiring substrate
2a top surface (surface, chip mounting surface)
2b bottom surface of opposite side (surface, packaging surface)
2c side surface
2d, 2d1 wiring
2d2 via wiring
2e insulating layer
2f bonding lead (terminal, chip mounting surface terminal, electrode)
2g land (terminal, pad for solder connection)
2h, 2k insulating film (solder resist film)
2hw, 2kw opening
2p1, 2p2 chip mounting region (chip mounting portion)
3, 3A, 3B semiconductor chip
3a front surface (main surface, top surface)
3ap, 3ap1, 3ap2 front electrode (electrode, pad, front surface pad)
3b rear surface (main surface, bottom surface)
3b1 region (electrode group forming region)
3b2 region (peripheral portion region)
3b3 region (dummy pattern forming region)
3bc1, 3bc2, 3bc3, 3bc4 corner portion
3bi insulating film
3bp plurality of rear electrodes (electrodes, pads, rear surface pads)
3c side surface
3mf metal foil
3s seed film (conductor film)
3tsh hole (bore, opening)
3tsv through electrode
4 sealing body (resin body)
4a top surface (surface, front surface)
4b bottom surface (surface, rear surface, packaging surface)
4c side surface
5 plurality of solder balls (external terminals, electrodes, external electrodes)
6 sealing body (sealing body for chip laminated body, resin body for chip laminated body)
6a underfill resin
7 external terminal (protrusion electrode, conductive member, bump electrode)
7a solder material (solder bump, protrusion electrode)
7b protrusion electrode
20a device region
20b frame portion (outer frame)
20c dicing line (dicing region)
25 mask
26 support base
27 protective layer
28 polishing jig
30 holding jig (collet)
30a holding surface
31 bonding jig (heating jig)
31a pressing surface
32 resin film (film)
35 adhesive layer
40 dicing blade (rotating blade)
41 tape material (dicing tape)
AM1, AM2, AM3, AM4 mark (metal pattern, metal pad, alignment mark)
AMS alignment mark
AS address line (signal line)
BDL adhesive layer
CR1, CR2 core circuit (main circuit)
CU control circuit
DPa, DPb, DPc dummy pattern (metal pattern, dummy pad, metal pad)
DR power supply circuit (driving circuit)
DR1 power supply circuit (input and output power supply circuit)
DR2 power supply circuit (core power supply circuit)
DR3 power supply circuit (input and output power supply circuit)
DR4 power supply circuit (core power supply circuit)
DS data line (signal line)
G1, G2, G3 distance (separation distance)
GIF external interface circuit (external input and output circuit)
HT1, HT2, HT3, HTb protrusion height (thickness)
LC logic chip (semiconductor chip)

MC1, MC2, MC3, MC4 memory chip (semiconductor chip)
MCS laminated body (memory chip laminated body, semiconductor chip laminated body)
MK1, MK2, MK3, MK4 mask
MK5 mask (etching mask)
MKd opening
MM main memory circuit (memory circuit)
MR memory region (memory circuit element arranging region)
NCL, NCL1, NCL2 adhesive (insulating adhesive)
NIF internal interface circuit (internal input and output circuit)
NS1, NS2 input and output circuit
NZ1, NZ2 nozzle
OS signal line
PU arithmetic processing circuit
SG signal line
SM auxiliary memory circuit (memory circuit)
ST base (assembly base)
STa assembling surface
V1, V2, V3 power line
WD1, WD2 width
WH semiconductor substrate (wafer)
WHb rear surface of opposite side (main surface, bottom surface)
WHs front surface (main surface, top surface)

The invention claimed is:

1. A manufacturing method of a semiconductor device, the manufacturing method comprising:
   preparing a wiring substrate including a first surface, a plurality of first terminals formed on the first surface, and a second surface opposite to the first surface;
   arranging a first adhesive on the first surface of the wiring substrate;
   after the arranging of the first adhesive, mounting a first semiconductor chip, which includes a first front surface, a plurality of first front electrodes formed on the first front surface, a first rear surface opposite to the first front surface, a plurality of first rear electrodes formed on the first rear surface, and a plurality of through electrodes electrically connecting the plurality of first front electrodes to the plurality of first rear electrodes, on the first surface of the wiring substrate via the first adhesive such that the first front surface of the first semiconductor chip faces the first surface of the wiring substrate, and electrically connecting the plurality of first terminals and the plurality of first front electrodes via a plurality of first protrusion electrodes;
   after the electrically connecting, arranging a second adhesive on the first rear surface of the first semiconductor chip and a front surface of the first adhesive exposed from the first semiconductor chip; and
   after the arranging of the second adhesive, mounting a second semiconductor chip, which includes a second front surface, a plurality of second front electrodes formed on the second front surface, and a second rear surface opposite to the second front surface, on the first semiconductor chip via the second adhesive such that the second front surface of the second semiconductor chip faces the first rear surface of the first semiconductor chip, and electrically connecting the plurality of first rear electrodes and the plurality of second front electrodes via a plurality of second protrusion electrodes,
   wherein the plurality of first rear electrodes are formed in a first region of the first rear surface of the first semiconductor chip,
   wherein a first metal pattern is formed in a second region on a peripheral side relative to the first region, and
   wherein a protrusion height of the first metal pattern with respect to the first rear surface is less than a protrusion height of each of the plurality of first rear electrodes with respect to the first rear surface.

2. The manufacturing method of the semiconductor device according to claim 1, wherein the mounting of the second semiconductor chip includes detecting a position of the first metal pattern and performing an alignment of the first semiconductor chip and the second semiconductor chip based on a detection result.

3. The manufacturing method of the semiconductor device according to claim 1, wherein, in the mounting of the second semiconductor chip, warpage deformation occurs in at least one of the first semiconductor chip and the second semiconductor chip, and
   wherein a first separation distance between the first rear surface of the first semiconductor chip and the second front surface of the second semiconductor chip in an outer periphery of the second region is less than a second separation, distance between the first rear surface of the first semiconductor chip and the second front surface of the second semiconductor chip in the first region.

4. The manufacturing method of the semiconductor device according to claim 1, wherein an area of the second front surface of the second semiconductor chip is larger than an area of the first rear surface of the first semiconductor chip, and
   wherein, in the mounting of the second semiconductor chip, the second semiconductor chip is mounted to cover an entire of first rear surface.

5. The manufacturing method of the semiconductor device according to claim 1, wherein the second region includes an outer periphery of the first rear surface of the first semiconductor chip,
   wherein a plurality of second metal patterns are formed in a third region between the first region and the second region in the first rear surface,
   wherein a protrusion height of each of the plurality of second metal patterns with respect to the first rear surface is equal to a protrusion height of each of the plurality of the first rear electrodes with respect to the first rear surface, and
   wherein the plurality of second metal patterns are not formed in the second region.

6. The manufacturing method of the semiconductor device according to claim 5, wherein the plurality of first rear electrodes and the plurality of second metal patterns are collectively formed by an electrolytic plating method.

* * * * *